(12) United States Patent
Lin et al.

(10) Patent No.: US 8,421,227 B2
(45) Date of Patent: Apr. 16, 2013

(54) SEMICONDUCTOR CHIP STRUCTURE

(75) Inventors: Mou-Shiung Lin, Hsin-Chu (TW); Jin-Yuan Lee, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 849 days.

(21) Appl. No.: 11/769,736

(22) Filed: Jun. 28, 2007

(65) Prior Publication Data
US 2008/0042280 A1 Feb. 21, 2008

Related U.S. Application Data

(60) Provisional application No. 60/805,987, filed on Jun. 28, 2006.

(51) Int. Cl.
*H01L 23/48* (2006.01)

(52) U.S. Cl.
USPC ........... 257/751; 257/750; 257/734; 257/735; 257/741; 257/748; 257/E23.01; 257/E23.02

(58) Field of Classification Search .................. 257/751, 257/E23.01, 750, 734, 755, 741, 748, E23.02
See application file for complete search history.

(56) References Cited

U.S. PATENT DOCUMENTS

| | | | |
|---|---|---|---|
| 4,051,508 A | 9/1977 | Sato et al. | |
| 4,622,576 A | 11/1986 | Buynoski | |
| 4,685,998 A | 8/1987 | Quinn et al. | |
| 4,733,289 A | 3/1988 | Tsurumaru | |
| 5,083,187 A | 1/1992 | Lamson | |
| 5,172,212 A | 12/1992 | Baba | |
| 5,226,232 A | 7/1993 | Boyd | |
| 5,310,699 A | 5/1994 | Chikawa | |
| 5,384,488 A | 1/1995 | Golshan | |
| 5,468,984 A | 11/1995 | Efland | |
| 5,532,512 A | 7/1996 | Fillion | |

(Continued)

FOREIGN PATENT DOCUMENTS

| EP | 1536469 | 6/2005 |
|---|---|---|
| TW | 200504926 | 2/2005 |

(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — Junghwa M Im
(74) *Attorney, Agent, or Firm* — Seyfarth Shaw LLP

(57) ABSTRACT

A semiconductor chip structure includes a semiconductor substrate, an circuit structure, a passivation layer, a first adhesion/barrier layer, a metal cap and a metal layer. The semiconductor substrate has multiple electric devices located on a surface layer of a surface of the substrate. The circuit structure had multiple circuit layers electrically connecting with each other and electrically connecting with the electric devices. One of the circuit layers has multiple pads. The passivation layer is located on the circuit structure and has multiple openings penetrating through the passivation layer. The openings expose the pads. The first adhesion/barrier layer is over the pads and the passivation layer. The metal cap is located on the first adhesion/barrier layer and the passivation layer. The metal layer is on the metal layer.

15 Claims, 64 Drawing Sheets

U.S. PATENT DOCUMENTS

| | | |
|---|---|---|
| 5,534,465 A | 7/1996 | Frye |
| 5,631,499 A | 5/1997 | Hosomi |
| 5,659,201 A | 8/1997 | Wollesen |
| 5,691,248 A | 11/1997 | Cronin |
| 5,783,868 A | 7/1998 | Galloway |
| 5,785,236 A | 7/1998 | Cheung |
| 5,792,594 A | 8/1998 | Brown |
| 5,834,844 A | 11/1998 | Akagawa |
| 5,854,513 A | 12/1998 | Kim |
| 5,883,435 A | 3/1999 | Geffken |
| 5,969,424 A | 10/1999 | Matsuki |
| 6,013,571 A | 1/2000 | Morrell |
| 6,022,792 A | 2/2000 | Ishii |
| 6,066,877 A | 5/2000 | Williams |
| 6,077,726 A | 6/2000 | Mistry |
| 6,144,100 A | 11/2000 | Shen |
| 6,177,731 B1 | 1/2001 | Ishida |
| 6,184,143 B1 | 2/2001 | Ohashi |
| 6,187,680 B1 | 2/2001 | Costrini |
| 6,229,221 B1 | 5/2001 | Kloen |
| 6,229,711 B1 | 5/2001 | Yoneda |
| 6,236,101 B1 | 5/2001 | Erdeljac et al. |
| 6,255,737 B1 | 7/2001 | Hashimoto |
| 6,300,234 B1 | 10/2001 | Flynn |
| 6,303,423 B1 | 10/2001 | Lin |
| 6,359,328 B1 | 3/2002 | Dubin |
| 6,362,087 B1 | 3/2002 | Wang |
| 6,376,353 B1 | 4/2002 | Zhou |
| 6,383,916 B1 | 5/2002 | Lin |
| 6,384,486 B2 | 5/2002 | Zuniga et al. |
| 6,410,435 B1 | 6/2002 | Ryan |
| 6,426,281 B1 | 7/2002 | Lin |
| 6,429,120 B1 | 8/2002 | Ahn |
| 6,441,467 B2 * | 8/2002 | Toyosawa et al. ............. 257/637 |
| 6,451,681 B1 | 9/2002 | Greer |
| 6,472,745 B1 | 10/2002 | Iizuka |
| 6,479,900 B1 | 11/2002 | Shinogi |
| 6,495,442 B1 | 12/2002 | Lin |
| 6,515,369 B1 | 2/2003 | Lin |
| 6,544,880 B1 | 4/2003 | Akram |
| 6,545,355 B2 | 4/2003 | Yanagida |
| 6,559,548 B1 | 5/2003 | Matsunaga et al. |
| 6,593,222 B2 | 7/2003 | Smoak |
| 6,614,091 B1 | 9/2003 | Downey |
| 6,639,299 B2 | 10/2003 | Aoki |
| 6,646,347 B2 | 11/2003 | Mercado |
| 6,683,380 B2 | 1/2004 | Efland |
| 6,707,124 B2 | 3/2004 | Wachtler |
| 6,707,159 B1 | 3/2004 | Kumamoto |
| 6,720,243 B2 | 4/2004 | Weng |
| 6,756,664 B2 | 6/2004 | Yang |
| 6,759,275 B1 | 7/2004 | Lee |
| 6,762,122 B2 | 7/2004 | Mis |
| 6,780,748 B2 | 8/2004 | Yamaguchi |
| 6,791,178 B2 | 9/2004 | Yamaguchi |
| 6,798,050 B1 | 9/2004 | Homma |
| 6,800,555 B2 | 10/2004 | Test |
| 6,806,578 B2 | 10/2004 | Howell |
| 6,844,631 B2 | 1/2005 | Yong |
| 6,853,076 B2 | 2/2005 | Datta |
| 6,864,562 B1 | 3/2005 | Toyosawa et al. |
| 6,878,633 B2 | 4/2005 | Raskin |
| 6,940,169 B2 | 9/2005 | Jin |
| 6,943,440 B2 | 9/2005 | Kim |
| 6,963,136 B2 | 11/2005 | Shinozaki |
| 6,963,138 B2 | 11/2005 | Low |
| 6,979,647 B2 | 12/2005 | Bojkov |
| 7,045,899 B2 | 5/2006 | Yamane |
| 7,220,657 B2 | 5/2007 | Ihara |
| 7,239,028 B2 | 7/2007 | Anzai |
| 7,271,489 B2 | 9/2007 | Lin |
| 7,319,277 B2 | 1/2008 | Lin |
| 7,381,642 B2 | 6/2008 | Lin |
| 7,394,161 B2 | 7/2008 | Kuo et al. |
| 7,416,971 B2 | 8/2008 | Lin |
| 7,470,997 B2 | 12/2008 | Lin |
| 7,521,805 B2 | 4/2009 | Lin |
| 2001/0035452 A1 | 11/2001 | Test |
| 2001/0040290 A1 | 11/2001 | Sakurai |
| 2001/0051426 A1 | 12/2001 | Pozder |
| 2002/0000665 A1 * | 1/2002 | Barr et al. ............. 257/758 |
| 2002/0000671 A1 | 1/2002 | Zuniga |
| 2002/0043723 A1 | 4/2002 | Shimizu |
| 2002/0158334 A1 | 10/2002 | Vu |
| 2003/0006062 A1 | 1/2003 | Stone |
| 2003/0025202 A1 * | 2/2003 | Mikagi et al. ............. 257/737 |
| 2003/0216039 A1 | 11/2003 | Wang et al. |
| 2003/0218246 A1 | 11/2003 | Abe |
| 2003/0222295 A1 | 12/2003 | Lin |
| 2003/0224613 A1 | 12/2003 | Ramanathan et al. |
| 2004/0007779 A1 | 1/2004 | Arbuthnot |
| 2004/0023450 A1 | 2/2004 | Katagiri |
| 2004/0070086 A1 | 4/2004 | Lee et al. |
| 2004/0245580 A1 | 12/2004 | Lin |
| 2005/0017361 A1 | 1/2005 | Lin et al. |
| 2005/0037609 A1 | 2/2005 | Nakatani |
| 2005/0277283 A1 | 12/2005 | Lin |
| 2006/0012041 A1 | 1/2006 | Chou |
| 2006/0019490 A1 | 1/2006 | Chou |
| 2006/0060961 A1 | 3/2006 | Lin |
| 2006/0091536 A1 | 5/2006 | Huang et al. |
| 2006/0091540 A1 | 5/2006 | Chou |
| 2006/0125094 A1 | 6/2006 | Lin |
| 2007/0026660 A1 | 2/2007 | Yamasaki et al. |
| 2007/0205520 A1 | 9/2007 | Chou |
| 2007/0275503 A1 | 11/2007 | Lin et al. |
| 2008/0284037 A1 | 11/2008 | Andry |

FOREIGN PATENT DOCUMENTS

| | | |
|---|---|---|
| TW | 200511526 | 3/2005 |
| TW | 200603353 | 1/2006 |
| TW | I249822 | 2/2006 |
| TW | I250598 | 3/2006 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single.damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection,"IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

Megic Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

Office Action issued Sep. 14, 2010 for Taiwan Application No. 096123393 with English Summary Translation.

Search Report issued Mar. 1, 2012 for Taiwan Application No. 096123392 with English translation.

* cited by examiner

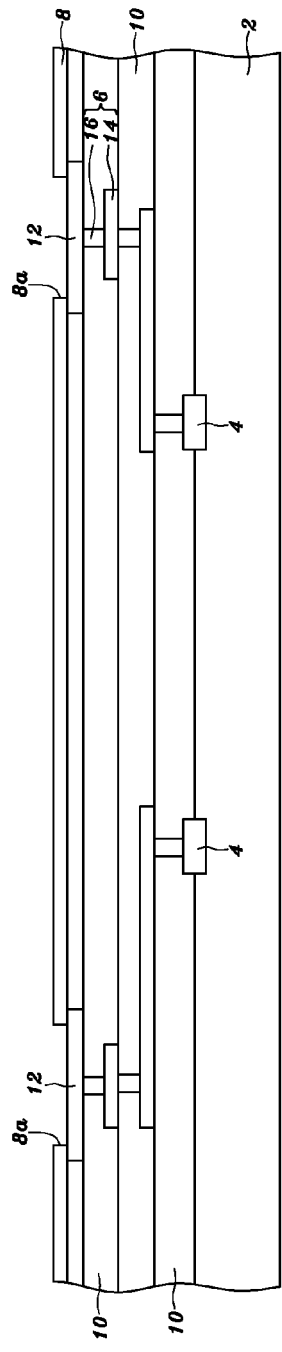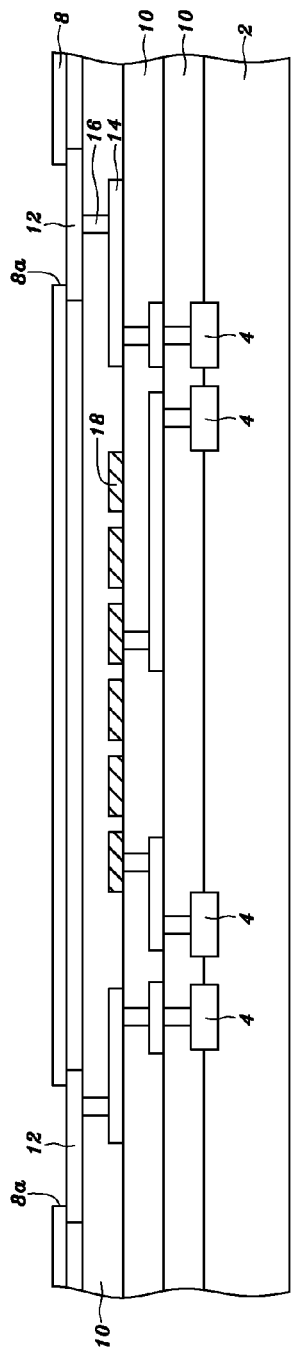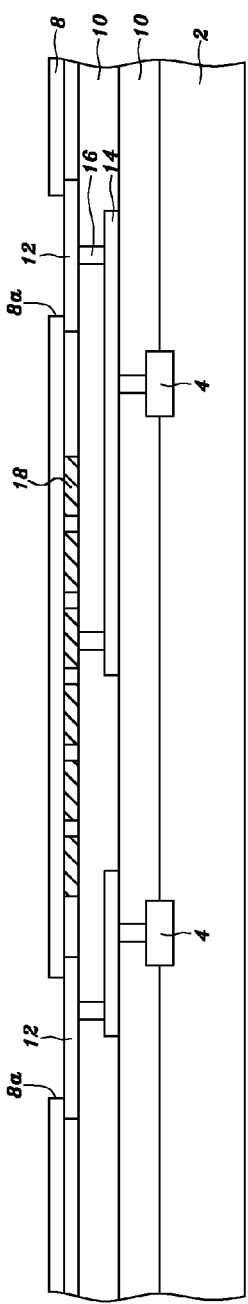

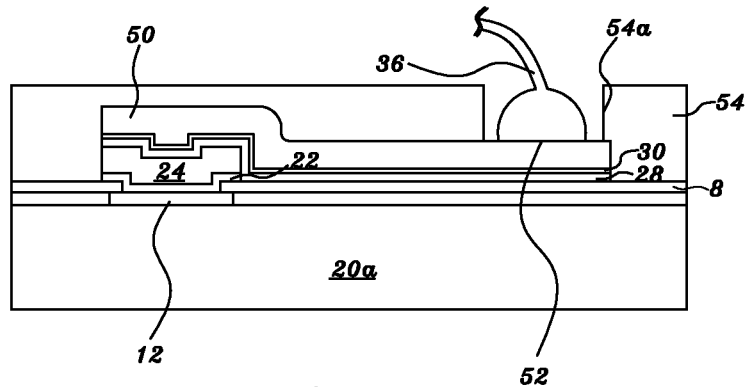
Fig. 3G
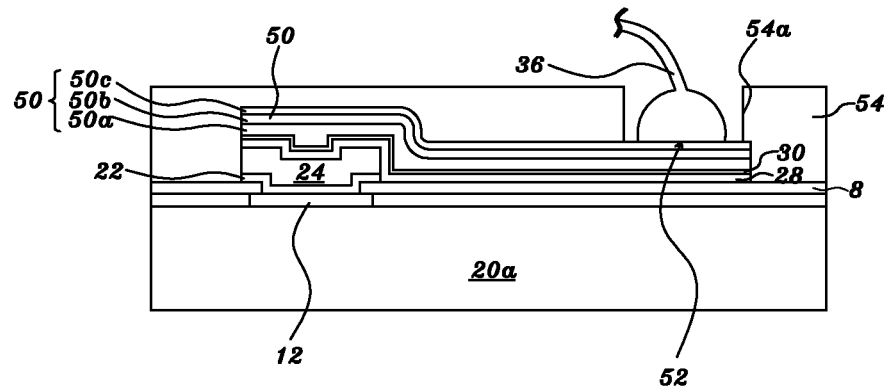
Fig. 3H-a
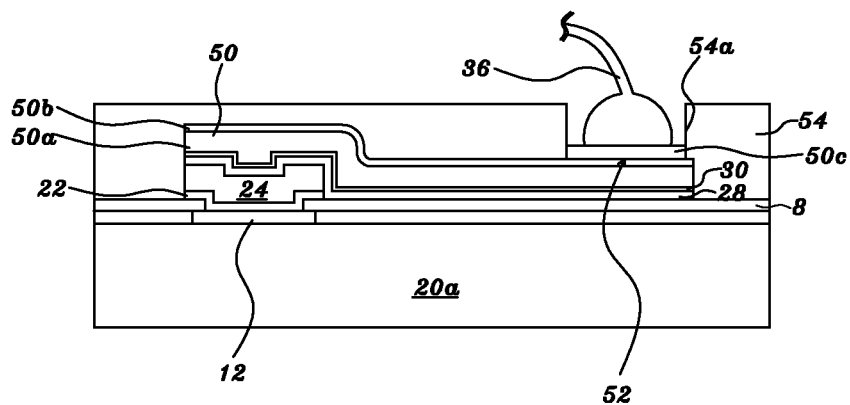
Fig. 3H-b

SEMICONDUCTOR CHIP STRUCTURE

This application claims priority to U.S. provisional application No. 60/805,987, filed on Jun. 28, 2006, which is herein incorporated by reference in its entirety.

BACKGROUND OF THE INVENTION

1. Field of the Invention

This invention relates to structures and methods of assembly of integrated circuit chips. More particularly, this invention relates to post-passivation technologies with metal caps.

2. Brief Description of the Related Art

Copper interconnection requires an aluminum cap at the passivation openings to protect the copper from environmental deterioration such as oxidation from the ambient and to provide a metal pad for wire bonding. Today many integrated circuit chips use copper as the interconnection metal. From a performance perspective, copper interconnection offers a higher propagation speed than does an aluminum interconnection, making copper a desirable technological solution for current IC design. However, copper interconnection also incurs reliability concerns. When a copper I/O pad is exposed to atmosphere, its surface is subjected to chemical attack by the oxygen and moisture in the atmosphere. To overcome this problem, prior art has disclosed a method and structure to prevent copper chemical attack. By depositing a metal (such as aluminum (Al)) cap layer on the surface of the copper I/O pad, the copper I/O pad can remain intact in the passivation opening in the ambient. This metal cap layer is especially important where processing through the passivation layer is performed in one fab and then post-passivation processing is performed in another fab. Moreover, an Al (or other metal) pad is able to form a stable bonding structure with Au wire. Copper alone cannot form a bondable structure with Au wire. Therefore, the Al cap layer provides the wire-bonding capability for the copper I/O pad, wherein the aluminum cap is on a copper line. The Al cap allows the formation of a wire bond attaching to it firmly. For example, U.S. Pat. No. 6,451,681 to Greer and U.S. Pat. No. 6,376,353 to Zhou teach using an Al cap over a copper bond pad for wire bonding. U.S. Pat. No. 6,544,880 to Akram discloses gold over a copper pad and optionally additional metals to prevent formation of intermetallic compounds in wire bonding.

U.S. Pat. Nos. 6,495,442 and 6,383,916 to M. S. Lin et al disclose a post-passivation interconnection process. The continued emphasis in the semiconductor technology is to create improved performance semiconductor devices at competitive prices. This emphasis over the years has resulted in extreme miniaturization of semiconductor devices, made possible by continued advances of semiconductor processes and materials in combination with new and sophisticated device designs. Most of the semiconductor devices that are at this time being created are aimed at processing digital data. There are however also numerous semiconductor designs that are aimed at incorporating analog functions into devices that simultaneously process digital and analog data, or devices that can be used for the processing of only analog data. One of the major challenges in the creation of analog processing circuitry (using digital processing procedures and equipment) is that a number of the components that are used for analog circuitry are large in size and are therefore not readily integrated into devices that typically have feature sizes that approach the sub-micron range. The main components that offer a challenge in this respect are capacitors and inductors, since both these components are, for typical analog processing circuits, of considerable size.

One of the problems that is encountered when creating an inductor on the surface of a semiconductor substrate is that the self-resonance that is caused by the parasitic capacitance between the (spiral) inductor and the underlying substrate will limit the use of the inductor at high frequencies. As part of the design of such an inductor it is therefore of importance to reduce the capacitive coupling between the created inductor and the underlying substrate. Co-pending U.S. patent application Ser. Nos. 10/445,558, 10/445,559, and 10/445,560 apply the post-passivation process of U.S. Pat. No. 6,383,916 in addition to creating high quality electrical components, such as an inductor, a capacitor or a resistor, on a layer of passivation or on the surface of a thick layer of dielectric.

SUMMARY OF THE INVENTION

An object of this invention is to provide post-passivation interconnection wherein copper pads are capped with metal pads.

Another object of this invention is to provide post-passivation metal interconnection for wire bonding or testing purposes wherein copper pads are capped with a different metal.

A further object is to provide post-passivation metal interconnection for wire bonding or testing purposes wherein copper pads are capped with another metal and further covered with gold.

Another object is to deposit thin film passive components on top of an inductor using copper pads capped with aluminum as the connecting node.

Another object is to attach surface mounted passive components such as capacitors, resistors, and inductors to wirebonds through post-passivation metal lines above the passivation layer.

In accordance with the objects of the invention, a high performance integrated circuit chip is disclosed.

Also in accordance with the objects of the invention, a method of fabricating a high performance integrated circuit chip is achieved.

BRIEF DESCRIPTION OF THE DRAWINGS

FIGS. 1A-1F are schematic views showing the steps of forming a fine-line interconnecting structure and a passivation layer according to the present invention

FIGS. 3A through 3G are sectional views showing a structure and process of a aspect of a embodiment of the present invention.

FIGS. 3H-a through 3H-b are sectional views showing a structure and process of a aspect of a embodiment of the present invention.

DETAILED DESCRIPTION OF THE INVENTION

Figure 1D:
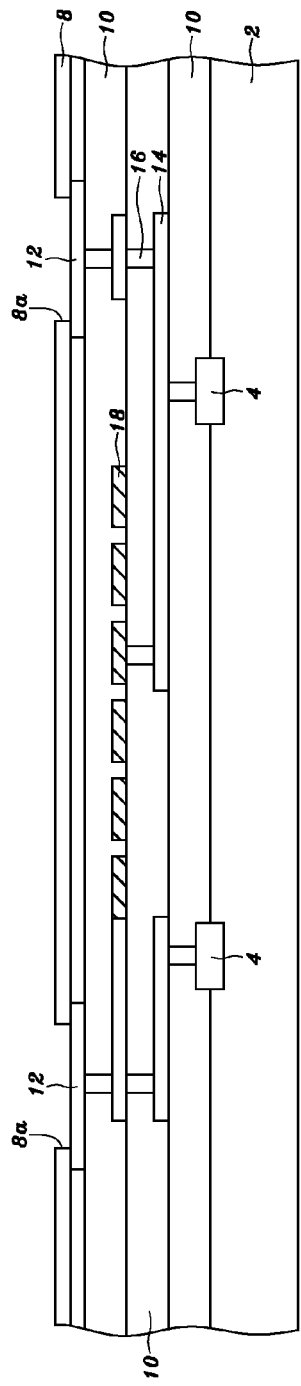

Referring to FIG. 1A-1G, a semiconductor substrate or semiconductor blank wafer 2 may be a silicon substrate or silicon wafer, a GaAs substrate or GaAs wafer, or a SiGe substrate or SiGe wafer. Multiple semiconductor devices 4 are formed in or over the semiconductor substrate 2. The semiconductor device 4 may be a passive device, such as resistor, capacitor, inductor or filter, or an active device, such as p-channel MOS device, n-channel MOS device, CMOS (Complementary Metal Oxide Semiconductor), BJT (Bipolar Junction Transistor) or BiCMOS (Bipolar CMOS) device.

Referring to FIG. 1A-1G, a circuit structure 6, also called fine line metal trace structure, is formed over the semiconductor substrate 2. The circuit structure 6 comprises multiple patterned metal layers 14 having a thickness of between 0.05 μm and 2 μm and multiple metal plugs 16. For example, the patterned metal layers 14 and the metal plugs 16 are made of copper. Alternatively, the patterned metal layer 14 is made of aluminum or aluminum-alloy, and the metal plug 16 is made of tungsten. One of the patterned metal layers 14 may be formed by a damascene process including sputtering an adhesion/barrier layer, such tantalum or tantalum nitride, on an insulating layer, composed of Low-K oxide and oxynitride, and in an opening in the insulating layer, then sputtering a first copper layer on the adhesion/barrier layer, then electroplating a second copper layer on the first copper layer, then removing the first and second copper layers outside the opening in the insulating layer using a chemical mechanical polishing (CMP) process. Alternatively, one of the patterned metal layer 14 may be formed by a process including sputtering an aluminum-alloy layer, containing more than 90 wt % aluminum and less than 10 wt % copper, on an insulating layer, such as oxide, then patterning the aluminum-alloy layer using photolithography and etching processes.

Referring to FIGS. 1B-1D, the circuit structure 6 may also comprise a coil 18. The coil 18 is made of gold, aluminum or copper and is formed with a damascene, electroplating or sputtering process. Besides, the coil 18 can be connected to at least two pads 12 via the patterned metal layers 14 of the circuit structure 6 and the metal plugs 16 of the circuit structure 6, as shown in FIGS. 1C-1D. Alternatively, the coil 18 may be connected to at least two semiconductor devices 4 via the patterned metal layers 14 of the circuit structure 6 and the metal plugs 16 of the circuit structure 6, as shown in FIG. 1B.

Figure 1E:
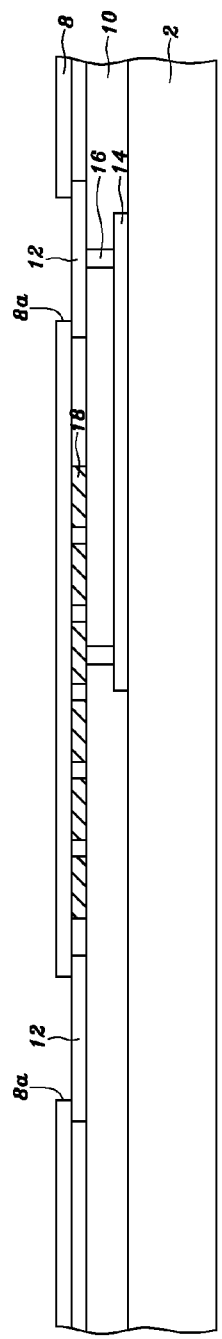
Figure 1F:
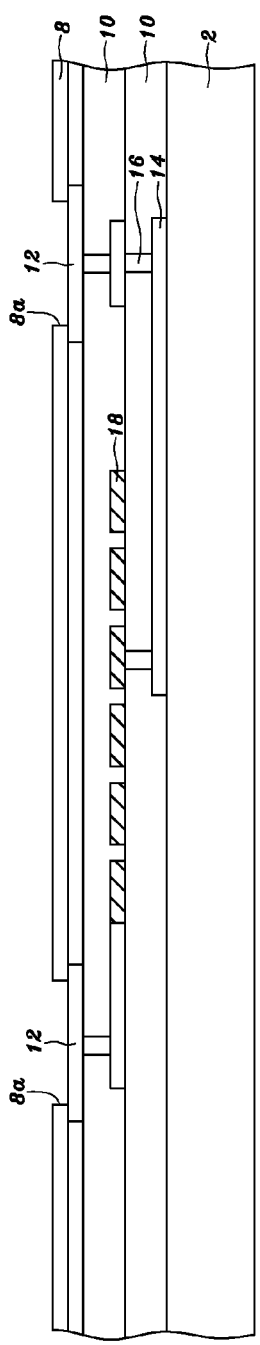

Referring to FIGS. 1E-1F, alternatively, there may be no active device in or over the semiconductor substrate 2 and under the coil 18. For example, there is no MOS device in or over the semiconductor substrate 2 and under the coil 18. The circuit structure 6 comprises the coil 18 and two contacts of the coil 18 connected respectively to two pads 12 exposed by two openings 8a in a passivation layer 8, via the patterned metal layers 14 and the metal plugs 16.

Multiple dielectric layers 10 having a thickness of less than 3 micrometers are located over the semiconductor substrate 2 and interposed respectively between the neighboring patterned metal layers 14, and the neighboring patterned metal layers 14 are interconnected through the metal plugs 16 inside the dielectric layer 10. The dielectric layer 10 is commonly formed by a chemical vapor deposition (CVD) process. The material of the dielectric layer 10 may include silicon oxide, silicon oxynitride, TEOS (Tetraethoxysilane), a compound containing silicon, carbon, oxygen and hydrogen (such as $Si_wC_xO_yH_z$), silicon nitride (such as $Si_3N_4$), FSG (Fluorinated Silicate Glass), Black Diamond, SiLK, a porous silicon oxide, a porous compound containing nitrogen, oxygen and silicon, SOG (Spin-On Glass), a polyarylene ether, PBO (Polybenzoxazole), or a material having a low dielectric constant (K) of between 1 and 3.

Referring to FIGS. 1A-1F, a passivation layer 8 is formed over the circuit structure 6 and the dielectric layers 10. The passivation layer 8 can protect the semiconductor devices 4 and the circuit structure 6 from being damaged by moisture and foreign ion contamination. In other words, Mobile ions (such as sodium ion), transition metals (such as gold, silver and copper) and impurities can be prevented from penetrating through the passivation layer 8 to the semiconductor devices 4, such as transistors, polysilicon resistor elements and poly-silicon-polysilicon capacitor elements, and to the circuit structure 6.

The passivation layer 8 is commonly made of silicon oxide (such as $SiO_2$), PSG (phosphosilicate glass), silicon nitride (such as $Si_3N_4$), or silicon oxynitride. The passivation layer 8 commonly has a thickness of more than 0.35 μm. In a preferred case, the silicon nitride layer in the passivation layer 8 has a thickness of more than 0.3 μm. Ten methods for depositing the passivation layer 8 are described as below.

In a first method, the passivation layer 8 is formed by depositing a silicon oxide layer with a thickness of between 0.2 and 1.2 μm using a CVD method and then depositing a silicon nitride layer with a thickness of 0.2 and 1.2 μm on the silicon oxide layer using a CVD method.

In a second method, the passivation layer 8 is formed by depositing a silicon oxide layer with a thickness of between 0.2 and 1.2 μm using a CVD method, next depositing a silicon oxynitride layer with a thickness of between 0.05 and 0.15 μm on the silicon oxide layer using a Plasma Enhanced CVD (PECVD) method, and then depositing a silicon nitride layer with a thickness of between 0.2 and 1.2 μm on the silicon oxynitride layer using a CVD method.

In a third method, the passivation layer 8 is formed by depositing a silicon oxynitride layer with a thickness of between 0.05 and 0.15 μm using a CVD method, next depositing a silicon oxide layer with a thickness of between 0.2 and 1.2 μm on the silicon oxynitride layer using a CVD method, and then depositing a silicon nitride layer with a thickness of between 0.2 and 1.2 μm on the silicon oxide layer using a CVD method.

In a fourth method, the passivation layer 8 is formed by depositing a first silicon oxide layer with a thickness of between 0.2 and 0.5 μm using a CVD method, next depositing a second silicon oxide layer with a thickness of between 0.5 and 1 μm on the first silicon oxide layer using a spin-coating method, next depositing a third silicon oxide layer with a thickness of between 0.2 and 0.5 μm on the second silicon oxide layer using a CVD method, and then depositing a silicon nitride layer with a thickness of 0.2 and 1.2 μm on the third silicon oxide using a CVD method.

In a fifth method, the passivation layer 8 is formed by depositing a silicon oxide layer with a thickness of between 0.5 and 2 μm using a High Density Plasma CVD (HDP-CVD) method and then depositing a silicon nitride layer with a thickness of 0.2 and 1.2 μm on the silicon oxide layer using a CVD method.

In a sixth method, the passivation layer 8 is formed by depositing an Undoped Silicate Glass (USG) layer with a thickness of between 0.2 and 3 μm, next depositing an insulating layer of TEOS, PSG or BPSG (borophosphosilicate glass) with a thickness of between 0.5 and 3 μm on the USG layer, and then depositing a silicon nitride layer with a thickness of 0.2 and 1.2 μm on the insulating layer using a CVD method.

In a seventh method, the passivation layer 8 is formed by optionally depositing a first silicon oxynitride layer with a thickness of between 0.05 and 0.15 μm using a CVD method, next depositing a silicon oxide layer with a thickness of between 0.2 and 1.2 μm on the first silicon oxynitride layer using a CVD method, next optionally depositing a second silicon oxynitride layer with a thickness of between 0.05 and 0.15 μm on the silicon oxide layer using a CVD method, next depositing a silicon nitride layer with a thickness of between 0.2 and 1.2 μm on the second silicon oxynitride layer or on the silicon oxide using a CVD method, next optionally depositing a third silicon oxynitride layer with a thickness of between 0.05 and 0.15 μm on the silicon nitride layer using a CVD method, and then depositing a silicon oxide layer with a thickness of between 0.2 and 1.2 μm on the third silicon oxynitride layer or on the silicon nitride layer using a CVD method.

In a eighth method, the passivation layer 8 is formed by depositing a first silicon oxide layer with a thickness of between 0.2 and 1.2 μm using a CVD method, next depositing a second silicon oxide layer with a thickness of between 0.5 and 1.2 μm on the first silicon oxide layer using a spin-coating method, next depositing a third silicon oxide layer with a thickness of between 0.2 and 1.2 μm on the second silicon oxide layer using a CVD method, next depositing a silicon nitride layer with a thickness of between 0.2 and 1.2 μm on the third silicon oxide layer using a CVD method, and then depositing a fourth silicon oxide layer with a thickness of between 0.2 and 1.2 μm on the silicon nitride layer using a CVD method.

In a ninth method, the passivation layer 8 is formed by depositing a first silicon oxide layer with a thickness of between 0.5 and 2 μm using a HDP-CVD method, next depositing a silicon nitride layer with a thickness of between 0.2 and 1.2 μm on the first silicon oxide layer using a CVD method, and then depositing a second silicon oxide layer with a thickness of between 0.5 and 2 μm on the silicon nitride using a HDP-CVD method.

In a tenth method, the passivation layer 8 is formed by depositing a first silicon nitride layer with a thickness of between 0.2 and 1.2 μm using a CVD method, next depositing a silicon oxide layer with a thickness of between 0.2 and 1.2 μm on the first silicon nitride layer using a CVD method, and then depositing a second silicon nitride layer with a thickness of between 0.2 and 1.2 μm on the silicon oxide layer using a CVD method.

Referring to FIGS. 1A-1F, the opening 8a in the passivation layer 8 exposes the pad 12 of the circuit structure 6 used to input or output signals or to be connected to a power source or a ground reference. The pad 12 may be composed of sputtered aluminum or sputtered aluminum-copper alloy, or of electroplated copper having a bottom surface and side walls covered with a barrier layer, such as tantalum or tantalum nitride.

The opening 8a have a maximum transverse dimension of between 2 and 30 μm or between 30 and 300 μm. The shape of the opening 8a may be a circle, and the diameter of the circle-shaped opening 8a may be between 2 and 30 μm or between 30 and 300 μm. Alternatively, the shape of the opening 8a may be a square, and the greatest diagonal length of the square-shaped opening 8a may be between 2 and 30 μm or between 30 and 300 μm. Alternatively, the shape of the opening 8a may be a polygon, and the polygon-shaped opening 8a may have a greatest diagonal length of between 3 and 30 μm or between 30 and 300 μm. Alternatively, the shape of the opening 8a may also be a rectangle, and the rectangle-shaped opening 8a may have a width of between 2 and 40 μm.

Further, there may be the semiconductor device 4 under the pad 12 exposed by the opening 8*a*. Alternatively, there may be none of the semiconductor device 4 under the pad 12 exposed by the opening 8*a*.

The semiconductor substrate 2, the circuit structure 6, the dielectric layer 10, the passivation layer 8 and the pad 12 are described in the above paragraphs. Below, the element of semiconductor wafer 20 under the passivation layer 8 may be any of the structures shown in FIGS. 1A-1F under the passivation layer 8; the semiconductor wafer 20 represents the combination of the semiconductor substrate 2, the semiconductor devices 4, the circuit structure 6 (including the metal layers 14 and the metal plugs 16) and the dielectric layers 10 in FIG. 1A, or the combination of the semiconductor substrate 2, the semiconductor devices 4, the circuit structure 6 (including the metal layers 14, the metal plugs 16, and the coil 18) and the dielectric layers 10 in from FIG. 1B to FIG. 1D, or the combination of the semiconductor substrate 2, the circuit structure 6 (including the metal layer 14, the metal plug 16, and the coil 18) and the dielectric layers 10 in FIG. 1E and FIG. 1F.

Aspect 1 of Embodiment 1

Figure 2A:
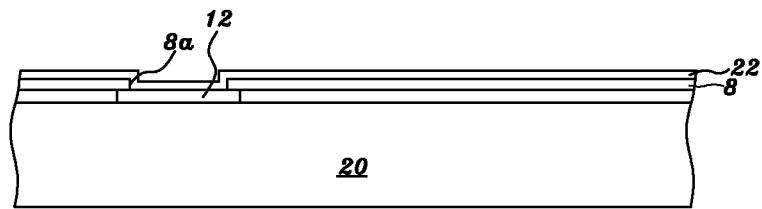
FIGS. 2A through 2K are sectional views showing a structure and process of a aspect of a embodiment of the present invention.

Referring to FIG. 2A, an adhesion/barrier layer 22 having a thickness of between 0.01 and 0.7 µm is sputtered on the passivation layer 8 and on the pad 12 exposed by the opening 8*a* in the passivation layer 8. The material of the adhesion/barrier layer 22 may include titanium, titanium nitride, a titanium-tungsten alloy, chromium, tantalum, tantalum nitride, or a composite of the abovementioned materials.

For example, the adhesion/barrier layer 22 can be formed by sputtering a tantalum layer with a thickness of between 0.01 and 0.7 µm on the passivation layer 8 including silicon nitride and on the pad 12, principally including electroplated copper, exposed by the opening 8*a*. Alternatively, the adhesion/barrier layer 22 can be formed by sputtering a layer of tantalum nitride with a thickness of between 0.01 and 0.7 µm on the passivation layer 8 including silicon nitride and on the pad 12, principally including electroplated copper, exposed by the opening 8*a*.

Figure 2B:
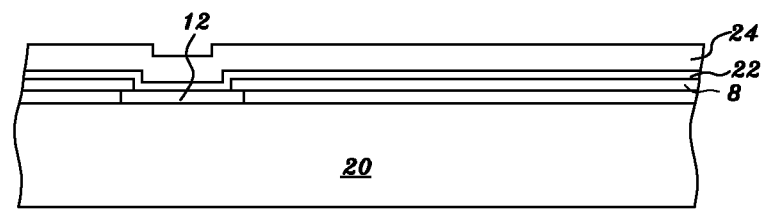

Referring to FIG. 2B, a metal layer 24 having a thickness of between 0.5 and 2 µm or between 0.5 and 5 µm is sputtered on the adhesion/barrier layer 22. For example, the metal layer 24 can be formed by sputtering an aluminum-containing layer with a thickness of between 0.5 and 2 µm or between 0.5 and 5 m on the adhesion/barrier layer 22, such as tantalum layer. Preferably, the metal layer 24 may be formed by sputtering an aluminum-containing layer with a thickness of between 0.2 and 2 µm or between 0.5 and 5 µm on the adhesion/barrier layer 22, such as tantalum layer.

Alternatively, the metal layer 24 can be formed by sputtering an aluminum-containing layer, such as an aluminum-copper alloy, with a thickness of between 0.5 and 5 µm on the adhesion/barrier layer 22, such as layer of tantalum nitride. Preferably, the metal layer 24 may be formed by sputtering an aluminum-containing layer, such as an aluminum-copper alloy, with a thickness of between 0.2 and 2 µm or between 0.5 and 5 µm on the adhesion/barrier layer 22, such as layer of tantalum nitride.

Figure 2C:
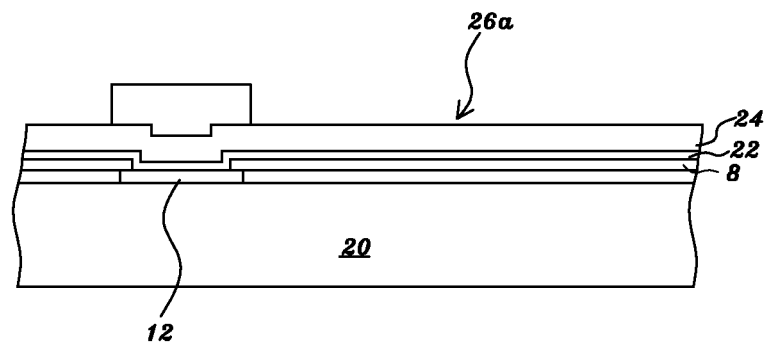

Referring to FIG. 2C, a photoresist layer 26 is formed on the metal layer 24 by spin-on coating. Next, the photoresist layer 26 is patterned with the processes of exposure, development, etc., to form a patterned photoresist layer 26 on the metal layer 24 over the pad 12 principally including copper. For example, the patterned photoresist layer 26 can be formed by spin-on coating a positive-type photosensitive polymer layer having a thickness of between 5 and 30 µm, and preferably of between 7 and 15 µm, on the metal layer 24, then exposing the photosensitive layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, and then developing the exposed polymer layer.

Figure 2D:
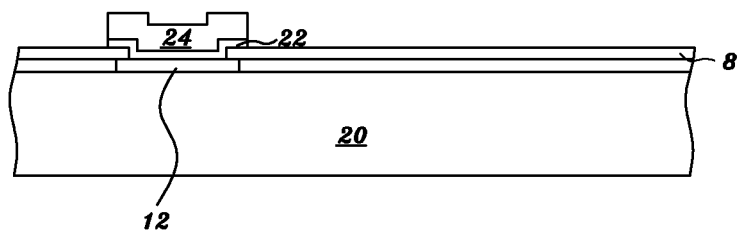

Referring to FIG. 2D, the metal layer 24 and the adhesion/barrier layer 22 not under the patterned photoresist layer 26 are sequentially removed with a dry etching method, and preferably with a dry plasma etching method. For example, the adhesion/barrier layer 22 and the metal layer 24 not under the patterned photoresist layer 26 may be etched with a plasma containing fluorine or a plasma containing argon. Next, the patterned photoresist layer 26 is removed using an organic solution with amide. However, some residuals from the patterned photoresist layer 26 or other contaminants could remain on the patterned metal cap 24. Thereafter, the residuals or other contaminants can be removed from the patterned metal cap 24 with a plasma, such as $O_2$ plasma or plasma containing fluorine of below 200 PPM and oxygen.

Thereby, a patterned metal cap 24 can be formed on the adhesion/barrier layer 22 over the pad 12.

Figure 2E:
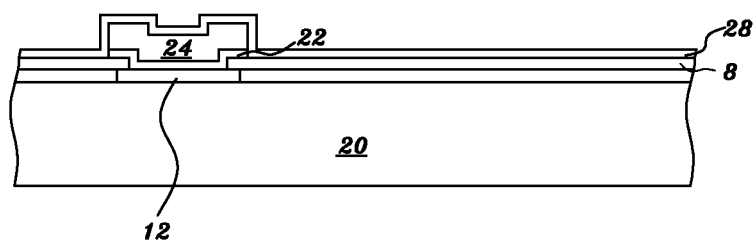

Referring to FIG. 2E, an adhesion/barrier layer 28 having a thickness of between 0.01 and 0.7 µm is sputtered on the passivation layer 8 and on the patterned metal cap 24. The material of the adhesion/barrier layer 28 may include titanium, titanium nitride, a titanium-tungsten alloy, chromium, tantalum, tantalum nitride, or a composite of the abovementioned materials. For example, the adhesion/barrier layer 28 can be formed by sputtering a titanium-tungsten alloy layer with a thickness of between 0.01 and 0.7 µm on the passivation layer 8 and on the patterned metal cap 24, such as an aluminum-copper alloy. Alternatively, the adhesion/barrier layer 28 can be formed by sputtering a titanium layer with a thickness of between 0.01 and 0.7 µm on the passivation layer 8 and on the patterned metal cap 24, such as an aluminum-copper alloy.

Figure 2F:
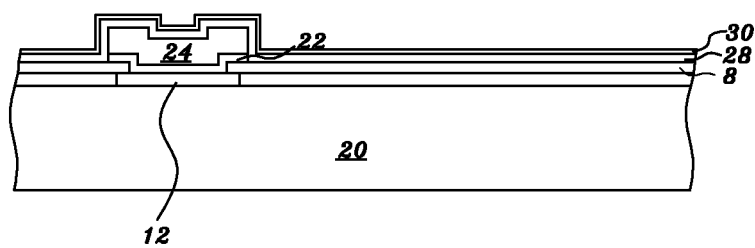

Referring to FIG. 2F, a seed layer 30 having a thickness of between 0.005 and 2 µm can be sputtered on the adhesion/barrier layer 28. The seed layer 30 is beneficial to electroplating a metal layer thereon. Thus, the material of the seed layer 30 varies with the material of the electroplated metal layer formed on the seed layer 30. When a gold layer is to be electroplated on the seed layer 30, gold (Au) is a preferable material to the seed layer 30. When a copper layer is to be electroplated on the seed layer 30, copper (Cu) is a preferable material to the seed layer 30. When a silver layer is to be electroplated on the seed layer 30, silver (Ag) is a preferable material to the seed layer 30. When a palladium layer is to be electroplated on the seed layer 30, palladium (Pd) is a preferable material to the seed layer 30. When a platinum layer is to be electroplated on the seed layer 30, platinum (Pt) is a preferable material to the seed layer 30. When a rhodium layer is to be electroplated on the seed layer 30, rhodium (Rh) is a preferable material to the seed layer 30. When a ruthenium layer is to be electroplated on the seed layer 30, ruthenium (Ru) is a preferable material to the seed layer 30. When a rhenium layer is to be electroplated on the seed layer 30, rhenium (Re) is a preferable material to the seed layer 30. When a nickel layer is to be electroplated on the seed layer 30, nickel (Ni) is a preferable material to the seed layer 30.

For example, when the adhesion/barrier layer 28 is formed by sputtering a titanium-tungsten alloy layer with a thickness of between 0.01 and 0.7 μm, the seed layer 30 can be formed by sputtering a gold layer with a thickness of between 0.005 and 2 μm on the titanium-tungsten alloy layer. When the adhesion/barrier layer 28 is formed by sputtering a titanium-tungsten alloy layer with a thickness of between 0.01 and 0.7 μm, the seed layer 30 can be formed by sputtering a copper layer with a thickness of between 0.005 and 2 μm on the titanium-tungsten alloy layer. When the adhesion/barrier layer 28 is formed by sputtering a titanium layer with a thickness of between 0.01 and 0.7 μm, the seed layer 30 can be formed by sputtering a gold layer with a thickness of between 0.005 and 2 μm on the titanium layer. When the adhesion/barrier layer 28 is formed by sputtering a titanium layer with a thickness of between 0.01 and 0.7 μm, the seed layer 30 can be formed by sputtering a copper layer with a thickness of between 0.005 and 2 μm on the titanium layer.

Figure 2G:
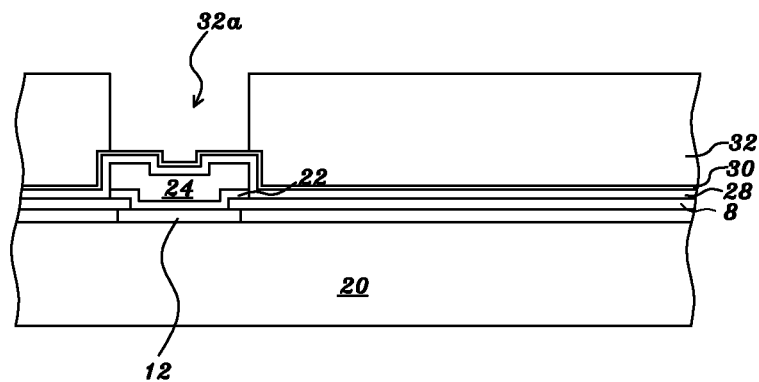

Referring to FIG. 2G, a photoresist layer 32 is formed on the seed layer 30. Next, the photoresist layer 32 is patterned with the processes of exposure, development, etc., to form an opening 32a in the photoresist layer 32 exposing the seed layer 30 over the patterned metal cap 24. For example, the photoresist layer 32 can be formed by spin-on coating a positive-type photosensitive polymer layer having a thickness of between 5 and 30 μm, and preferably of between 7 and 15 μm, on the seed layer 30, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer to form an opening in the polymer layer exposing the seed layer 30, and then removing the residual polymeric material or other contaminants on the seed layer 30 with an $O_2$ plasma or a plasma containing fluorine of below 200 PPM and oxygen, such that the photoresist layer 32 can be patterned with an opening 32a in the photoresist layer 32 exposing the seed layer 30.

Figure 2H:
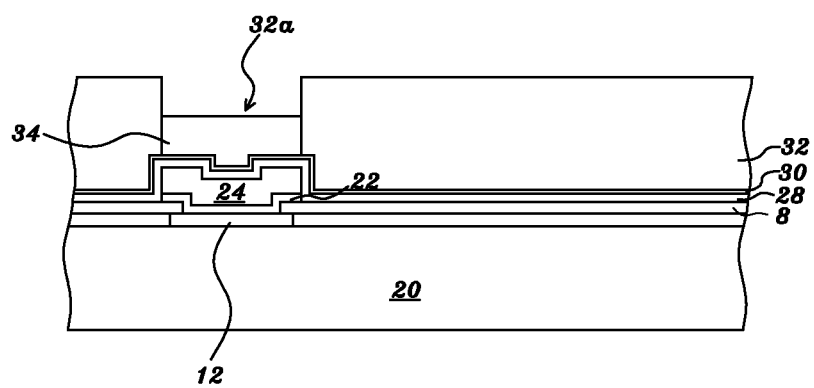

Referring to FIG. 2H, a metal layer 34 having a thickness of between 1 and 25 μm is electroplated on the seed layer 30 exposed by the opening 32a. The metal layer 34 may be a single layer made of gold, copper, palladium, platinum, or nickel. The metal layer 34 may also be a composite layer made of the abovementioned metals.

For example, the metal layer 34 may be formed by electroplating a gold layer with a thickness of between 1 and 10 μm on the seed layer 30, made of gold, exposed by the opening 32a. Alternatively, the metal layer 34 may be formed by electroplating a copper layer with a thickness of between 1 and 15 μm on the seed layer 30, made of copper, exposed by the opening 32a. Alternatively, the metal layer 34 may be formed by electroplating a copper layer with a thickness of between 1 and 15 μm on the seed layer 30, made of copper, exposed by the opening 32a, next electroplating a nickel layer with a thickness of between 0.1 and 5 μm on the copper layer in the opening 32a, and then electroplating a gold layer with a thickness of between 0.01 and 2 μm on the nickel layer in the opening 32a. Alternatively, the metal layer 34 may be formed by electroplating a copper layer with a thickness of between 1 and 15 μm on the seed layer 30, made of copper, exposed by the opening 32a, and then electroplating a gold layer with a thickness of between 0.01 and 2 μm on the copper layer in the opening 32a. Alternatively, the metal layer 34 may be formed by electroplating a copper layer with a thickness of between 1 and 15 μm on the seed layer 30, made of copper, exposed by the opening 32a, next electroplating a nickel layer with a thickness of between 0.1 and 5 μm on the copper layer in the opening 32a, and then electroplating a palladium layer with a thickness of between 0.01 and 2 μm on the nickel layer in the opening 32a. Alternatively, the metal layer 34 may be formed by electroplating a copper layer with a thickness of between 1 and 15 μm on the seed layer 30, made of copper, exposed by the opening 32a, next electroplating a nickel layer with a thickness of between 0.1 and 5 μm on the copper layer in the opening 32a, and then electroplating a platinum layer with a thickness of between 0.01 and 2 μm on the nickel layer in the opening 32a.

Figure 2I:
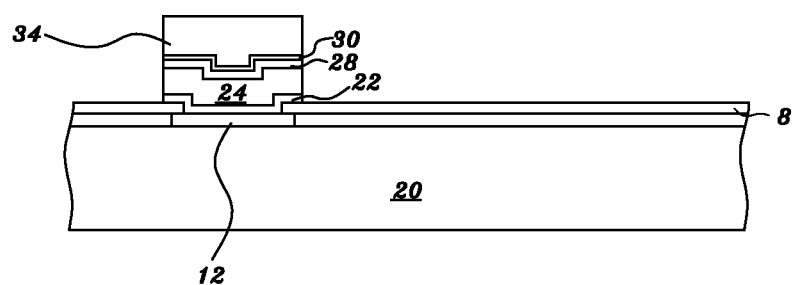

Referring to FIG. 2I, after the metal layer 34 is formed, the photoresist layer 32 can be removed using an organic solution with amide. Alternatively, the photoresist layer 32 can be removed using an inorganic solution, such as sulfuric acid ($H_2SO_4$) or hydrogen peroxide ($H_2O_2$). Alternatively, the photoresist layer 32 can be removed using an $O_2$ plasma or a plasma containing fluorine of below 200 PPM and oxygen.

Next, the seed layer 30 and the adhesion/barrier layer 28 not under the metal layer 34 are sequentially removed with a dry etching method or a wet etching method. As to the wet etching method, when the adhesion/barrier layer 28 is a titanium-tungsten alloy layer, it can be etched with a solution containing hydrogen peroxide at the temperature of between 40 and 50 degree centigrade for a time of between 3 and 20 minutes; when the seed layer 30 is a gold layer, it can be etched with an iodine-containing solution, such as a solution containing potassium iodide; when the seed layer 30 is a copper layer, it can be etched with a solution containing ammonium hydroxide ($NH_4OH$). As to the dry etching method, when the adhesion/barrier layer 28 is a titanium-tungsten alloy layer, it can be etched with an argon sputter process; when the seed layer 30 is a gold layer, it can be removed with an argon sputter process. Generally, the dry etching method to etch the seed layer 30 and the adhesion/barrier layer 28 not under the metal layer 34 may include a chemical plasma etching process, a sputtering etching process, such as an argon sputter process, or a chemical vapor etching process. So far, a semiconductor wafer 20 is formed by the above-mentioned steps.

Figure 2J:
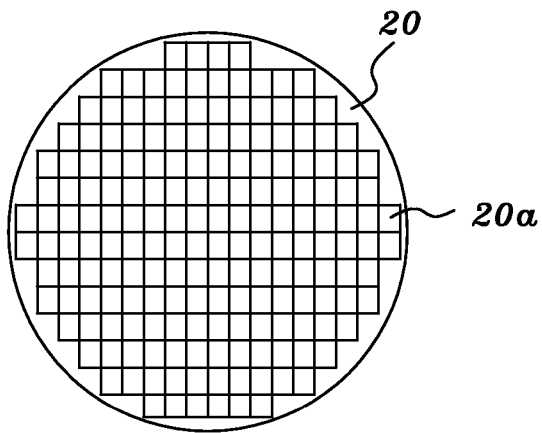
Figure 2K:
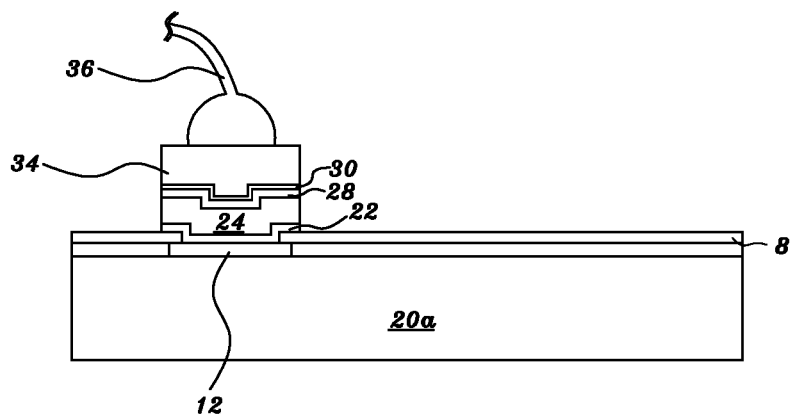

Next, referring to FIG. 2J and FIG. 2K, the semiconductor wafer can be diced into a plurality of individual semiconductor chips 20a. When one of the semiconductor chips 20a is being packaged, one end of a wire 36 made of gold can be ball bonded on the metal layer 34 of the semiconductor chip 20a by a wire-bonding process. The other end of the wire 36 can be wedge bonded on a pad of an external circuit. Therefore, the metal layer 34 of the semiconductor chip 20a may be used to be connected with an external circuit. The external circuit may be a ball-grid-array (BGA) substrate, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a silicon substrate.

Aspect 2 of Embodiment 1

After the step shown in FIG. 2G is completed, a metal layer 34 having a thickness of between 5 and 25 μm is electroplated on the seed layer 30 exposed by the opening 32a. The metal layer 34 may be a single layer made of gold, copper, palladium, platinum, or nickel. The metal layer 34 may also be a composite layer made of the abovementioned metals, the metal layer 34 use to be metal bump.

For example, the metal layer 34 may be formed by electroplating a gold layer having a thickness of between 5 and 25 µm on the seed layer 30, made of gold, exposed by the opening 32a. Alternatively, the metal layer 34 may be formed by electroplating a copper layer having a thickness of between 5 and 25 µm on the seed layer 30, made of copper, exposed by the opening 32a. Alternatively, the metal layer 34 may be formed by electroplating a copper layer having a thickness of between 5 and 25 µm on the seed layer 30, made of copper, exposed by the opening 32a, next electroplating a nickel layer having a thickness of between 0.1 and 5 µm on the copper layer in the opening 32a, and then electroplating a gold layer having a thickness of between 0.01 and 2 µm on the nickel layer in the opening 32a. Alternatively, the metal layer 34 may be formed by electroplating a copper layer having a thickness of between 5 and 25 µm on the seed layer 30, made of copper, exposed by the opening 32a, and then electroplating a gold layer having a thickness of between 0.01 and 2 µm on the copper layer in the opening 32a. Alternatively, the metal layer 34 may be formed by electroplating a copper layer having a thickness of between 5 and 25 µm on the seed layer 30, made of copper, exposed by the opening 32a, next electroplating a nickel layer having a thickness of between 0.1 and 5 µm on the copper layer in the opening 32a, and then electroplating a palladium layer having a thickness of between 0.01 and 2 µm on the nickel layer in the opening 32a. Alternatively, the metal layer 34 may be formed by electroplating a copper layer having a thickness of between 5 and 25 µm on the seed layer 30, made of copper, exposed by the opening 32a, next electroplating a nickel layer having a thickness of between 0.1 and 5 µm on the copper layer in the opening 32a, and then electroplating a platinum layer having a thickness of between 0.01 and 2 µm on the nickel layer in the opening 32a.

Next, the photoresist layer 32 can be removed using an organic solution with amide. Alternatively, the photoresist layer 32 can be removed using an inorganic solution, such as sulfuric acid ($H_2SO_4$) or hydrogen peroxide ($H_2O_2$). Alternatively, the photoresist layer 32 can be removed using an $O_2$ plasma or a plasma containing fluorine of below 200 PPM and oxygen.

Figure 2L:
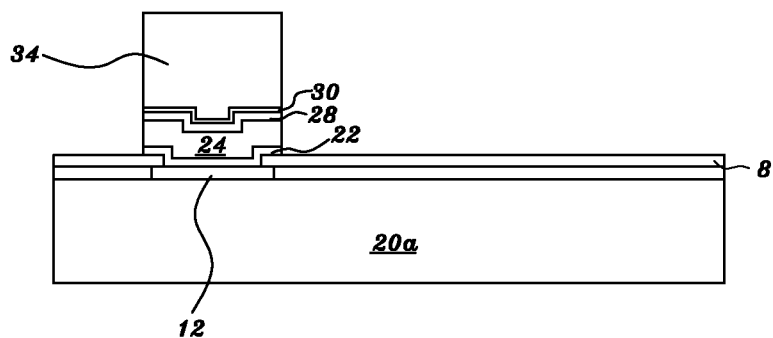
FIGS. 2L through 2P are sectional views showing a structure and process of a aspect of a embodiment of the present invention.

Referring to FIG. 2L, the seed layer 30 and the adhesion/barrier layer 28 not under the metal layer 34 are sequentially removed with a dry etching method or a wet etching method. As to the wet etching methods, when the adhesion/barrier layer 28 is a titanium-tungsten alloy layer, it can be etched with a solution containing hydrogen peroxide at the temperature of between 40 and 50 degree centigrade for a time of between 3 and 20 minutes; when the seed layer 30 is a gold layer, it can be etched with an iodine-containing solution, such as a solution containing potassium iodide; when the seed layer 30 is a copper layer, it can be etched with a solution containing ammonium hydroxide ($NH_4OH$). As to the dry etching methods, when the adhesion/barrier layer 28 is a titanium-tungsten alloy layer, it can be etched with an argon sputter process; when the seed layer 30 is a gold layer, it can be removed with an argon sputter process. Generally, the dry etching method to etch the seed layer 30 and the adhesion/barrier layer 28 not under the metal layer 34 may include a chemical plasma etching process, a sputtering etching process, such as an argon sputter process, or a chemical vapor etching process. So far, a semiconductor wafer is formed by the above-mentioned steps.

Referring to FIG. 2I, the semiconductor wafer 20 can be diced into a plurality of individual semiconductor chips 20a.

When one of the semiconductor chips is being packaged, the metal layer 34 can be connected to an external circuit via a TAB (Tape Automated Bonding) technology, a COG (chip on glass) technology, a TCP (Tape Carrier Package) method or a COF (chip on film) method. The external circuit may be a ball-grid-array (BGA) substrate, a printed circuit board (PCB) comprising a glass fiber as a core, a flexible tape comprising a polymer layer (such as polyimide) having a thickness of between 30 and 200 µm and not comprising any polymer layer with glass fiber, a ceramic substrate comprising a ceramic material as insulating layers between circuit layers, a glass substrate having circuit layers made of Indium Tin Oxide (ITO), or a silicon substrate.

Figure 2M:
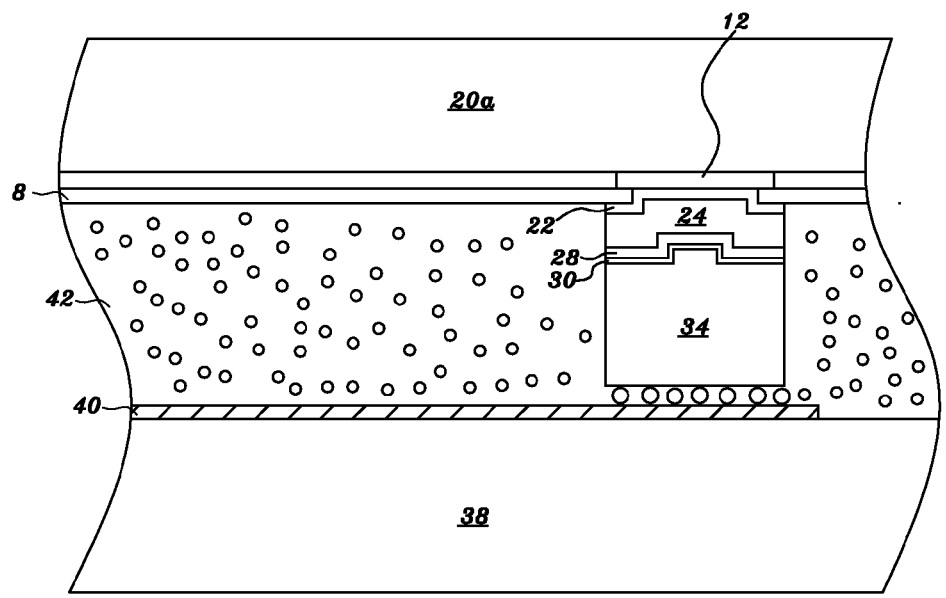

Referring to FIG. 2M, the metal layer 34 can be connected to a transparent conductive layer 40, made of indium tin oxide (ITO), having a thickness of between 5 and 50 µm, on a glass substrate wire via ACF (anisotropic conductive film) or ACP (anisotropic conductive paste) 42, described as below. Via a thermal pressing process, the metal layer 34 is pressed into ACF (anisotropic conductive film)/ACP (anisotropic conductive paste) 42 preformed on the glass substrate 38 and on the transparent conductive layer 40. Thus, metal particles inside ACF/ACP 42 cluster between the metal layer 34 and the transparent conductive layer 40, leading the metal layer 34 to be electrically coupled to the transparent conductive layer 40 on the glass substrate 38. Alternatively, the metal layer 34 may be electrically connected to a ceramic board or an organic substrate through metal particles in ACF/ACP 42 preformed on the ceramic board or organic substrate, as mentioned above.

Figure 2N:
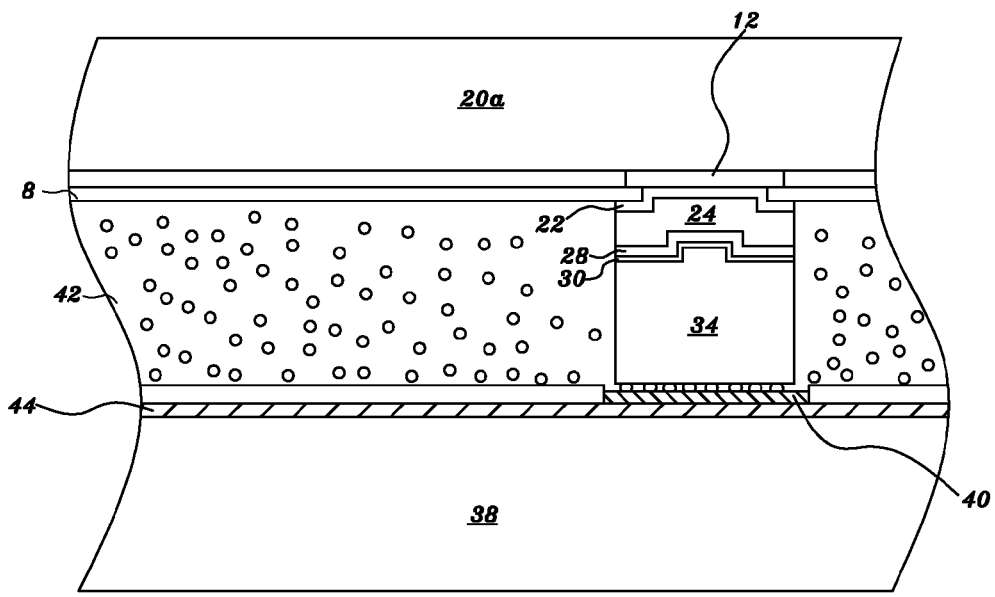

Referring to FIG. 2N, the metal layer 34 can be connected to a flexible film via ACF (anisotropic conductive film) or ACP (anisotropic conductive paste) 42, described as below. The flexible film comprises a polymer layer 38, a copper trace 44 having a thickness of between 5 and 50 µm on the polymer layer 38, a solder mask on the copper trace 44 and on the polymer layer 38, and a conductive layer 40 having a thickness of between 0.01 and 5 µm on the copper trace 44 exposed by an opening in the solder mask. Gold is a preferable material to the conductive layer 40. In a thermal pressing process, the metal layer 34 is pressed into ACF/ACP 42 preformed on the solder mask and the conductive layer 40 of the flexible film. Thus, metallic particles inside ACF/ACP 42 cluster between the metal layer 34 and the conductive layer 40 on the copper trace 44, leading the gold bump 34 to be electrically coupled to the conductive layer 40 of the flexible film.

Figure 2O:
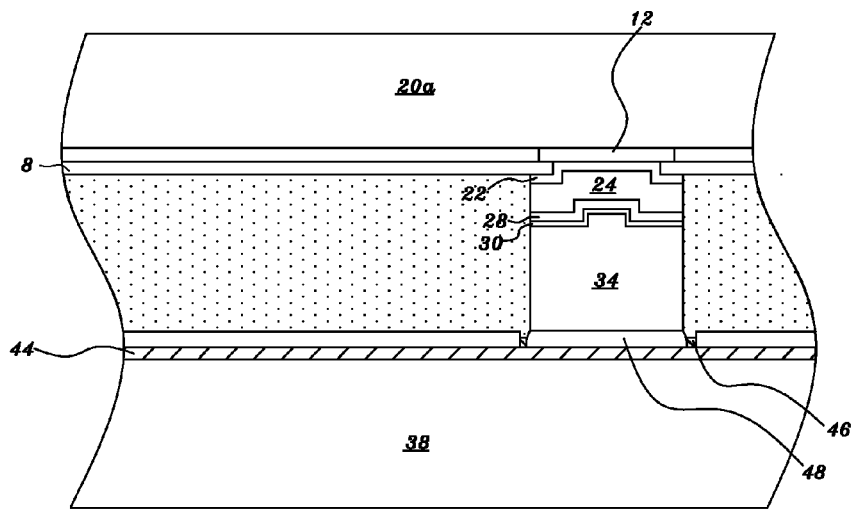

Referring to FIG. 2O, the metal layer 34 can be connected to a flexible film via tin-to-gold bonding, tin-to-platinum bonding, tin-to-palladium bonding, gold-to-gold bonding, gold-to-platinum bonding or gold-to-palladium bonding, described as below. Via a TAB technology, the metal layer 34 is bonded to a flexible film, such that the metal layer 34 can be connected to an external circuit, such as another semiconductor chip, printed circuit board, glass substrate, another flexible film, or ceramic substrate through the flexible film, wherein the printed circuit board containing a core with glass fiber and multiple circuit layers over and under the core, and the flexible film containing a polymer layer 38, such as polyimide, having a thickness of between 30 and 200 µm and a circuit layer 44 on the polymer layer.

In the process of fabricating the circuit layer 44 of the flexible film in FIGS. 2N and 2O, an adhesion/barrier layer, such as a layer of nickel, titanium, chromium or a titanium-tungsten alloy, having a thickness of between 0.1 and 0.7 µm, is sputtered on the polymer layer 38. Next, a seed layer, such as a copper layer, having a thickness of between 0.05 and 0.3 µm, is sputtered on the metal layer. Next, a photoresist layer is formed on the seed layer and an opening in the photoresist layer exposes the seed layer. Next, a copper layer having a thickness of between 5 and 50 μm is electroplated on the seed layer exposed by the opening in the photoresist layer. Next, the photoresist layer is removed, and then the seed layer and the adhesion/barrier layer not under the electroplated copper layer are also removed.

After the metal trace 44 is formed on the polymer layer 38, a solder mask is formed on the electroplated copper layer of the metal trace 44 and on the polymer layer 38 by screen printing or laminating. An opening in the solder mask exposes the electroplated copper layer of the metal trace 44. For example, the solder mask may be formed by laminating a polyimide layer having a thickness of between 4 and 60 μm, and preferably of between 6 and 24 μm, on the electroplated copper layer of the metal trace 44 and on the polymer layer 38, then removing part of the laminated polyimide layer using laser for forming an opening in the laminated polyimide layer exposing the electroplated copper layer of the metal trace 44. Alternatively, the laminated polyimide layer may be photosensitive, and the opening in the laminated polyimide layer may be formed to expose the electroplated copper layer of the metal trace 44 by a photolithography process.

Next, via an electroless plating method, a tin layer 46 having a thickness of between 0.1 and 5 μm is formed on the electroplated copper layer of the metal trace 44 exposed by the opening in the solder mask layer. Alternatively, via an electroless plating method, a gold layer having a thickness of between 0.01 and 2 μm may be formed on the electroplated copper layer of the metal trace 44 exposed by the opening in the solder mask layer. Therefore, the flexible film comprises an inner lead containing an inner part of the electroplated copper layer of the metal trace 44 and the tin layer 46 or gold layer on the inner part of the electroplated copper layer of the metal trace 44, and an outer lead containing an outer part of the electroplated copper layer of the metal trace 44. The inner lead extends to a central region of the flexible film, used to be bonded with the metal layer 34. The outer lead extends to a peripheral region of the flexible film, used to be connected to a external element, such as another semiconductor chip, printed circuit board containing a core with glass fiber and multiple circuit layer over and under the core, glass substrate, flexible film containing a polymer layer, such as polyimide, having a thickness of between 30 and 200 μm and a circuit layer on the polymer layer, or ceramic substrate. The inner lead is connected to the outer lead.

Alternatively, instead of the tin layer 46, the inner lead may include a gold layer electroless plated on the inner part of the electroplated copper layer of the metal trace 44 to connect the inner lead of the flexible film to the metal layer 34.

Referring to FIG. 2O, when the tin layer 46 is formed on the inner part of the electroplated copper layer of the metal trace 44, the inner lead of the metal trace 44 may be bonded to the gold layer of the metal layer 34, the palladium layer of the metal layer 34, or the platinum layer of the metal layer 34 using a thermal pressing process. In the thermal pressing process, a tin-gold alloy, tin-palladium alloy or tin-platinum alloy 48 is formed between the metal layer 34 and the inner part of the electroplated copper layer of the metal trace 44.

Referring to FIG. 2O, when, instead of the tin layer 46, a gold layer is formed on the inner part of the copper layer of the metal trace 44, the inner lead of the flexible film may be bonded to the gold layer of the metal layer 34, the palladium layer of the metal layer 34, or the platinum layer of the metal layer 34 using a thermal pressing process. In the thermal pressing process, the gold layer on the inner part of the copper layer of the metal trace 44 is bonded to the gold layer of the metal layer 34, the palladium layer of the metal layer 34, or the platinum layer of the metal layer 34 via a gold-to-gold eutectic bonding, gold-to-palladium eutectic bonding, or gold-to-platinum eutectic bonding.

Further, after the process of bonding the flexible film to the metal layer 34, a polymeric material, such as polyimide or epoxy, is formed to enclose the metal layer 34.

In one embodiment, a side of the outer leads of the flexible film may be connected to a glass substrate via ACF or ACP. The other side of the outer leads of the flexible film may be connected to a printed circuit board via the tin-to-gold bonding, tin-to-tin bonding or gold-to-gold bonding using a thermal press process. Alternatively, a side of the outer leads of the flexible film is connected to a glass substrate via ACF or ACP, and the other part of the outer leads of the flexible film is also connected to a printed circuit board via ACF or ACP.

Figure 2P:
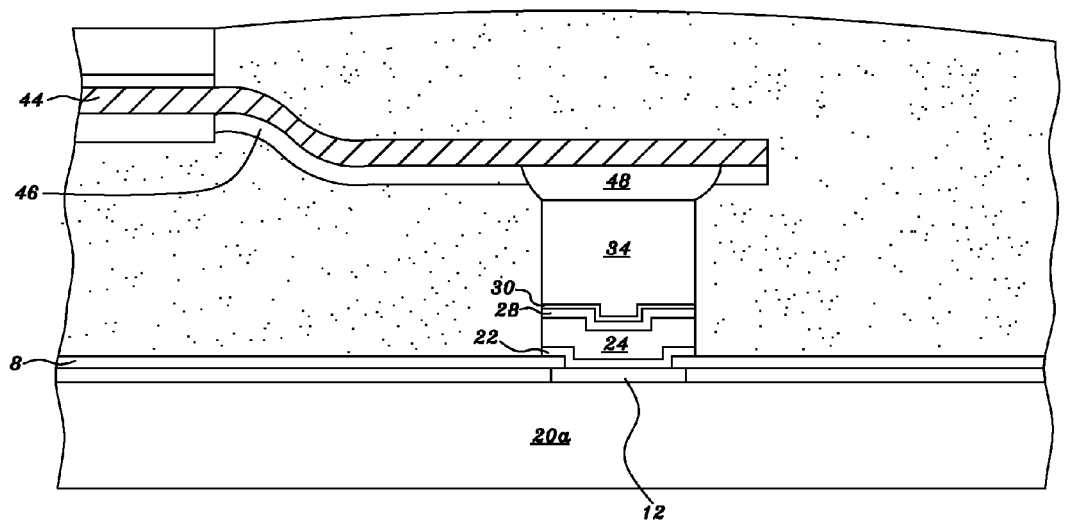

Referring to FIG. 2P, the metal layer 34 can be connected to a tape via tin-to-gold bonding, tin-to-palladium bonding, tin-to-platinum bonding, gold-to-gold bonding, gold-to-palladium bonding or gold-to-platinum bonding, described as below. A tape comprises an inner lead containing an inner part of a patterned copper trace 44, and an outer lead containing an outer part of the patterned copper trace 44. The inner lead extends to a central opening in the tape, used to be bonded with the gold layer of the metal layer 34. The outer lead extends to a peripheral region of the tape, used to be connected to an external element, such as another semiconductor chip, printed circuit board containing a core with glass fiber and multiple circuit layers over and under the core, glass substrate, flexible film containing a polymer layer, such as polyimide, having a thickness of between 30 and 200 μm and a circuit layer on the polymer layer, or ceramic substrate. The inner lead is connected to the outer lead. For example, the copper trace 44 has a thickness of between 8 and 25 μm. To be joined with the gold layer of the metal layer 34, the palladium layer of the metal layer 34, or the platinum layer of the metal layer 34 by tin-to-gold bonding, tin-to-palladium bonding or tin-to-platinum bonding, the inner lead may include a tin layer having a thickness of between 0.1 and 5 μm, electroless plated on the patterned copper trace of the inner lead.

Alternatively, instead of the tin layer 46, the inner lead may include a gold layer electroless plated on the patterned copper trace 44 of the inner lead, to be joined with the gold layer of the metal layer 34, the palladium layer of the metal layer 34, or the platinum layer of the metal layer 34 by gold-to-gold bonding, gold-to-palladium bonding or gold-to-platinum bonding.

Referring to FIG. 2P, when the tin layer 46 is formed on the inner part of the copper trace 44, the inner lead of the tape may be bonded to the gold layer of the metal layer 34, the palladium layer of the metal layer 34, or the platinum layer of the metal layer 34 using a thermal pressing process. In the thermal pressing process, a tin-gold alloy, tin-palladium alloy or tin-platinum alloy 48 is formed between the metal layer 34 and the inner part of the copper trace 44.

Referring to FIG. 2P, when, instead of the tin layer 46, a gold layer is formed on the inner part of the copper trace 44, the inner lead of the tape may be bonded to the gold layer of the metal layer 34, the palladium layer of the metal layer 34, or the platinum layer of the metal layer 34 using a thermal pressing process. In the thermal pressing process, the gold layer on the inner part of the copper trace 44 is bonded to the gold layer of the metal layer 34, the palladium layer of the metal layer 34, or the platinum layer of the metal layer 34 via a gold-to-gold eutectic bonding, a gold-to-palladium eutectic bonding or a gold-to-platinum eutectic bonding.

Further, after the process of bonding the tape to the metal layer 34, a polymeric material, such as polyimide or epoxy, is formed to enclose the inner leads of the tape and the metal layer 34.

In one embodiment, a side of the outer leads of the tape may be connected to a glass substrate via ACF or ACP. The other side of the outer leads of the tape may be connected to a printed circuit board via the tin-to-gold bonding, tin-to-tin bonding or gold-to-gold bonding using a thermal press process. Alternatively, a side of the outer leads of the tape is connected to a glass substrate via ACF or ACP, and the other part of the outer leads of the tape is also connected to a printed circuit board via ACF or ACP.

Aspect 3 of Embodiment 1

Figure 2Q:
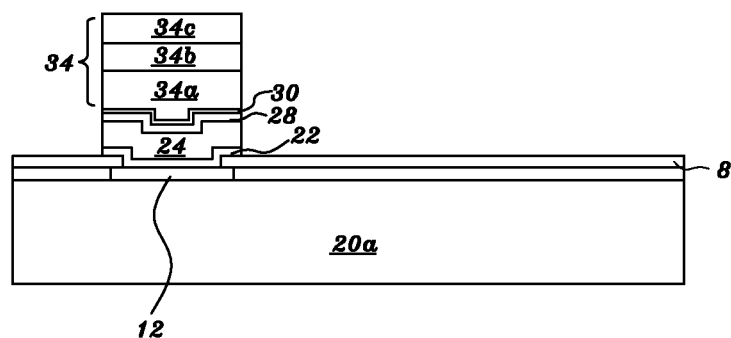
FIGS. 2Q through 2R are sectional views showing a structure and process of a aspect of a embodiment of the present invention.

After the step shown in FIG. 2G is completed, another kind of metal layer 34, as shown in FIG. 2Q, having a thickness of between 5 and 25 μm can be electroplated on the seed layer 30 exposed by the openings 32a. The metal layer 34 can be formed by electroplating a copper layer 34a having a thickness of between 2 and 25 μor between 2 and 15 μm on the seed layer 30, made of copper, exposed by the opening 32a, next electroplating a nickel layer 34b having a thickness of between 0.1 and 5 μm or between 2 and 5 μm on the copper layer 34a in the opening 32a, and then electroplating a gold layer 34c having a thickness of between 0.01 and 5 μm or between 0.5 and 5 μm on the nickel layer 34b in the opening 32a.

Next, the photoresist layer 32 can be removed using an organic solution with amide. Alternatively, the photoresist layer 32 can be removed using an inorganic solution, such as sulfuric acid ($H_2SO_4$) or hydrogen peroxide ($H_2O_2$). Alternatively, the photoresist layer 32 can be removed using an $O_2$ plasma or a plasma containing fluorine of below 200 PPM and oxygen. The process of removing the photoresist layer 32 can be referred to the illustration of FIG. 2H.

Referring to FIG. 2Q, the seed layer 30 and the adhesion/barrier layer 28 not under the metal layer 34 are sequentially removed with a dry etching method or a wet etching method. As to the wet etching methods, when the adhesion/barrier layer 28 is a titanium-tungsten alloy layer, it can be etched with a solution containing hydrogen peroxide at the temperature of between 40 and 50 degree centigrade for a time of between 3 and 20 minutes; when the seed layer 30 is a copper layer, it can be etched with a solution containing ammonium hydroxide ($NH_4OH$). As to the dry etching methods, when the adhesion/barrier layer 28 is a titanium-tungsten alloy layer, it can be etched with an argon sputter process. Generally, the dry etching method to etch the seed layer 30 and the adhesion/barrier layer 28 not under the metal layer 34 may include a chemical plasma etching process, a sputtering etching process, such as an argon sputter process, or a chemical vapor etching process. So far, a semiconductor wafer is formed by the above-mentioned steps. Next, the semiconductor wafer can be diced into a plurality of individual semiconductor chips 20a.

When one of the semiconductor chips 20a is being packaged, one end of a wire 36, as shown in FIG. 2K, made of gold can be ball bonded on the gold layer 34c of the semiconductor chip 20a by a wire-bonding process. The other end of the wire 36 can be wedge bonded on a pad of an external circuit. Therefore, the metal layer 34 of the semiconductor chip 20a may be used to be connected with an external circuit. The external circuit may be a ball-grid-array (BGA) substrate, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a silicon substrate.

When one of the semiconductor chips is being packaged, the metal layer 34 shown in FIG. 2Q can be connected to an external circuit via a TAB (Tape Automated Bonding) technology, a COG (chip on glass) technology, a TCP (Tape Carrier Package) method or a COF (chip on film) method. The external circuit may be a ball-grid-array (BGA) substrate, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a silicon substrate.

Figure 2R:
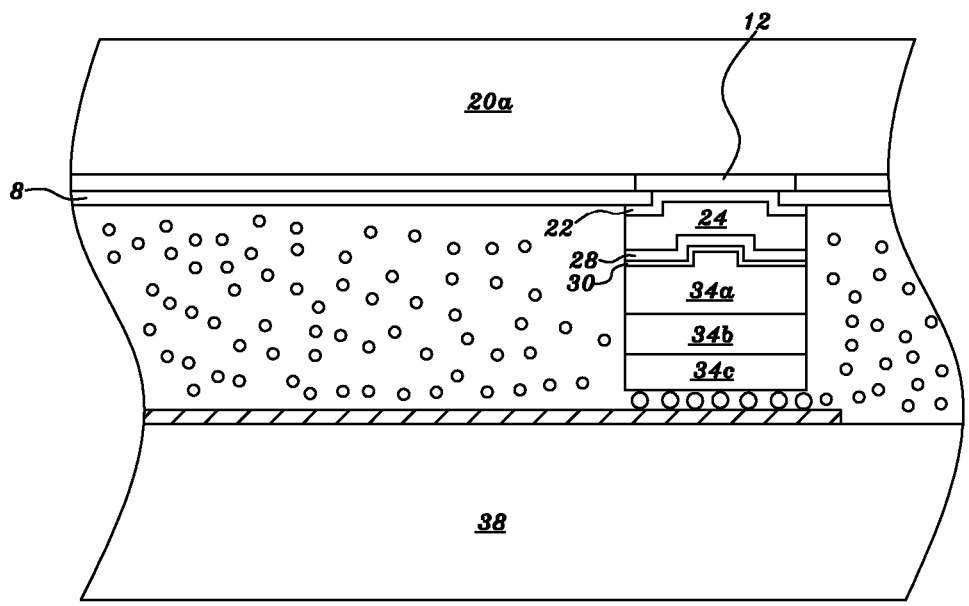

Referring to FIG. 2R, the metal layer 34 shown in FIG. 2Q can be connected to a transparent conductive layer 40, made of indium tin oxide (ITO), having a thickness of between 5 and 50 μm, on a glass substrate wire via ACF (anisotropic conductive film) or ACP (anisotropic conductive paste) 42, described as below. Via a thermal pressing process, the metal layer 34 is pressed into ACF (anisotropic conductive film)/ACP (anisotropic conductive paste) 42 preformed on the glass substrate 38 and on the transparent conductive layer 40. Thus, metal particles inside ACF/ACP 42 cluster between the metal layer 34 and the transparent conductive wire, leading the metal layer 34 to be electrically coupled to the transparent conductive layer 40 on the glass substrate 38. Alternatively, the metal layer 34 may be electrically connected to a ceramic board or an organic substrate through metal particles in ACF/ACP 42 preformed on the ceramic board or organic substrate, as mentioned above.

Figure 2S:
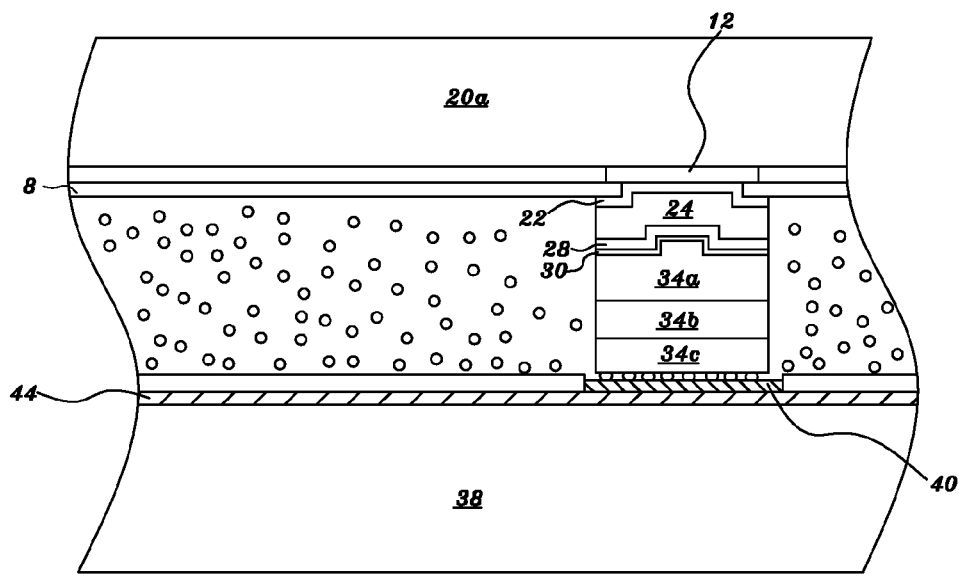
FIG. 2S is a sectional view showing a structure and process of an aspect of an embodiment of the present invention.

Referring to FIG. 2S, the metal layer 34 shown in FIG. 2Q can be connected to a flexible film via ACF (anisotropic conductive film) or ACP (anisotropic conductive paste) 42, described as below. The flexible film comprises a polymer layer 38, a copper trace 44 having a thickness of between 5 and 50 μm on the polymer layer 38, a solder mask on the copper trace 44 and on the polymer layer 38, and a gold conductive layer 40 having a thickness of between 0.01 and 5 μm on the copper trace 44 exposed by an opening in the solder mask. In a thermal pressing process, the metal layer 34 is pressed into ACF/ACP 42 preformed on the solder mask and the conductive layer 40 of the flexible film. Thus, metallic particles inside ACF/ACP 42 cluster between the metal layer 34 and the conductive layer 40 on the copper trace 44, leading the gold bump 34 to be electrically coupled to the conductive layer 40 of the flexible film.

Figure 2T:
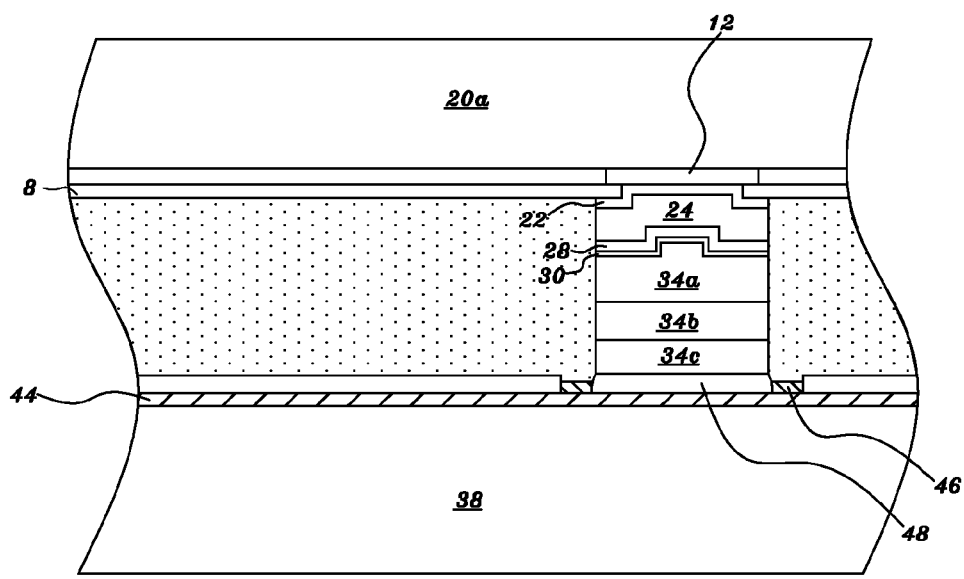
FIG. 2T is a sectional view showing a structure and process of an aspect of an embodiment of the present invention.

Referring to FIG. 2T, the metal layer 34 shown in FIG. 2Q can be connected to a flexible film via gold-to-solder bonding or gold-to-gold bonding, described as below. Via a TAB technology, the metal layer 34 is bonded to a flexible film, such that the metal layer 34 can be connected to an external circuit, such as another semiconductor chip, printed circuit board, glass substrate, another flexible film, or ceramic substrate through the flexible film, wherein the printed circuit board containing a core with glass fiber and multiple circuit layers over and under the core, and the flexible film containing a polymer layer 38, such as polyimide, having a thickness of between 30 and 200 μm and a circuit layer 44 on the polymer layer.

The process of fabricating the circuit layer 44 of the flexible film in FIGS. 2S and 2T can be referred as to the above illustration in FIGS. 2N and 2O.

Referring to FIG. 2T, when the tin layer 46 is formed on the inner part of the electroplated copper layer of the metal trace 44, the inner lead of the metal trace 44 may be bonded to the gold layer 34c of the metal layer 34 using a thermal pressing process. In the thermal pressing process, a tin-gold alloy 48 is formed between the metal layer 34 and the inner part of the electroplated copper layer of the metal trace 44.

Referring to FIG. 2T, when, instead of the tin layer 46, a gold layer is formed on the inner part of the copper layer of the metal trace 44, the inner lead of the flexible film may be bonded to the gold layer 34c of the metal layer 34 using a thermal pressing process. In the thermal pressing process, the gold layer on the inner part of the copper layer of the metal trace 44 is bonded to the gold layer of the metal layer 34 via a gold-to-gold eutectic bonding.

Further, after the process of bonding the flexible film to the metal layer 34, a polymeric material, such as polyimide or epoxy, is formed to enclose the metal layer 34.

In one embodiment, a side of the outer leads of the flexible film may be connected to a glass substrate via ACF or ACP. The other side of the outer leads of the flexible film may be connected to a printed circuit board via the tin-to-gold bonding, tin-to-tin bonding or gold-to-gold bonding using a thermal press process. Alternatively, a side of the outer leads of the flexible film is connected to a glass substrate via ACF or ACP, and the other part of the outer leads of the flexible film is also connected to a printed circuit board via ACF or ACP.

Figure 2U:
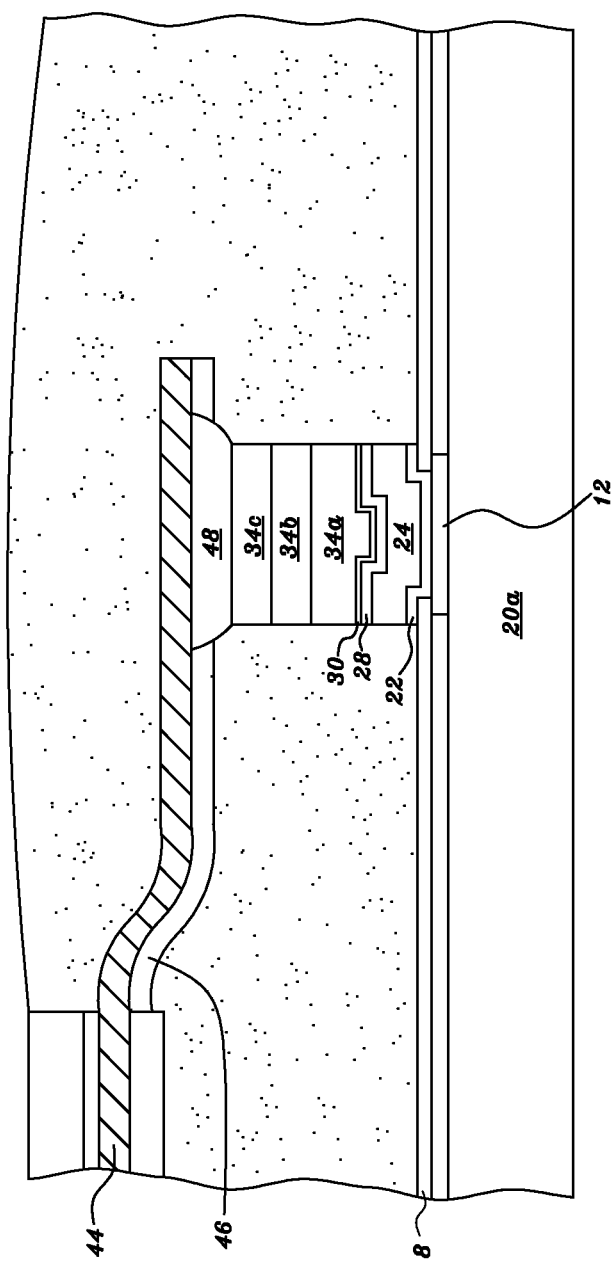
FIG. 2U is a sectional view showing a structure and process of an aspect of an embodiment of the present invention.

Referring to FIG. 2U, the metal layer 34 can be connected to a tape via tin-to-gold bonding or gold-to-gold bonding, described as below. A tape comprises an inner lead containing an inner part of a patterned copper trace 44, and an outer lead containing an outer part of the patterned copper trace 44. The inner lead extends to a central opening in the tape, used to be bonded with the gold layer 34c of the metal layer 34. The outer lead extends to a peripheral region of the tape, used to be connected to an external element, such as another semiconductor chip, printed circuit board containing a core with glass fiber and multiple circuit layers over and under the core, glass substrate, flexible film containing a polymer layer, such as polyimide, having a thickness of between 30 and 200 µm and a circuit layer on the polymer layer, or ceramic substrate. The inner lead is connected to the outer lead. For example, the copper trace 44 has a thickness of between 8 and 25 µm. To be joined with the gold layer 34c of the metal layer 34 by tin-to-gold bonding, the inner lead may include a tin layer having a thickness of between 0.1 and 5 µm, electroless plated on the patterned copper trace of the inner lead.

Alternatively, instead of the tin layer 46, the inner lead may include a gold layer electroless plated on the patterned copper trace 44 of the inner lead, to be joined with the gold layer 34c of the metal layer 34 by gold-to-gold bonding.

Referring to FIG. 2U, then the tin layer 46 is formed on the inner part of the copper trace 44, the inner lead of the tape may be bonded to the gold layer 34c of the metal layer 34 using a thermal pressing process. In the thermal pressing process, a tin-gold alloy 48 is formed between the metal layer 34 and the inner part of the copper trace 44.

Referring to FIG. 2U, then, instead of the tin layer 46, a gold layer is formed on the inner part of the copper trace 44, the inner lead of the tape may be bonded to the gold layer 34c of the metal layer 34 using a thermal pressing process. In the thermal pressing process, the gold layer on the inner part of the copper trace 44 is bonded to the gold layer 34c of the metal layer 34 via a gold-to-gold eutectic bonding.

Further, after the process of bonding the tape to the metal layer 34, a polymeric material, such as polyimide or epoxy, is formed to enclose the inner leads of the tape and the metal layer 34.

In one embodiment, a side of the outer leads of the tape may be connected to a glass substrate via ACF or ACP. The other side of the outer leads of the tape may be connected to a printed circuit board via the tin-to-gold bonding, tin-to-tin bonding or gold-to-gold bonding using a thermal press process. Alternatively, a side of the outer leads of the tape is connected to a glass substrate via ACF or ACP, and the other part of the outer leads of the tape is also connected to a printed circuit board via ACF or ACP.

Aspect 1 of Embodiment 2

Referring to FIG. 3A, after the step shown in FIG. 2F, a photoresist layer 32 is formed on the seed layer 30. Next, the photoresist layer 32 is patterned with the processes of exposure, development, etc., to form an opening 32a with a trace pattern in the photoresist layer 32 exposing the seed layer 30 over the patterned metal cap 24 and over the passivation layer 8. For example, the photoresist layer 32 can be formed by spin-on coating a positive-type photosensitive polymer layer having a thickness of between 5 and 30 µm, and preferably of between 7 and 15 µm, on the seed layer 30, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 30 with an $O_2$ plasma or a plasma containing fluorine of below 200 PPM and oxygen, such that the photoresist layer 32 can be patterned with an opening 32a with a trace pattern in the photoresist layer 32 exposing the seed layer 30.

Figure 3B:
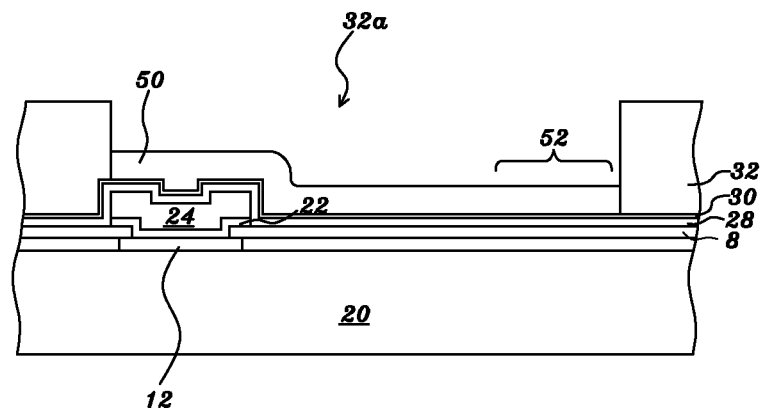
Figure 3C:
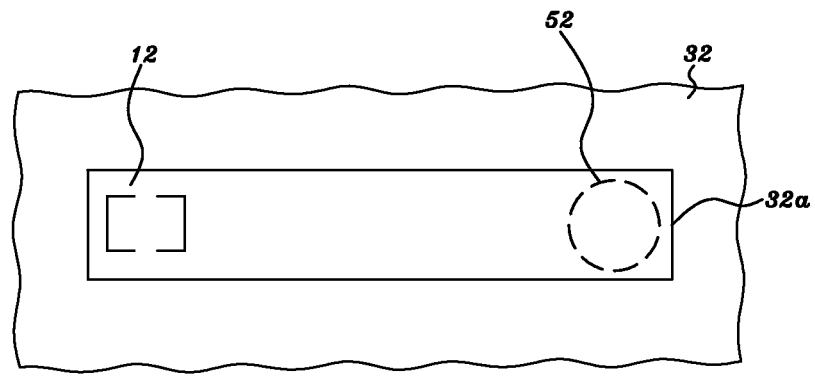

Referring to FIG. 3B and FIG. 3C, a metal layer 50 having a thickness of between 1 and 15 µm is electroplated on the seed layer 30 exposed by the opening 32a. The metal layer 50 may be a single layer made of gold, copper, palladium, platinum, or nickel. The metal layer 50 may also be a composite layer made of the abovementioned metals.

For example, the metal layer 50 may be formed by electroplating a gold layer with a thickness of between 1 and 15 µm on the seed layer 30, made of gold, exposed by the opening 32a. Alternatively, the metal layer 50 may be formed by electroplating a copper layer with a thickness of between 1 and 5 µm on the seed layer 30, made of copper, exposed by the opening 32a, next electroplating a nickel layer with a thickness of between 0.1 and 5 µm on the copper layer in the opening 32a, and then electroplating a gold layer with a thickness of between 0.01 and 2 µm on the nickel layer in the opening 32a. Alternatively, the metal layer 50 may be formed by electroplating a copper layer with a thickness of between 1 and 15 µm on the seed layer 30, made of copper, exposed by the opening 32a, and then electroplating a gold layer with a thickness of between 0.01 and 2 µm on the copper layer in the opening 32a. Alternatively, the metal layer 50 may be formed by electroplating a copper layer with a thickness of between 1 and 15 µm on the seed layer 30, made of copper, exposed by the opening 32a, next electroplating a nickel layer with a thickness of between 0.1 and 5 µm on the copper layer in the opening 32a, and then electroplating a palladium layer with a thickness of between 0.01 and 2 μm on the nickel layer in the opening 32a. Alternatively, the metal layer 50 may be formed by electroplating a copper layer with a thickness of between 1 and 15 μm on the seed layer 30, made of copper, exposed by the opening 32a, next electroplating a nickel layer with a thickness of between 0.1 and 5 μm on the copper layer in the opening 32a, and then electroplating a platinum layer with a thickness of between 0.01 and 2 μm on the nickel layer in the opening 32a.

A top surface area of the metal layer 50 is defined as a pad 52. From a top perspective view, the position of the pad 52 is different from that of the pad 12, as shown in FIG. 3C.

Figure 3D:
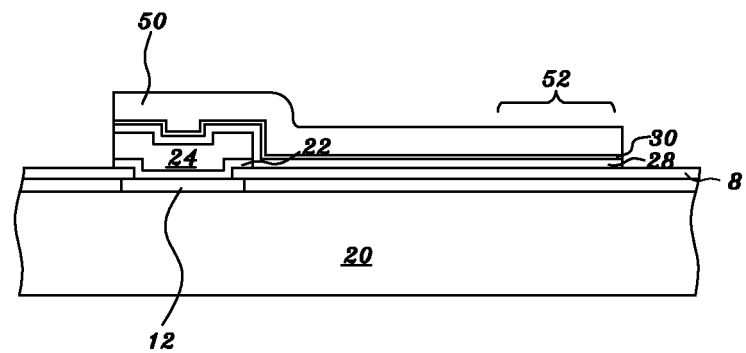

Referring to FIG. 3D, after the metal layer 50 is formed, the photoresist layer 32 can be removed using an organic solution with amide. Alternatively, the photoresist layer 32 can be removed using an inorganic solution, such as sulfuric acid ($H_2SO_4$) or hydrogen peroxide ($H_2O_2$). Alternatively, the photoresist layer 32 can be removed using an $O_2$ plasma a plasma containing fluorine of below 200 PPM and oxygen.

Next, the seed layer 30 and the adhesion/barrier layer 28 not under the metal layer 50 are sequentially removed with a dry etching method or a wet etching method. As to the wet etching methods, when the adhesion/barrier layer 28 is a titanium-tungsten alloy layer, it can be etched with a solution containing hydrogen peroxide at the temperature of between 40 and 50 degree centigrade for a time of between 3 and 20 minutes; when the seed layer 30 is a gold layer, it can be etched with an iodine-containing solution, such as a solution containing potassium iodide; when the seed layer 30 is a copper layer, it can be etched with a solution containing ammonium hydroxide ($NH_4OH$). As to the dry etching methods, when the adhesion/barrier layer 28 is a titanium-tungsten alloy layer, it can be etched with an argon sputter process; when the seed layer 30 is a gold layer, it can be removed with an argon sputter process. Generally, the dry etching method to etch the seed layer 30 and the adhesion/barrier layer 28 not under the metal layer 50 may include a chemical plasma etching process, a sputtering etching process, such as an argon sputter process, or a chemical vapor etching process.

Figure 3E:
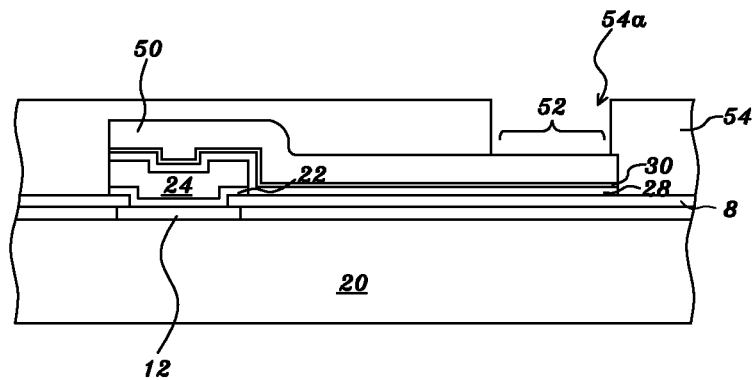

Referring to FIG. 3E, a polymer layer 54 can be formed on the passivation layer 8 and on the metal layer 50. Next, the polymer layer 54 is patterned with the processes of baking, exposure, development, etc., to form at least one opening 54a in the polymer layer 54 exposing the pad 52. For example, the polymer layer 54 can be formed by spin-on coating a positive-type photosensitive polyimide layer having a thickness of between 10 and 50 μm on the metal layer 50 and on the passivation layer 8, then exposing the photosensitive polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polyimide layer, that is, G-line and H-line, G-line and I-line, H-line and I-line, or G-line, H-line and I-line illuminate the photosensitive polyimide layer, then developing the exposed polyimide layer to form an opening in the polyimide layer exposing the pad 52, and then removing the polyimide residuals or other contaminants from the pad 52 with an $O_2$ plasma or a plasma containing fluorine of below 200 PPM and oxygen, and then curing the developed polyimide layer at a peak temperature of between 250 and 400° C. for a time of between 30 minutes and 4 hours in nitrogen ambient or in oxygen-free ambient, wherein the cured polyimide layer may have a thickness of between 3 and 25 μm, such that the polymer layer 54 can be patterned with an opening 54a in the polymer layer 54 exposing the pad 52. Alternatively, the material of the polymer layer 54 may include polyimide (PI), benzocyclobutane (BCB), parylene, epoxy-based material, elastomer, photoepoxy SU-8, silicone, or a porous dielectric material. The polymer layer 54 may be a benzocyclobutane layer with a thickness of between 3 and 25 μm.

Alternatively, the polymer layer 54 may be formed by a lamination process or a screen-printing process. So far, a semiconductor wafer 20 is formed by the above-mentioned steps.

Figure 3F:
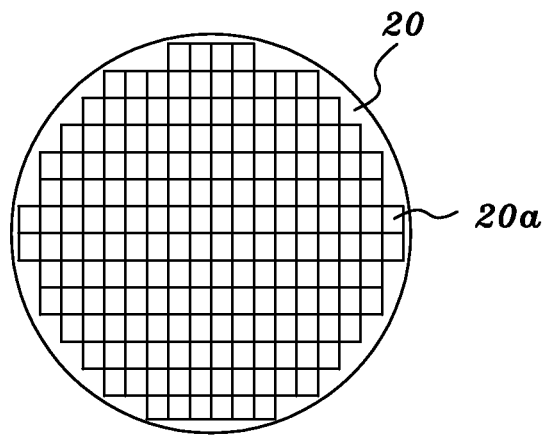

Next, referring to FIG. 3F and FIG. 3G, the semiconductor wafer 20 can be diced into a plurality of individual semiconductor chips 20a. When one of the semiconductor chips 20a is being packaged, one end of a wire 36 made of gold can be ball bonded on the pad 52 of the semiconductor chip 20a by a wire-bonding process. The other end of the wire 36 can be wedge bonded on a pad of an external circuit. Therefore, the metal layer 50 of the semiconductor chip 20a may be used to be connected with an external circuit. The external circuit may be a ball-grid-array (BGA) substrate, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a silicon substrate.

Alternatively, a metal bump having a titanium-containing layer with a thickness of between 0.1 and 0.7 μm on the pad 52 exposed by the opening 66a, a copper layer with a thickness of between 1 and 10 μm on the titanium-containing layer, a nickel layer with a thickness of between 0.5 and 5 μm on the copper layer, and a tin-containing layer with a thickness of between 10 and 300 μm on the nickel layer may be formed on the pad 52 exposed by the opening 54a, followed by dicing the semiconductor wafer 20 into multiple semiconductor chips 20a. The semiconductor chip 20a may be bonded to a BGA substrate through the metal bump.

Alternatively, a metal bump having a titanium-containing layer with a thickness of between 0.1 and 0.7 μm on the pad 52 exposed by the opening 66a, and a gold layer with a thickness of between 5 and 25 μm on the titanium-containing layer may be formed on the pad 52 exposed by the opening 54a, followed by dicing the semiconductor wafer 20 into multiple semiconductor chips 20a. The metal bump may connect the semiconductor chip to a glass substrate via ACF or ACP. Besides, the metal bump may connect the semiconductor chip to a printed circuit board via tape automated bonding (TAB). Besides, the metal bump may connect the semiconductor chip to a flexible substrate without glass fiber.

Aspect 2 of Embodiment 2

After the step shown in FIG. 3A, a metal layer 50 is electroplated on the seed layer 30 exposed by the opening 32a. The metal layer 50 is formed by electroplating a copper layer 50a having a thickness of between 1 and 15 μm on the seed layer 30, made of copper, exposed by the opening 32a, next electroplating a nickel layer 50b having a thickness of between 0.1 and 5 μm on the copper layer 50a in the opening 32a, and then electroplating a gold layer 50c having a thickness of between 0.01 and 2 μm on the nickel layer 50b in the opening 32a, as shown in FIG. 3H-a.

Next, the photoresist layer 32 can be removed using an organic solution with amide. Alternatively, the photoresist layer 32 can be removed using an inorganic solution, such as sulfuric acid ($H_2SO_4$) or hydrogen peroxide ($H_2O_2$). Alternatively, the photoresist layer 32 can be removed using an O$_2$ plasma or a plasma containing fluorine of below 200 PPM and oxygen.

Next, the seed layer 30 and the adhesion/barrier layer 28 not under the metal layer 50 are removed with a dry etching method or a wet etching method. The steps of removing the adhesion/barrier layer 28 and the seed layer 30 not under the metal layer 50 can be referred to the above description concerning FIG. 3D.

Next, a polymer layer 54 is formed on the passivation layer 8 and on the metal layer 50, at least one opening 54a in the polymer layer 54 exposing the gold layer 50c of the metal layer 50. The process of forming the polymer layer 54 can be referred to the description as shown in FIG. 3E. From a top perspective view, the position of the gold layer 50c of the metal layer 50 exposed by the opening 54a can be different from that of the pad 12. So far, a semiconductor wafer is formed by the above-mentioned steps.

Referring to FIG. 3H-a, the semiconductor wafer 20 can be diced into a plurality of individual semiconductor chips 20a. When one of the semiconductor chips 20a is being packaged, one end of a wire 36 made of gold can be ball bonded on the gold layer 50c exposed by the opening 54a of the semiconductor chip 20a by a wire-bonding process. The other end of the wire 36 can be wedge bonded on a pad of an external circuit. Therefore, the gold layer 50c of the metal layer 50 of the semiconductor chip 20a may be used to be connected with an external circuit. The external circuit may be a ball-grid-array (BGA) substrate, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a silicon substrate.

Alternatively, after the step shown in FIG. 3A, a copper layer 50a having a thickness of between 1 and 15 μm on the seed layer 30, made of copper, exposed by the opening 32a, and then electroplating a nickel layer 50b having a thickness of between 0.1 and 5 μm on the copper layer 50a in the opening 32a, as shown in FIG. 3H-b.

Next, the photoresist layer 32 can be removed using an organic solution with amide. Alternatively, the photoresist layer 32 can be removed using an inorganic solution, such as sulfuric acid (H$_2$SO$_4$) or hydrogen peroxide (H$_2$O$_2$). Alternatively, the photoresist layer 32 can be removed using an O$_2$ plasma or a plasma containing fluorine of below 200 PPM and oxygen.

Next, the seed layer 30 and the adhesion/barrier layer 28 not under the copper layer 50a are sequentially removed with a dry etching method or a wet etching method. The steps of removing the adhesion/barrier layer 28 and the seed layer 30 not under the copper layer 50a can be referred to the above description concerning FIG. 3D.

Next, a polymer layer 54 is formed on the passivation layer 8 and on the nickel layer 50b, at least one opening 54a in the polymer layer 54 exposing the nickel layer 50b. The process for forming the polymer layer 54 can be referred to the above illustration concerning FIG. 3E. From a top perspective view, the position of the nickel layer 50b exposed by the opening 54a can be different from that of the pad 12. However, a surface of the nickel layer 50b exposed by the opening 54a could be oxidized. Therefore, before a gold layer 50c having a thickness of between 0.01 and 2 μm is electroless plated on the nickel layer 50b exposed by the opening 54a, the oxidized surface exposed by the opening 54a can be removed by acid solution, such as sulfuric acid or hydrochloric acid, such that inoxidized nickel layer 50b can be exposed by the opening 54a to have the gold layer 50c electroless plated thereon. So far, a semiconductor wafer is formed by the above-mentioned steps.

Next, referring to FIG. 3H-b, the semiconductor wafer can be diced into a plurality of individual semiconductor chips 20a. When one of the semiconductor chips 20a is being packaged, one end of a wire 36 made of gold can be ball bonded on the gold layer 50c of the semiconductor chip 20a by a wire-bonding process. The other end of the wire 36 can be wedge bonded on a pad of an external circuit. Therefore, the gold layer 50c the semiconductor chip 20a may be used to be connected with an external circuit. The external circuit may be a ball-grid-array (BGA) substrate, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a silicon substrate.

Aspect 3 of Embodiment 2

Figure 3I:
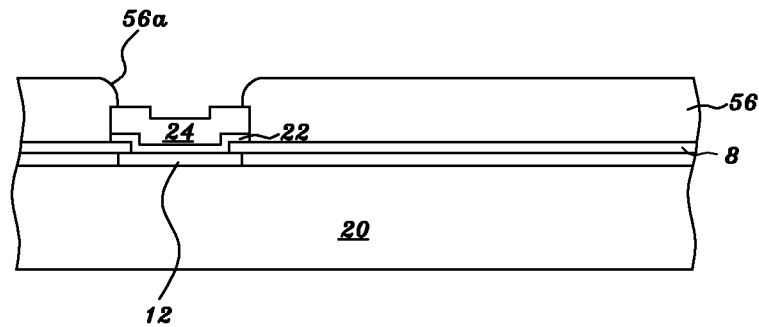
FIGS. 3I through 3Q are sectional views showing a structure and process of a aspect of a embodiment of the present invention.

Referring to FIG. 3I, after the step shown in FIG. 2D, a polymer layer 56 can be formed on the passivation layer 8 and on the patterned metal cap 24. Next, the polymer layer 56 is patterned with the processes of baking, exposure, development, etc., to form an opening 56a in the polymer layer 56 exposing the patterned metal cap 24 over the pad 12. For example, the polymer layer 56 can be formed by spin-on coating a positive-type photosensitive polyimide layer having a thickness of between 10 and 50 μm on the patterned metal cap 24 and on the passivation layer 8, then exposing the photosensitive polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polyimide layer, that is, G-line and H-line, G-line and I-line, H-line and I-line, or G-line, H-line and I-line illuminate the photosensitive polyimide layer, then developing the exposed polyimide layer to form an opening in the polyimide layer exposing the patterned metal cap 24, and then removing the polyimide residuals or other contaminants from the patterned metal cap 24 with an O$_2$ plasma or a plasma containing fluorine of below 200 PPM and oxygen, and then curing the developed polyimide layer at a peak temperature of between 250 and 400° C. for a time of between 30 minutes and 4 hours in nitrogen ambient or in oxygen-free ambient, wherein the cured polyimide layer may have a thickness of between 3 and 25 μm, such that the polymer layer 56 can be patterned with an opening 56a in the polymer layer 56 exposing the patterned metal cap 56. Alternatively, the material of the polymer layer 56 may include polyimide (PI), benzocyclobutane (BCB), parylene, epoxy-based material, elastomer, photoepoxy SU-8, silicone, or a porous dielectric material. The polymer layer 56 may be a benzocyclobutane layer with a thickness of between 3 and 25 μm.

Alternatively, the polymer layer 56 may be formed by a laminating process or a screen-printing process.

Figure 3J:
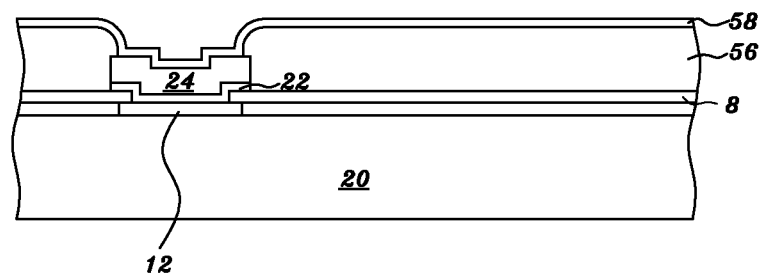

Referring to FIG. 3J, an adhesion/barrier 58 having a thickness of between 0.01 and 0.7 μm is sputtered on the patterned metal cap 24 and on the polymer layer 56. The material of the adhesion/barrier layer 58 may include titanium, titanium nitride, a titanium-tungsten alloy, chromium, tantalum, tantalum nitride, or a composite of the abovementioned materials.

For example, the adhesion/barrier 58 is formed by sputtering a titanium-tungsten-alloy layer with a thickness of between 0.01 and 0.7 µm on the polymer layer 56 made of polyimide and on the patterned metal cap 24 including aluminum. Alternatively, the adhesion/barrier 58 is formed by sputtering a titanium layer with a thickness of between 0.01 and 0.7 µm on the polymer layer 56 made of polyimide and on the patterned metal cap 24 including aluminum.

Figure 3K:
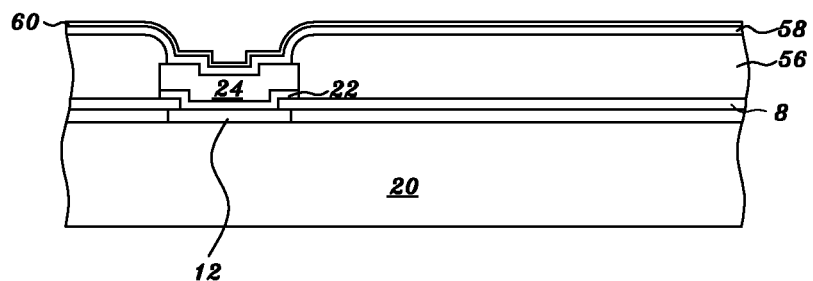

Referring to FIG. 3K, a seed layer 60 having a thickness of between 0.005 and 2 µm is sputtered on the adhesion/barrier layer 58. The seed layer 60 is beneficial to electroplating a metal layer thereon. Thus, the material of the seed layer 60 varies with the material of the electroplated metal layer formed on the seed layer 60. When a gold layer is to be electroplated on the seed layer 60, gold (Au) is a preferable material to the seed layer 60. When a copper layer is to be electroplated on the seed layer 60, copper (Cu) is a preferable material to the seed layer 60. When a silver layer is to be electroplated on the seed layer 60, silver (Ag) is a preferable material to the seed layer 60. When a palladium layer is to be electroplated on the seed layer 60, palladium (Pd) is a preferable material to the seed layer 60. When a platinum layer is to be electroplated on the seed layer 60, platinum (Pt) is a preferable material to the seed layer 60. When a rhodium layer is to be electroplated on the seed layer 60, rhodium (Rh) is a preferable material to the seed layer 60. When a ruthenium layer is to be electroplated on the seed layer 60, ruthenium (Ru) is a preferable material to the seed layer 60. When a rhenium layer is to be electroplated on the seed layer 60, rhenium (Re) is a preferable material to the seed layer 60. When a nickel layer is to be electroplated on the seed layer 60, nickel (Ni) is a preferable material to the seed layer 60.

For example, when the adhesion/barrier layer 58 is formed by sputtering a titanium-tungsten-alloy layer with a thickness of between 0.01 and 0.7 µm, the seed layer 60 can be formed by sputtering a gold layer with a thickness of between 0.005 and 2 µm on the titanium-tungsten-alloy layer. When the adhesion/barrier layer 58 is formed by sputtering a titanium-tungsten alloy layer with a thickness of between 0.01 and 0.7 µm, the seed layer 60 can be formed by sputtering a copper layer with a thickness of between 0.005 and 2 µm on the titanium-tungsten-alloy layer. When the adhesion/barrier layer 58 is formed by sputtering a titanium layer with a thickness of between 0.01 and 0.7 µm, the seed layer 60 can be formed by sputtering a gold layer with a thickness of between 0.005 and 2 µm on the titanium layer. When the adhesion/barrier layer 58 is formed by sputtering a titanium layer with a thickness of between 0.01 and 0.7 µm, the seed layer 60 can be formed by sputtering a copper layer with a thickness of between 0.005 and 2 µm on the titanium layer.

Figure 3L:
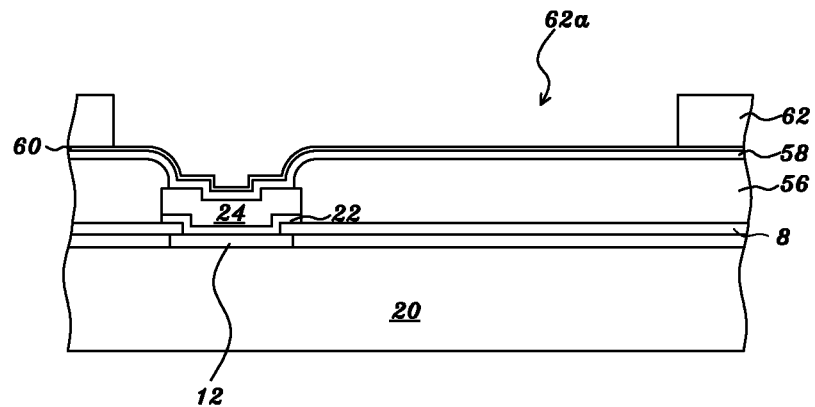

Referring to FIG. 3L, a photoresist layer 62 is formed on the seed layer 60. Next, the photoresist layer 62 is patterned with the processes of exposure, development, etc., to form an opening 62a in the photoresist layer 62 exposing the seed layer 60. For example, the photoresist layer 62 can be formed by spin-on coating a positive-type photosensitive polymer layer having a thickness of between 5 and 30 µm, and preferably of between 7 and 15 µm, on the seed layer 60, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer to form an opening in the polymer layer exposing the seed layer 60, and then removing the residual polymeric material or other contaminants on the seed layer 60 with an $O_2$ plasma or a plasma containing fluorine of below 200 PPM and oxygen, such that the photoresist layer 62 can be patterned with an opening 62a in the photoresist layer 62 exposing the seed layer 60.

Figure 3M:
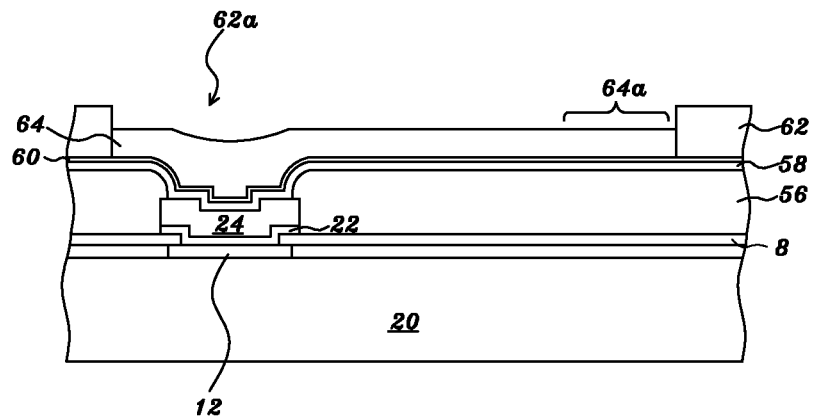

Referring to FIG. 3M, a metal layer 64 having a thickness of between 1 and 25 µm is electroplated on the seed layer 60 exposed by the opening 62a. The metal layer 64 may be a single layer made of gold, copper, palladium, platinum, or nickel. The metal layer 64 may also be a composite layer made of the abovementioned metals.

For example, the metal layer 64 may be formed by electroplating a gold layer with a thickness of between 1 and 10 µm on the seed layer 60, made of gold, exposed by the opening 62a. Alternatively, the metal layer 64 may be formed by electroplating a copper layer with a thickness of between 1 and 15 µm on the seed layer 60, made of copper, exposed by the opening 62a. Alternatively, the metal layer 64 may be formed by electroplating a copper layer with a thickness of between 1 and 15 µm on the seed layer 60, made of copper, exposed by the opening 62a, next electroplating a nickel layer with a thickness of between 0.1 and 5 µm on the copper layer in the opening 62a, and then electroplating a gold layer with a thickness of between 0.01 and 2 µm on the nickel layer in the opening 62a. Alternatively, the metal layer 64 may be formed by electroplating a copper layer with a thickness of between 1 and 15 µm on the seed layer 60, made of copper, exposed by the opening 62a, and then electroplating a gold layer with a thickness of between 0.01 and 2 µm on the copper layer in the opening 62a. Alternatively, the metal layer 64 may be formed by electroplating a copper layer with a thickness of between 1 and 15 µm on the seed layer 60, made of copper, exposed by the opening 62a, next electroplating a nickel layer with a thickness of between 0.1 and 5 µm on the copper layer in the opening 62a, and then electroplating a palladium layer with a thickness of between 0.01 and 2 µm on the nickel layer in the opening 62a. Alternatively, the metal layer 64 may be formed by electroplating a copper layer with a thickness of between 1 and 15 µm on the seed layer 60, made of copper, exposed by the opening 62a, next electroplating a nickel layer with a thickness of between 0.1 and 5 µm on the copper layer in the opening 62a, and then electroplating a platinum layer with a thickness of between 0.01 and 2 µm on the nickel layer in the opening 62a.

A top surface area of the metal layer 64 is defined as a pad 64a. From a top perspective view, the position of the pad 64a is different from that of the pad 12.

Figure 3N:
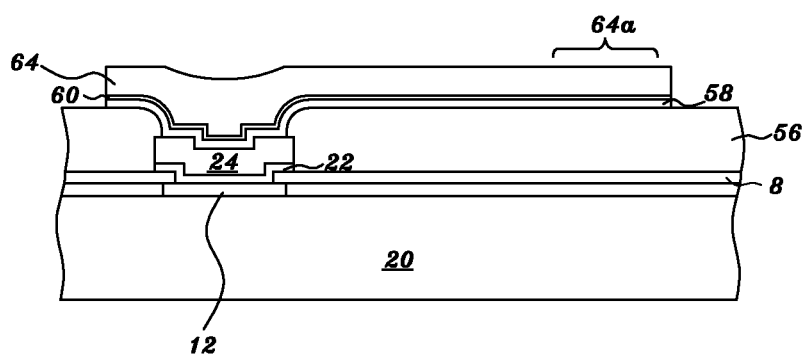

Referring to FIG. 3N, the photoresist layer 62 can be removed using an organic solution with amide. Alternatively, the photoresist layer 62 can be removed using an inorganic solution, such as sulfuric acid ($H_2SO_4$) or hydrogen peroxide ($H_2O_2$). Alternatively, the photoresist layer 62 can be removed using an $O_2$ plasma or a plasma containing fluorine of below 200 PPM and oxygen.

Next, the seed layer 60 and the adhesion/barrier layer 58 not under the metal layer 64 are removed with a dry etching method or a wet etching method. As to the wet etching methods, when the adhesion/barrier layer 58 is a titanium-tungsten alloy layer, it can be etched with a solution containing hydrogen peroxide at the temperature of between 40 and 50 degree centigrade for a time of between 3 and 20 minutes; when the seed layer 60 is a gold layer, it can be etched with an iodine-containing solution, such as a solution containing potassium iodide; when the seed layer 60 is a copper layer, it can be etched with a solution containing ammonium hydroxide (NH$_4$OH). As to the dry etching methods, when the adhesion/barrier layer 58 is a titanium-tungsten alloy layer, it can be etched with an argon sputter process; when the seed layer 60 is a gold layer, it can be removed with an argon sputter process. Generally, the dry etching method to etch the seed layer 60 and the adhesion/barrier layer 58 not under the metal layer 64 may include a chemical plasma etching process, a sputtering etching process, such as an argon sputter process, or a chemical vapor etching process.

Figure 3O:
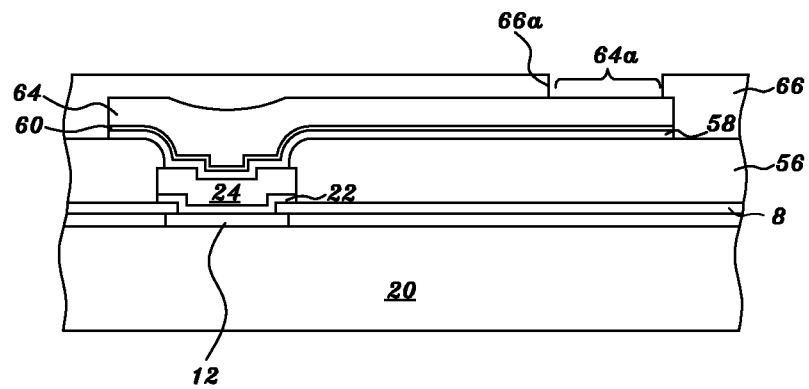

Referring to FIG. 3O, a polymer layer 66 can be formed on the polymer layer 56 and on the metal layer 64. Next, the polymer layer 66 is patterned with the processes of baking, exposure, development, etc., to form an opening 66a in the polymer layer 66 exposing the pad 64a. For example, the polymer layer 66 can be formed by spin-on coating a positive-type photosensitive polyimide layer having a thickness of between 10 and 50 μm on the metal layer 64 and on the polymer layer 56, then exposing the photosensitive polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polyimide layer, that is, G-line and H-line, G-line and I-line, H-line and I-line, or G-line, H-line and I-line illuminate the photosensitive polyimide layer, then developing the exposed polyimide layer to form an opening in the polyimide layer exposing the pad 64a, and then removing the polyimide residuals or other contaminants from the pad 64a with an O$_2$ plasma or a plasma containing fluorine of below 200 PPM and oxygen, and then curing the developed polyimide layer at a peak temperature of between 250 and 400° C. for a time of between 30 minutes and 4 hours in nitrogen ambient or in oxygen-free ambient, wherein the cured polyimide layer may have a thickness of between 3 and 25 μm, such that the polymer layer 66 can be patterned with an opening 66a in the polymer layer 66 exposing the patterned metal cap 56. Alternatively, the material of the polymer layer 66 may include polyimide (PI), benzocyclobutane (BCB), parylene, epoxy-based material, elastomer, photoepoxy SU-8, silicone, or a porous dielectric material. The polymer layer 66 may be a benzocyclobutane layer with a thickness of between 3 and 25 μm.

Alternatively, the polymer layer 66 may be formed by a laminating process or a screen-printing process. So far, a semiconductor wafer 20 is formed by the above-mentioned steps.

Figure 3P:
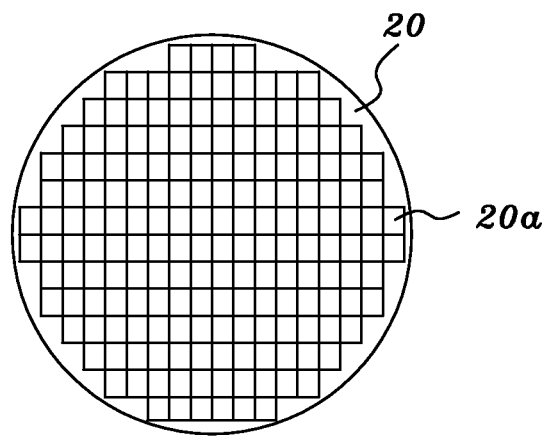
Figure 3Q:
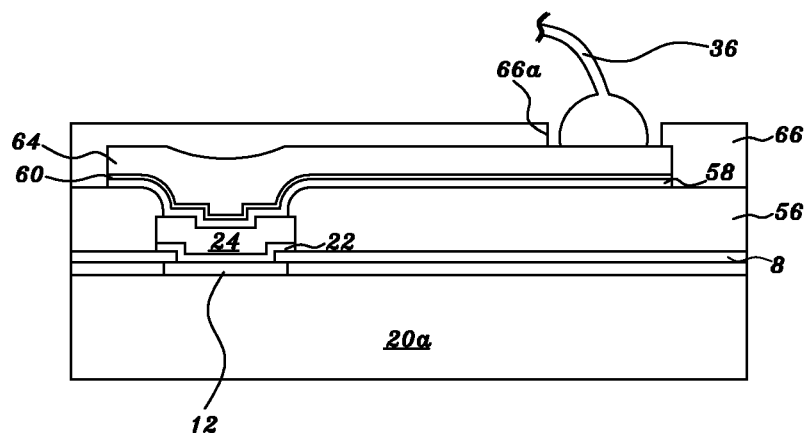

Next, referring to FIG. 3P and FIG. 3Q, the semiconductor wafer 20 can be diced into a plurality of individual semiconductor chips 20a. When one of the semiconductor chips 20a is being packaged, one end of a wire 36 made of gold can be ball bonded on the pad 64a of the semiconductor chip 20a by a wire-bonding process. The other end of the wire 36 can be wedge bonded on a pad of an external circuit. Therefore, the metal layer 64 of the semiconductor chip 20a may be used to be connected with an external circuit. The external circuit may be a ball-grid-array (BGA) substrate, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a silicon substrate.

Alternatively, a metal bump having a titanium-containing layer with a thickness of between 0.1 and 0.7 μm on the pad 52 exposed by the opening 66a, a copper layer with a thickness of between 1 and 10 μm on the titanium-containing layer, a nickel layer with a thickness of between 0.5 and 5 μm on the copper layer, and a tin-containing layer with a thickness of between 10 and 300 μm on the nickel layer may be formed on the pad 64a exposed by the opening 66a, followed by dicing the semiconductor wafer 20 into multiple semiconductor chips 20a. The semiconductor chip 20a may be bonded to a BGA substrate through the metal bump.

Alternatively, a metal bump having a titanium-containing layer with a thickness of between 0.1 and 0.7 μm on the pad 52 exposed by the opening 66a, and a gold layer with a thickness of between 5 and 25 μm on the titanium-containing layer may be formed on the pad 52 exposed by the opening 66a, followed by dicing the semiconductor wafer 20 into multiple semiconductor chips 20a. The metal bump may connect the semiconductor chip to a glass substrate via ACF or ACP. Besides, the metal bump may connect the semiconductor chip to a printed circuit board via tape automated bonding (TAB). Besides, the metal bump may connect the semiconductor chip to a flexible substrate without glass fiber.

Aspect 1 of Embodiment 3

Figure 4A:
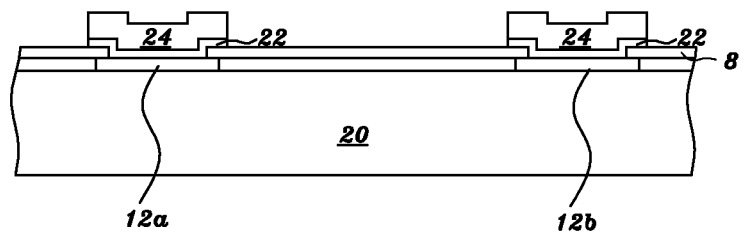
FIGS. 4A through 4I are sectional views showing a structure and process of a aspect of a embodiment of the present invention.

Referring to FIG. 4A, the semiconductor wafer 20 has two pads 12a and 12b, principally including electroplated copper, exposed by two openings in the passivation layer 8 and two patterned metal caps 24 respectively over the pads 12a and 12b. The step of forming the patterned metal caps 24 over the pads 12a and 12b can be referred as to the above description concerning FIGS. 2A-2D.

Figure 4B:
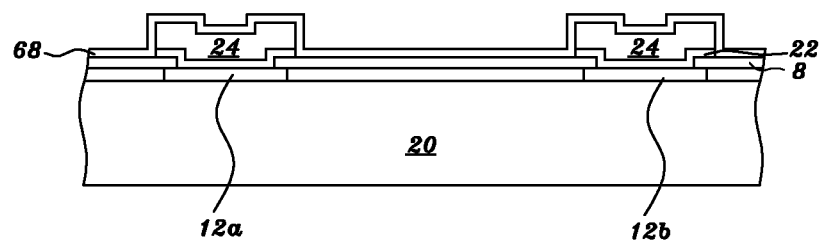

Referring to FIG. 4B, an adhesion/barrier layer 68 having a thickness of between 0.01 μm and 0.7 μm, is formed on the passivation layer 8 and on the metal cap 24. The material of the adhesion/barrier layer 68 may include titanium, titanium nitride, a titanium-tungsten alloy, a nickel-vanadium alloy, chromium, tantalum, tantalum nitride, or a composite of the abovementioned materials. The material of the adhesion/barrier layer 68 is a titanium-tungsten alloy in this Embodiment. The adhesion/barrier layer 68 may be formed by a sputtering method or a vapor deposition method.

Figure 4C:
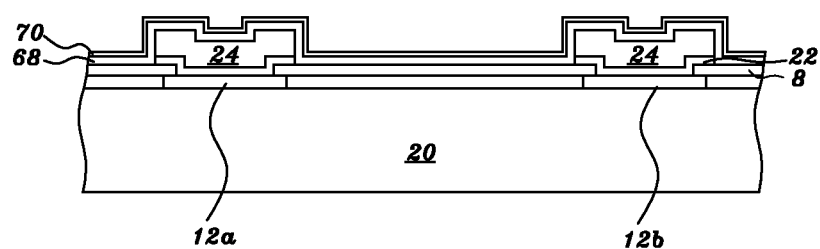

Referring to FIG. 4C, a seed layer 70 having a thickness of 0.005 μm and 2 μm, is formed on the adhesion/barrier layer 68. The seed layer 70 may be formed by a sputtering method, a vapor deposition method, an electroless plating method or a PVD (Physical Vapor Deposition) method. The seed layer 70 is beneficial to electroplating a metal layer thereon. Thus, the material of the seed layer 70 varies with the material of the electroplated metal layer formed on the seed layer 70. When a gold layer is to be electroplated on the seed layer 70, gold is a preferable material to the seed layer 70.

Figure 4D:
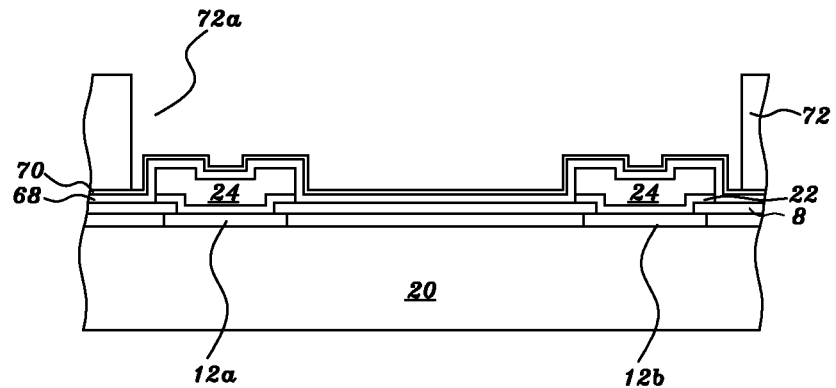

Referring to FIG. 4D, a photoresist layer 72 is formed on the seed layer 70. The photoresist layer 72 is patterned with the processes of exposure, development, etc., to form multiple openings 72a in the photoresist layer 72 exposing the seed layer 70.

The photoresist layer 72 can be formed by spin-on coating a positive-type photosensitive polymer layer having a thickness of between 5 and 30 μm, and preferably of between 7 and 15 μm, on the seed layer 70, then exposing the photosensitive polymer layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 70 with an $O_2$ plasma or a plasma containing fluorine of below 200 PPM and oxygen, such that the photoresist layer 72 can be patterned with multiple openings 72a in the photoresist layer 72 exposing the seed layer 70.

Figure 4E:
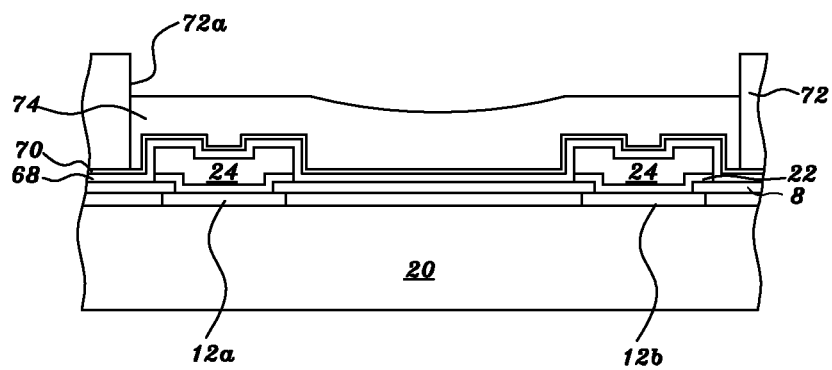

Referring to FIG. 4E, a metal layer 74 having a thickness of between 2 and 25 μm is electroplated on the seed layer 70 exposed by the opening 72a. The metal layer 74 is an interconnecting metal trace, connect with the metal caps 24 above the pad 12a and 12b. The metal layer 74 may be a single metal layer, such as a gold layer, a copper layer, a nickel layer, a palladium layer, a platinum layer. The metal layer 74 may be a composite metal layer, such as a copper/nickel/gold layer, a copper/gold layer, a copper/nickel/palladium layer, copper/nickel/platinum layer. The metal layer 74 is a gold layer having a thickness of between 2 and 4 μm in this embodiment.

Figure 4F:
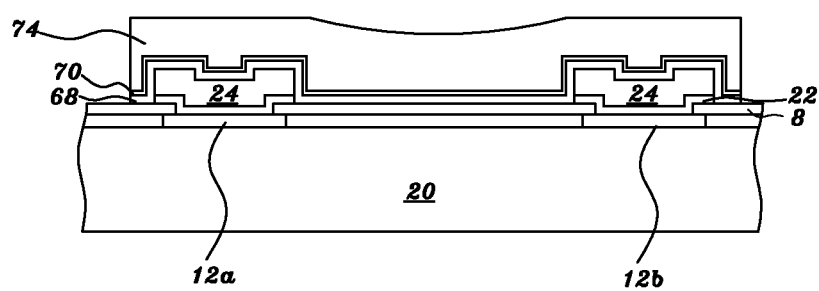

Referring to FIG. 4F, after the metal layer 74 is formed, most of the photoresist layer 72 can be removed using an organic solution with amide. However, some residuals from the photoresist layer 72 could remain on the metal layer 74 and on the seed layer 70. Thereafter, the residuals can be removed from the metal layer 74 and the seed layer 70 with a plasma, such as an $O_2$ plasma or a plasma containing fluorine of below 200 PPM and oxygen. Alternatively, the photoresist layer 72 can be removed using an $O_2$ plasma or using a plasma containing fluorine of below 200 PPM and oxygen, without using an organic solution.

Next, the seed layer 70 and the adhesion/barrier layer 68 not under the metal layer 74 are removed with a wet etching method. As to the wet etching methods, when the adhesion/barrier layer 68 is a titanium-tungsten alloy layer, it can be etched with a solution containing hydrogen peroxide; when the seed layer 70 is a gold layer, it can be etched with an iodine-containing solution. When the seed layer 70 is a gold layer, it can be etched with an iodine-containing solution, such as a solution containing potassium iodide; when the seed layer 70 is a copper layer, it can be etched with a solution containing ammonium hydroxide ($NH_4OH$).

The seed layer 70 and the adhesion/barrier layer 68 not under the metal layer 74 are removed with a dry etching method. Generally, the dry etching method to etch the seed layer 70 and the adhesion/barrier layer 68 not under the metal layer 74 may include a chemical plasma etching process, a sputtering etching process, such as an argon sputter process, $O_2$ plasma, or a chemical vapor etching process.

Figure 4G:
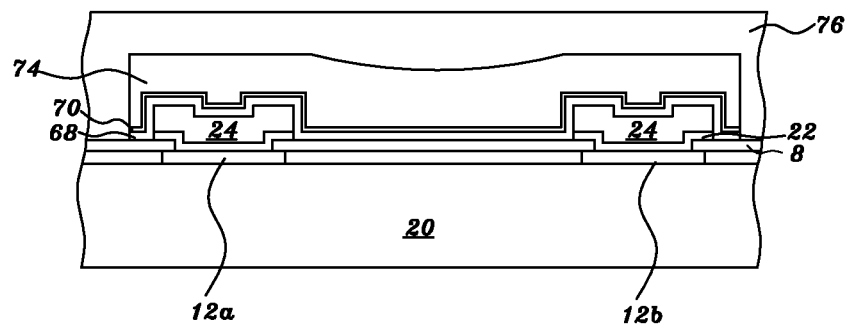
Figure 4H:
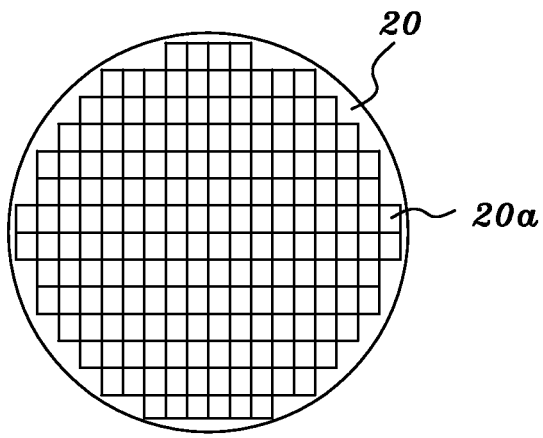

Referring to FIG. 4G, a polymer layer 76 is formed on the passivation layer 8 and metal layer 74 via spin coating process. Next, the polymer layer 76 is patterned with the processes of baking. Then, the developed polymer layer 76 is cured at a peak temperature of between 150 and 300° C., between 290 and 330° C. or between 330 and 400° C. for a time of between 30 minutes and 2 hours in nitrogen ambient or in oxygen-free ambient. The material of the polymer layer 76 may include polyimide (PI), benzocyclobutane (BCB), polyurethane, epoxy resin, a parylene-based polymer, a solder-mask material, an elastomer, or a porous dielectric material. The cured polymer layer 76 has a thickness of between 3 and 25 μm. For example, the polymer layer 76 may be a polyimide layer with a thickness of between 3 and 25 μm.

Referring to FIG. 4H-4T, After the above-mentioned processes of forming the polymer layer 76, the semiconductor wafer 20 can be diced into a plurality of individual semiconductor chips 20a.

Aspect 2 of Embodiment 3

Figure 4I:
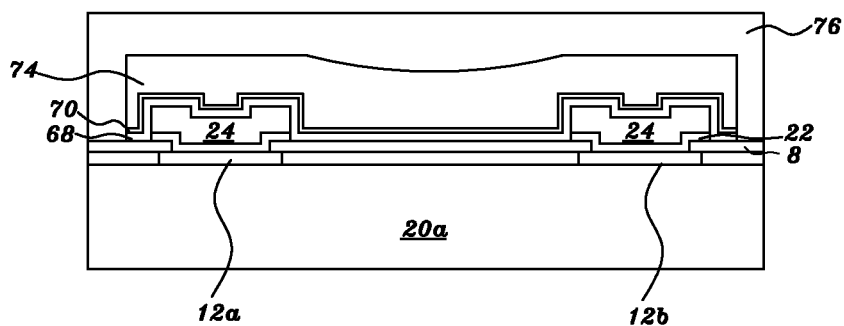
Figure 4J:
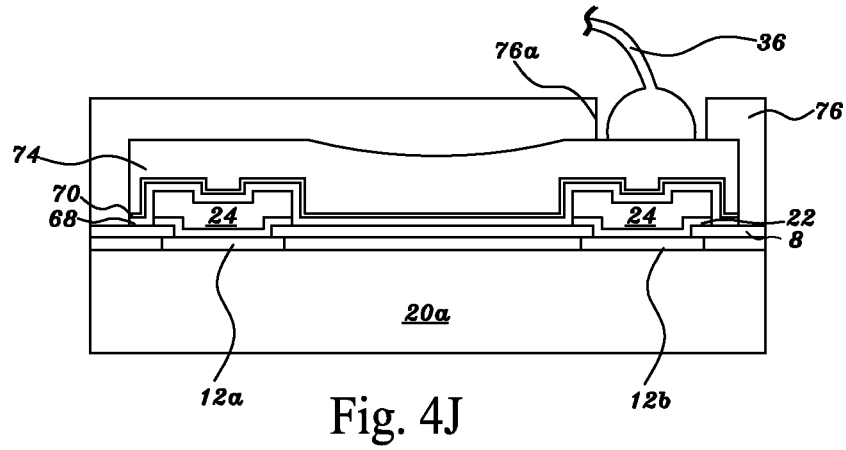
FIG. 4J is sectional views showing a structure and process of a aspect of a embodiment of the present invention.

Referring to FIG. 4J, the structure and process of the aspect 2 and aspect 1 likeness, The difference is an opening 76a being formed in the polymer layer 76 exposing the metal layer 74 with the processes of exposure, development, etc., to form the opening 76a. A 1× stepper or a 1× contact aligner can be used to expose the polymer layer 76 during the process of exposure. Then, the developed polymer layer 76 is cured at a peak temperature of between 150 and 300° C., between 290 and 330° C. or between 330 and 400° C. for a time of between 30 minutes and 2 hours in nitrogen ambient or in oxygen-free ambient.

After the above-mentioned processes of forming the polymer layer 76, the semiconductor wafer 20 can be diced into a plurality of individual semiconductor chips 20a.

Via a wire-bonding process connect to external circuit, one end of a wire 36 (made of gold, copper or aluminum) can be bonded with the metal layer 74 exposed by the opening 76a of the semiconductor chip 20a. The external circuit may be a ball-grid-array (BGA) substrate, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a silicon substrate.

Aspect 3 of Embodiment 3

Figure 4K:
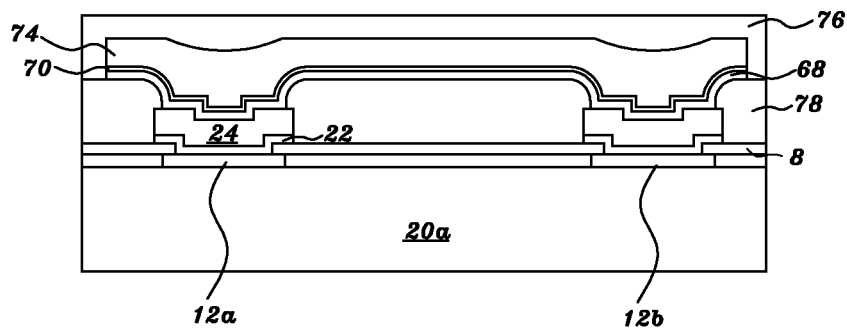
FIG. 4K is sectional views showing a structure and process of a aspect of a embodiment of the present invention.

Referring to FIG. 4K, the structure and process of the aspect 3 and aspect 1 likeness, The difference is a polymer layer 78 between the metal layer 74 and the passivation layer 8

The polymer layer 78 having a thickness of between 3 and 25 μm is formed on the passivation 8 and metal caps 24. Next, the polymer layer 78 is patterned with the processes of baking, exposure, development, etc., to form multiple openings 78a in the polymer layer 78 exposing metal caps 24. A 1× stepper or a 1× contact aligner can be used to expose the polymer layer 78 during the process of exposure. Then, the developed polymer layer 78 is cured at a peak temperature of between 150 and 300° C. for a time of between 30 minutes and 2 hours in nitrogen ambient or in oxygen-free ambient. The material of the polymer layer 78 may include polyimide (PI), benzocyclobutane (BCB), polyurethane, epoxy resin, a parylene-based polymer, a solder-mask material, an elastomer, or a porous dielectric material.

The manufacturing process continued as FIG. 4B go to FIG. 4I. Sputtering the adhesion/barrier layer 68 on the metal layer 78 and metal cap 24, next sputtering the seed layer 70 on adhesion/barrier layer 68 next forming the photoresist layer 72 on the seed layer 70, and electroplating the metal layer 74 on the seed layer 70 exposed by the opening 72a. Next removed the photoresist layer 72, the seed layer 70 and the adhesion/barrier layer 68 not under the metal layer 74 are removed. The polymer layer 78 having a thickness of between 3 and 25 μm is formed on the polymer layer 76 and metal layer 74. The semiconductor wafer 20 can be diced into a plurality of individual semiconductor chips 20a. These Manufacturing process please make reference to FIG. 4B-FIG. 4I, the repeated part doesn't explain again.

Aspect 4 of Embodiment 3

Figure 4L:
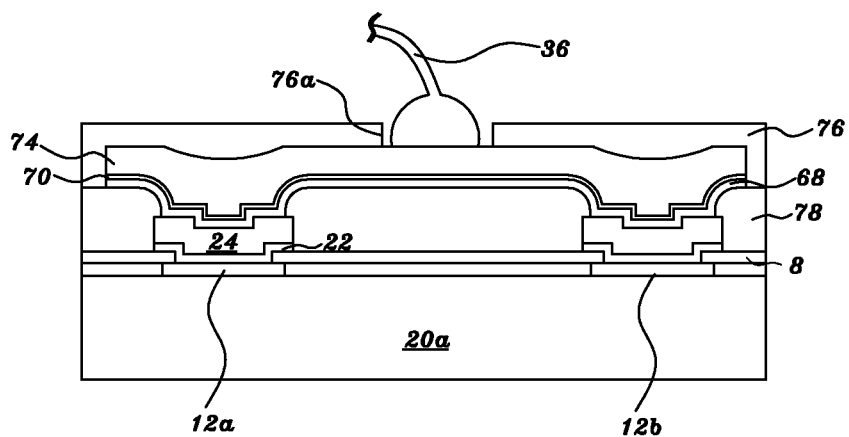
FIG. 4L is sectional views showing a structure and process of a aspect of a embodiment of the present invention.

Referring to FIG. 4L, the structure and process of the aspect 4 and aspect 3 likeness. The difference is an opening 76a being formed in the polymer layer 76 exposing the metal layer 74. Via a wire-bonding process connect to external circuit, one end of a wire 36 (made of gold, copper or aluminum) can be bonded with the metal layer 74 exposed by the opening 76a of the semiconductor chip 20a. The external circuit may be a ball-grid-array (BGA) substrate, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a silicon substrate.

Aspect 5 of Embodiment 3

Figure 4M:
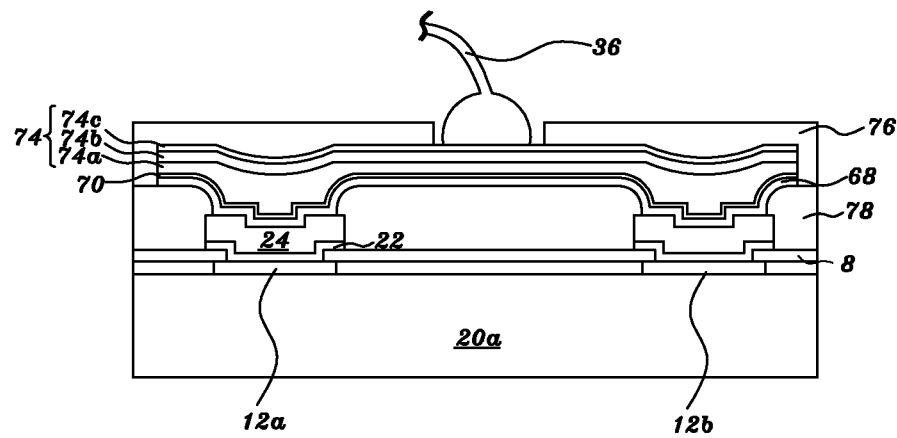
FIGS. 4M through 4N are sectional views showing a structure and process of a aspect of a embodiment of the present invention.

Referring to FIG. 4M, the structure and process of the aspect 5 and aspect 4 likeness. The metal layer 74 is a composite layer. The metal layer 74 comprise a copper layer 74a on the seed layer 70, a nickel layer 74b on the copper layer 74a, a gold layer 74c on the nickel layer 74b.

The copper layer 74a, the nickel layer 74b and the gold layer 74c may be formed by an electroplating method. The copper layer 74a having a thickness of between 2 and 15 μm. The nickel layer 74b having a thickness of between 2 and 5 μm. The gold layer 74c having a thickness of between 0.5 and 5 μm.

Figure 4N:
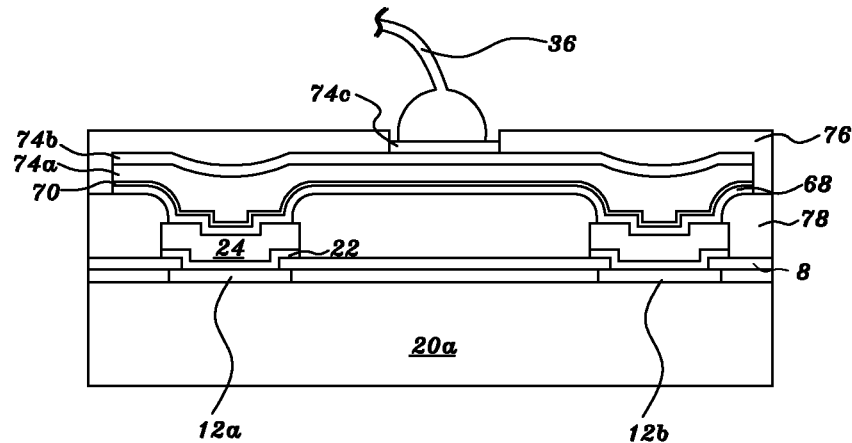

Referring to FIG. 4N, in addition, the metal layer 74 comprise a copper layer 74a on the seed layer 70, a nickel layer 74b on the copper layer 74a. The copper layer 74a and the nickel layer 74b are formed by an electroplating method. After the polymer layer 76 are formed on metal layer 74 and polymer layer 78. Via a electroless plating process forming the gold layer 74c on the nickel layer 74b exposed by the opening 78a of the polymer layer 78. The gold layer 74c having a thickness of between 0.5 and 5 μm. Via a wirebonding process connect to external circuit, one end of a wire 36 (made of gold, copper or aluminum) can be bonded with the gold layer 74c. In addition, before the electroless plating process, a acidity liquid have to clear the oxidize layer of nickel layer 74b surface, the acidity liquid such as sulfuric acid or hydrochloric acid.

Aspect 6 of Embodiment 3

Figure 4O:
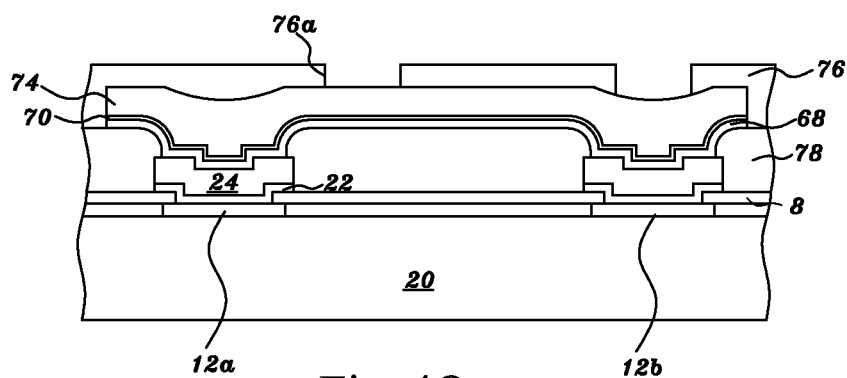
FIGS. 4O through 4W are sectional views showing a structure and process of a aspect of a embodiment of the present invention.

Referring to FIG. 4O, after the step shown in FIG. 4K is completed. The polymer layer 76 can be formed on the polymer layer 78 and on the metal layer 74. The polymer layer 76 is patterned with the processes of exposure, development, etc., to form multiple openings 78a in the polymer layer 76 exposing the metal layer 74. A 1× stepper or a 1× contact aligner can be used to expose the polymer layer 76 during the process of exposure. Then, the developed polymer layer 76 is cured at a peak temperature of between 150 and 300° C., between 290 and 330° C. or between 330 and 400° C. for a time of between 30 minutes and 2 hours in nitrogen ambient or in oxygen-free ambient.

Figure 4P:
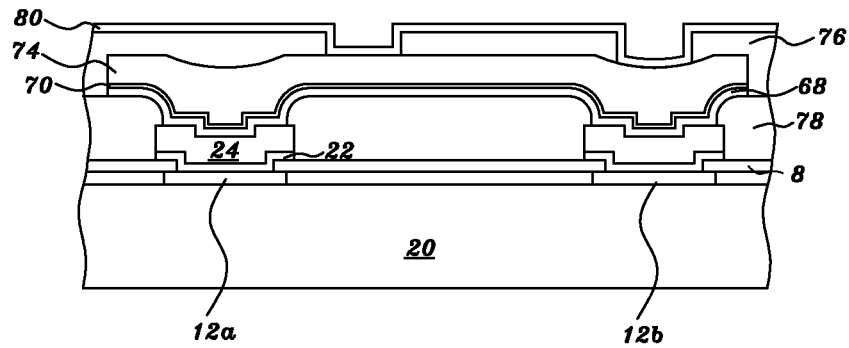
Figure 4Q:
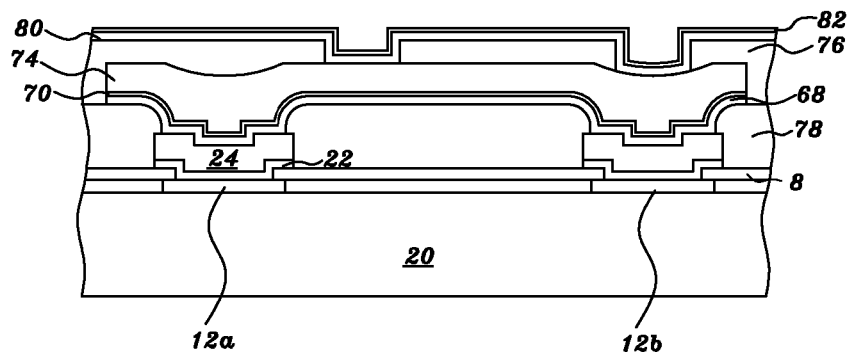

Referring to FIG. 4P, an adhesion/barrier layer 80 having a thickness of between 0.01 μm and 0.7 μm, is formed on the polymer layer 76 and on the metal layer 74. The material of the adhesion/barrier layer 80 may include titanium, titanium nitride, a titanium-tungsten alloy, a nickel-vanadium alloy, chromium, tantalum, tantalum nitride, or a composite of the abovementioned materials. The material of the adhesion/barrier layer 80 is a titanium-tungsten alloy in this Embodiment. The adhesion/barrier layer 80 may be formed by a sputtering method or a vapor deposition method.

Next, a seed layer 82 having a thickness of 0.005 μm and 2 μm, is formed on the adhesion/barrier layer 80. The seed layer 82 may be formed by a sputtering method, a vapor deposition method, an electroless plating method or a PVD (Physical Vapor Deposition) method. The seed layer 82 is beneficial to electroplating a metal layer thereon. Thus, the material of the seed layer 82 varies with the material of the electroplated metal layer formed on the seed layer 82. When a gold layer is to be electroplated on the seed layer 82, gold is a preferable material to the seed layer 82.

Figure 4R:
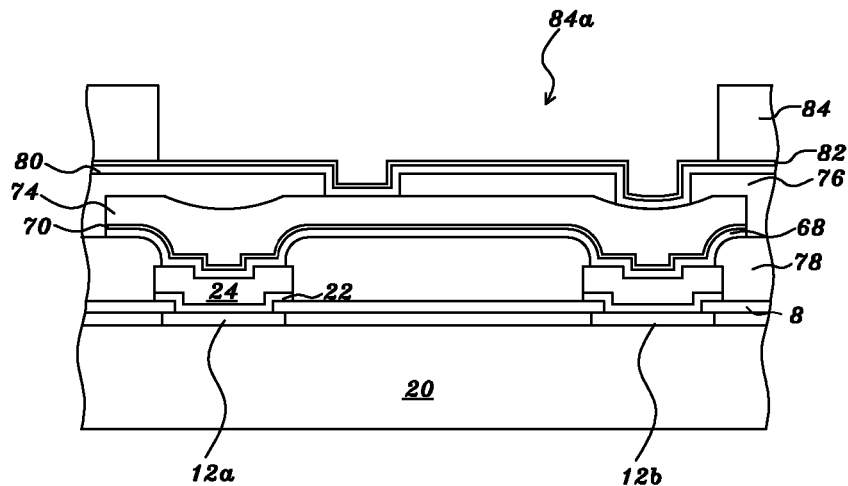

Referring to FIG. 4R, a photoresist layer 84 is formed on the seed layer 82. The photoresist layer 84 is patterned with the processes of exposure, development, etc., to form multiple openings 84a in the photoresist layer 84 exposing the seed layer 82.

The photoresist layer 84 can be formed by spin-on coating a positive-type photosensitive polymer layer having a thickness of between 5 and 30 μm, and preferably of between 7 and 15 μm, on the seed layer 82, then exposing the photosensitive polymer layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 82 with an $O_2$ plasma or a plasma containing fluorine of below 200 PPM and oxygen, such that the photoresist layer 84 can be patterned with multiple openings 84a in the photoresist layer 84 exposing the seed layer 82.

Figure 4S:
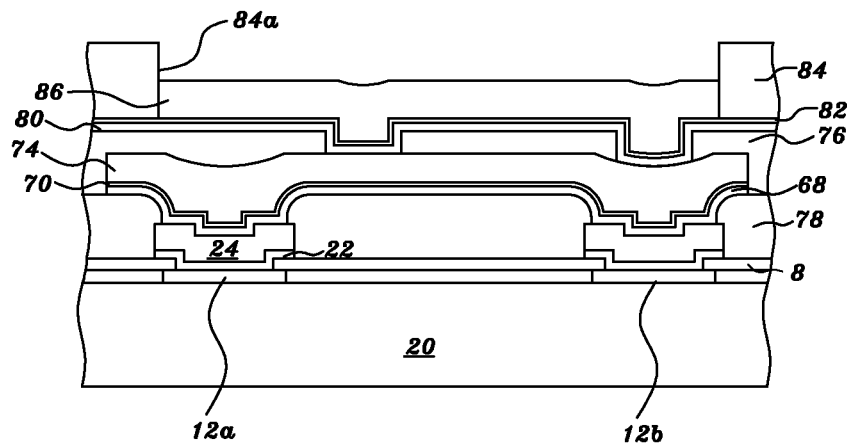

Referring to FIG. 4S, a metal layer 86 having a thickness of between 2 and 25 μm is electroplated on the seed layer 82 exposed by the opening 84a. The metal layer 86 may be a single metal layer, such as a gold layer, a copper layer, a nickel layer, a palladium layer, a platinum layer. The metal layer 86 may be a composite metal layer, such as a copper/nickel/gold layer, a copper/gold layer, a copper/nickel/palladium layer, copper/nickel/platinum layer. The metal layer 86 is a gold layer in this embodiment.

Figure 4T:
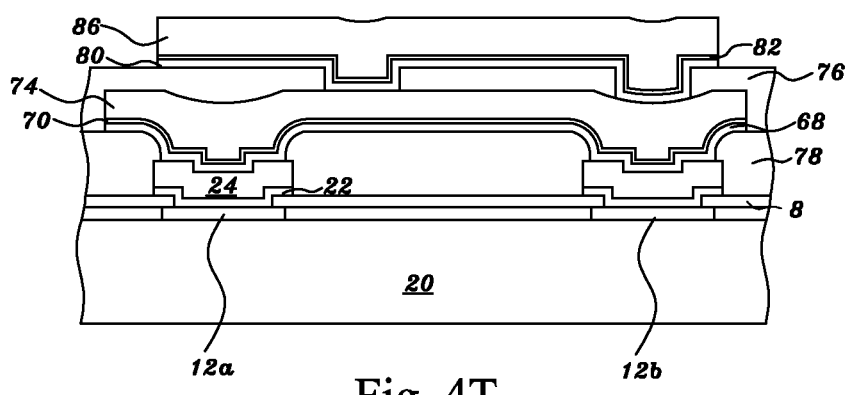

Referring to FIG. 4T, after the metal layer 86 is formed, most of the photoresist layer 84 can be removed using an organic solution with amide. However, some residuals from the photoresist layer 84 could remain on the metal layer 86 and on the seed layer 82. Thereafter, the residuals can be removed from the metal layer 86 and the seed layer 82 with a plasma, such as an $O_2$ plasma or a plasma containing fluorine of below 200 PPM and oxygen. Alternatively, the photoresist layer 84 can be removed using an $O_2$ plasma or using a plasma containing fluorine of below 200 PPM and oxygen, without using an organic solution.

Next, the seed layer 86 and the adhesion/barrier layer 80 not under the metal layer 86 are removed with a wet etching method. As to the wet etching methods, when the adhesion/barrier layer 80 is a titanium-tungsten alloy layer, it can be etched with a solution containing hydrogen peroxide; when the seed layer 86 is a gold layer, it can be etched with an iodine-containing solution. When the seed layer 86 is a gold layer, it can be etched with an iodine-containing solution, such as a solution containing potassium iodide; when the seed layer 86 is a copper layer, it can be etched with a solution containing ammonium hydroxide ($NH_4OH$).

The seed layer 86 and the adhesion/barrier layer 80 not under the metal layer 86 are removed with a dry etching method. Generally, the dry etching method to etch the seed layer 82 and the adhesion/barrier layer 80 not under the metal layer 86 may include a chemical plasma etching process, a sputtering etching process, such as an argon sputter process, $O_2$ plasma, or a chemical vapor etching process.

Figure 4U:
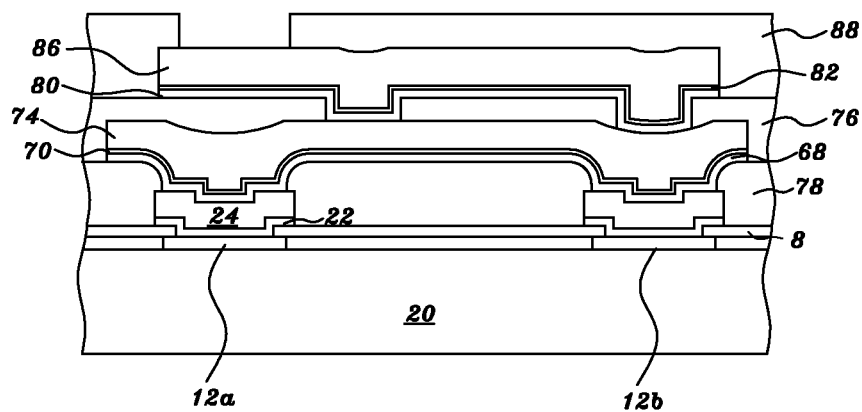

Referring to FIG. 4U, a polymer layer 88 is formed on the polymer layer 76 and metal layer 86 via spin coating process. Next, the polymer layer 88 is patterned with the processes of baking, exposure, development, etc., to form multiple openings 88a in the polymer layer 88 exposing metal layer 86. A 1× stepper or a 1× contact aligner can be used to expose the polymer layer 88 during the process of exposure. Then, the developed polymer layer 88 is cured at a peak temperature of between 150 and 300° C., between 290 and 330° C. or between 330 and 400° C. for a time of between 30 minutes and 2 hours in nitrogen ambient or in oxygen-free ambient. The material of the polymer layer 88 may include polyimide (PI), benzocyclobutane (BCB), polyurethane, epoxy resin, a parylene-based polymer, a solder-mask material, an elastomer, or a porous dielectric material. The cured polymer layer 88 has a thickness of between 3 and 25 μm. For example, the polymer layer 88 may be a polyimide layer with a thickness of between 3 and 25 μm.

Figure 4V:
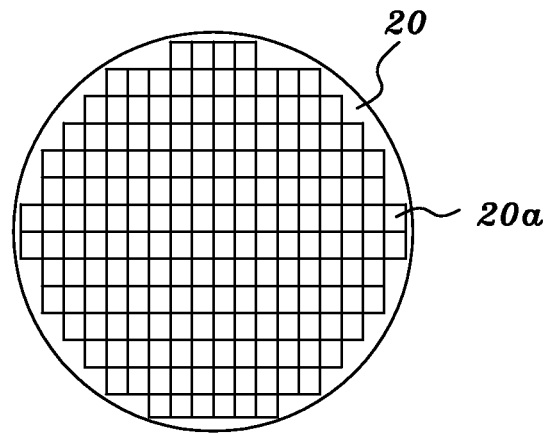
Figure 4W:
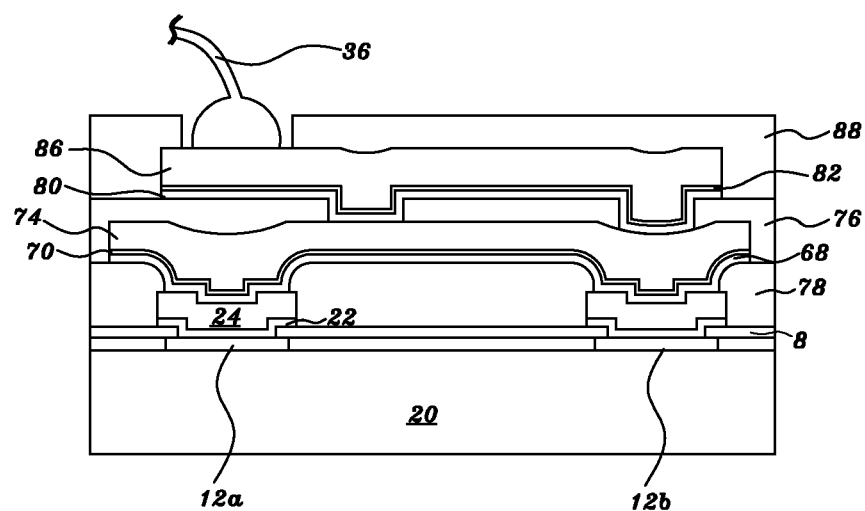

Referring to FIG. 4V-4W, After the above-mentioned processes of forming the polymer layer 88, the semiconductor wafer 20 can be diced into a plurality of individual semiconductor chips 20a. Via a wire-bonding process connect to external circuit, one end of a wire 36 (made of gold, copper or aluminum) can be bonded with the metal layer 86 exposed by the opening 88a of the semiconductor chip 20a. The external circuit may be a ball-grid-array (BGA) substrate, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a silicon substrate.

Aspect 1 of Embodiment 4

Figure 5A:
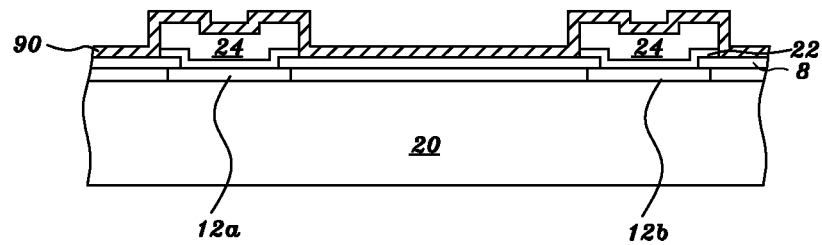
FIGS. 5A through 5D are sectional views showing a structure and process of a aspect of a embodiment of the present invention.
Figure 5B:
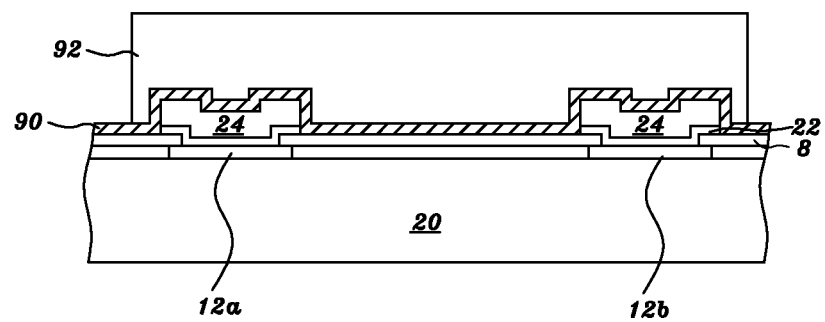

Referring to FIG. 5A, after the step shown in FIG. 4A is completed. A resistor layer 90 having a thickness of between 0.05 μm and 0.1 μm, is formed on the passivation layer 8 and on the metal cap 24. The material of the resistor layer 90 may include Cr—Ni alloy. The resistor layer 90 may be formed by a sputtering method or a vapor deposition method.

Referring to FIG. 5A, a photoresist layer 92 is formed on the resistor layer 90. The photoresist layer 92 is patterned with the processes of exposure, development, etc., to form multiple openings 92a in the photoresist layer 92 exposing the resistor layer 90.

Figure 5C:
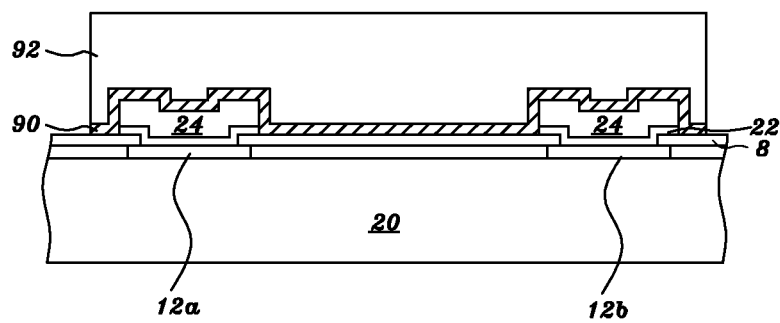

Referring to FIG. 5C, the resistor layer 90 not under the photoresist layer 92 are removed with a dry etching method. Generally, the dry etching method to etch the resistor layer 90 not under the photoresist layer 92 may include a chemical plasma etching process, a sputtering etching process, such as an argon sputter process, $O_2$ plasma, or a chemical vapor etching process. After the dry etching step is completed, the resistor layer 90 is formed on metal caps 24 above pad 12a and pad 12b.

Figure 5D:
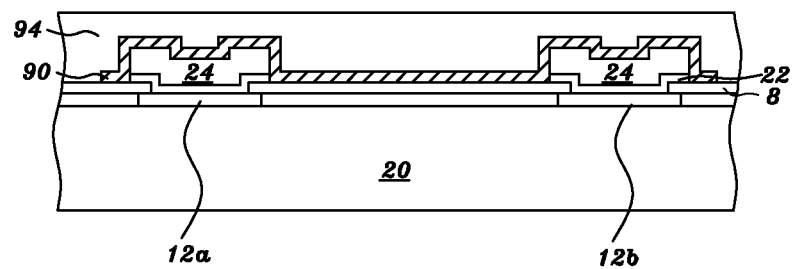

Referring to FIG. 5D, next removed the photoresist layer 92. A polymer layer 94 is formed on the passivation layer 8 and resistor layer 90 via spin coating process. Next, the polymer layer 94 is patterned with the processes of baking. Then, the developed polymer layer 94 is cured at a peak temperature of between 150 and 300° C., between 290 and 330° C. or between 330 and 400° C. for a time of between 30 minutes and 2 hours in nitrogen ambient or in oxygen-free ambient. The material of the polymer layer 94 may include polyimide (PI), benzocyclobutane (BCB), polyurethane, epoxy resin, a parylene-based polymer, a solder-mask material, an elastomer, or a porous dielectric material. The cured polymer layer 94 has a thickness of between 3 and 25 μm. For example, the polymer layer 94 may be a polyimide layer with a thickness of between 3 and 25 μm.

Aspect 2 of Embodiment 4

Figure 5E:
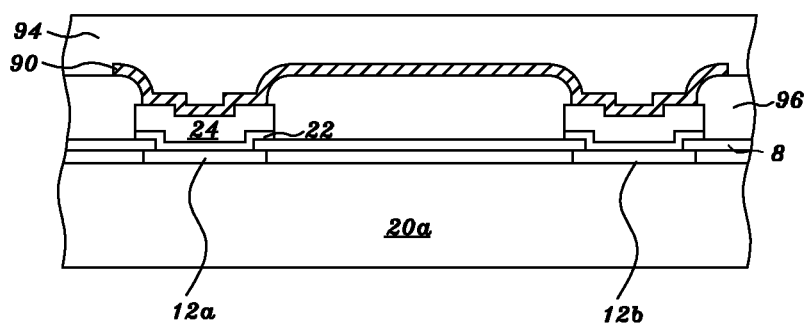
FIG. 5E is sectional views showing a structure and process of a aspect of a embodiment of the present invention.

Referring to FIG. 5E, the structure and process of the aspect 2 and aspect 1 likeness. The difference is a polymer layer 96 between the resistor layer 90 and the passivation layer 8. The process of the polymer layer 96 refer to FIG. 3I. After the step shown in FIG. 3I is completed. The process of the resistor layer 90 is formed on polymer layer 96 refer to FIG. 5A-5D, the repeated part doesn't explain again.

Aspect 1 of Embodiment 5

Figure 6A:
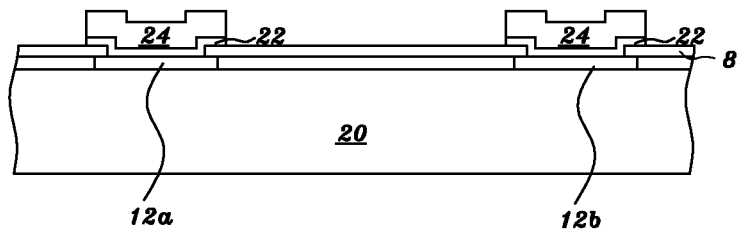
FIGS. 6A through 6L are sectional views showing a structure and process of a aspect of a embodiment of the present invention.
Figure 6B:
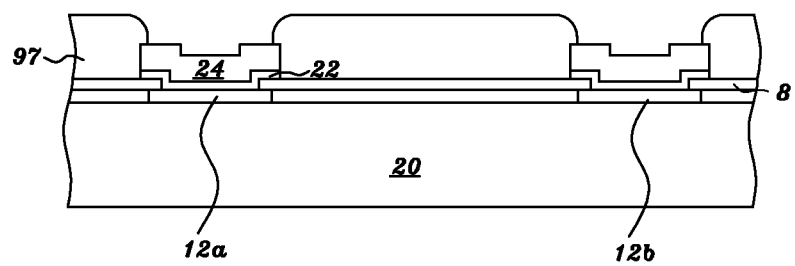

Referring to FIG. 6A, after the step shown in FIG. 4A is completed. Referring to FIG. 6B, a polymer layer 97 is patterned with the processes of exposure, development, etc., to form at least one opening 97a in the polymer layer 97 exposing the metal cap 24. A 1× stepper or a 1× contact aligner can be used to expose the polymer layer 97 during the process of exposure. Then, the developed polymer layer 97 is cured at a peak temperature of between 150 and 300° C., between 290 and 330° C. or between 330 and 400° C. for a time of between 30 minutes and 2 hours in nitrogen ambient or in oxygen-free ambient.

Figure 6C:
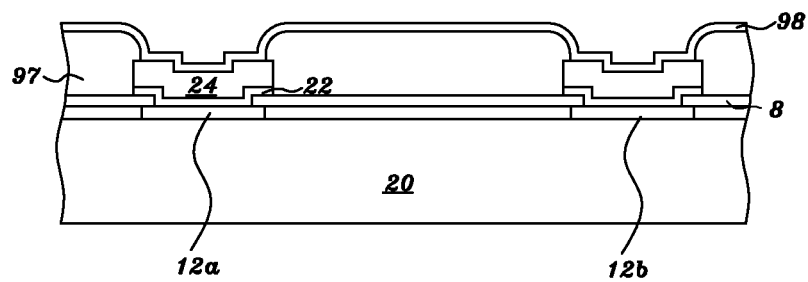

Referring to FIG. 6C, an adhesion/barrier layer 98 having a thickness of between 0.01 μm and 0.7 μm, is formed on the polymer layer 97 and on the metal caps 24. The material of the adhesion/barrier layer 98 may include titanium, titanium nitride, a titanium-tungsten alloy, a nickel-vanadium alloy, chromium, tantalum, tantalum nitride, or a composite of the abovementioned materials. The material of the adhesion/barrier layer 98 is a titanium-tungsten alloy in this Embodiment. The adhesion/barrier layer 98 may be formed by a sputtering method or a vapor deposition method.

Figure 6D:
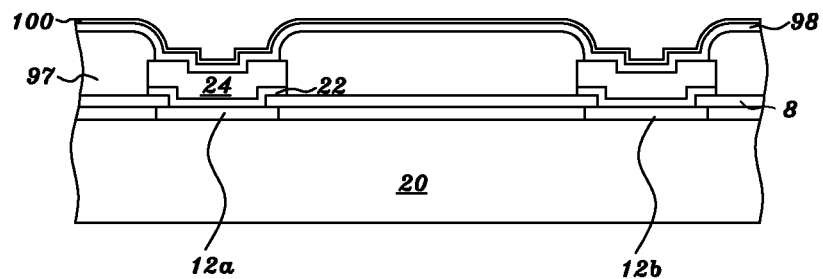

Referring to FIG. 6D, a seed layer 100 having a thickness of 0.005 μm and 2 μm, is formed on the adhesion/barrier layer 98. The seed layer 100 may be formed by a sputtering method, a vapor deposition method, an electroless plating method or a PVD (Physical Vapor Deposition) method. The seed layer 100 is beneficial to electroplating a metal layer thereon. Thus, the material of the seed layer 100 varies with the material of the electroplated metal layer formed on the seed layer 100. When a copper layer is to be electroplated on the seed layer 100, copper is a preferable material to the seed layer 100.

Figure 6E:
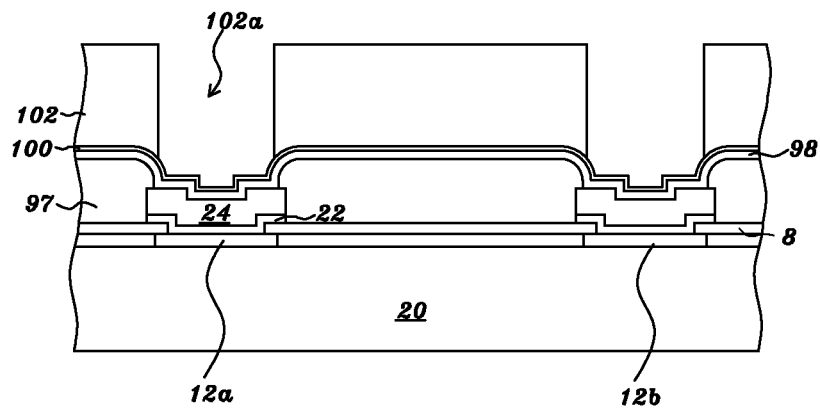

Referring to FIG. 6E, a photoresist layer 102 is formed on the seed layer 100. The photoresist layer 102 is patterned with the processes of exposure, development, etc., to form multiple openings 102a in the photoresist layer 102 exposing the seed layer 100.

The photoresist layer 102 can be formed by spin-on coating a positive-type photosensitive polymer layer having a thickness of between 5 and 30 μm, and preferably of between 7 and 15 μm, on the seed layer 100, then exposing the photosensitive polymer layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 100 with an $O_2$ plasma or a plasma containing fluorine of below 200 PPM and oxygen, such that the photoresist layer 102 can be patterned with multiple openings 102a in the photoresist layer 72 exposing the seed layer 100.

Figure 6F:
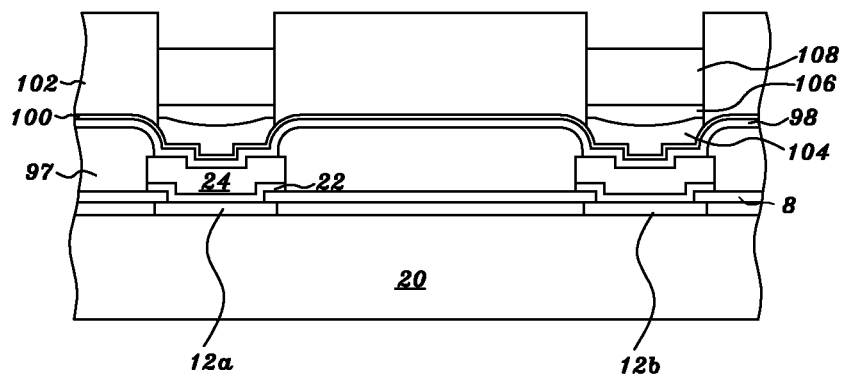

Referring to FIG. 6F, a copper layer 104 having a thickness of between 2 μm and 25 μm is electroplated on the seed layer 100 exposed by the opening 102a. A nickel layer 106 having a thickness of between 2 μm and 25 μm is electroplated on the copper layer 104. A nickel layer 106 having a thickness of between 2 μm and 25 μm is electroplated on the copper layer 104. A tin-containing layer 108 having a thickness of between 30 μm and 350 μm is electroplated on the copper layer 104. The material of the tin-containing layer 108 may include Sn—Pb alloy, Sn—Ag alloy or Sn—Ag—Cu alloy.

Figure 6G:
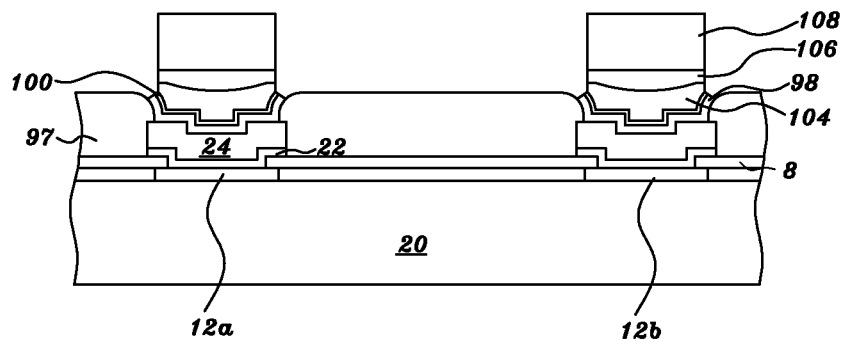

Referring to FIG. 6G, after the tin-containing layer 108 is formed, most of the photoresist layer 102 can be removed using an organic solution with amide. However, some residuals from the photoresist layer 102 could remain on the tin-containing layer 108 and on the seed layer 100. Thereafter, the residuals can be removed from the tin-containing layer 108 and the seed layer 100 with a plasma, such as an $O_2$ plasma or a plasma containing fluorine of below 200 PPM and oxygen. Alternatively, the photoresist layer 102 can be removed using an $O_2$ plasma or using a plasma containing fluorine of below 200 PPM and oxygen, without using an organic solution.

Next, the seed layer 100 and the adhesion/barrier layer 98 not under the tin-containing layer 108 are removed with a wet etching method. As to the wet etching methods, when the adhesion/barrier layer 98 is a titanium-tungsten alloy layer, it can be etched with a solution containing hydrogen peroxide; when the seed layer 100 is a copper layer, it can be etched with a solution containing ammonium hydroxide ($NH_4OH$).

The seed layer 100 and the adhesion/barrier layer 98 not under the tin-containing layer 108 are removed with a dry etching method. Generally, the dry etching method to etch the seed layer 100 and the adhesion/barrier layer 98 not under the tin-containing layer 108 may include a chemical plasma etching process, a sputtering etching process, such as an argon sputter process, $O_2$ plasma, or a chemical vapor etching process.

Figure 6H:
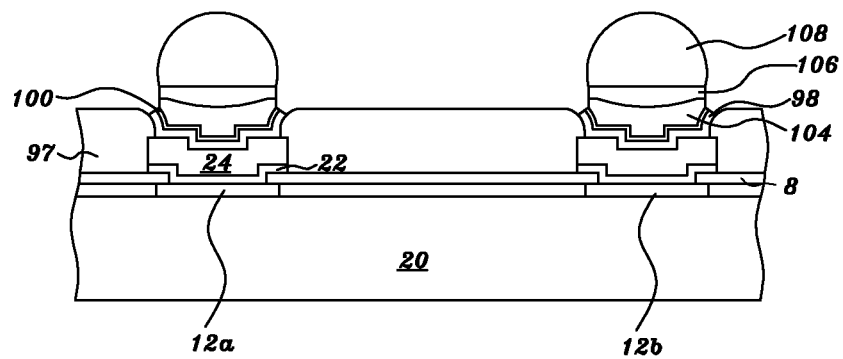

Referring to FIG. 6H, a reflow process is performed to lead the tin-containing layer 108 to be formed like a global shape.

Figure 6I:
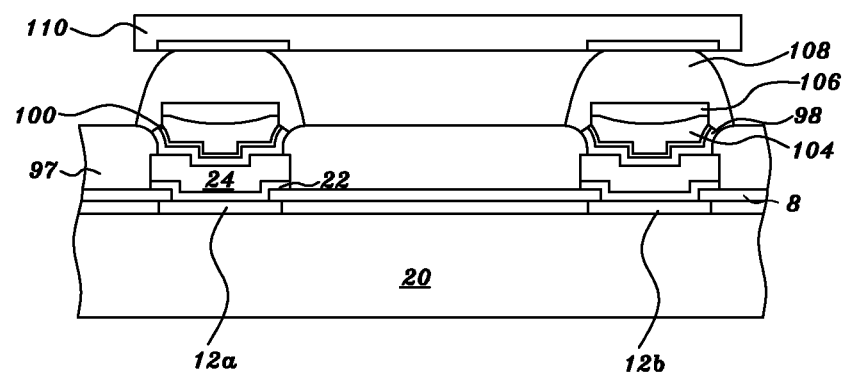

Referring to FIG. 6I, a passive device 110 join to the tin-containing layer 108, the passive device 110 comprises inductor, capacitor, or integrated passive device. The passive device 110 includes multiple contact points (not shown), a tin-containing layer or a gold layer on the top surface of contact points.

The SPEC of the passive device 110 cen be selected from SPEC1210, SPEC0603, SPEC0402 and SPEC0201. SPEC0201 means that the passive device 110 has the size of 0.02 inch*0.01 inch. SPEC1210 means that the passive device 110 has the size of 0.12 inch*0.10 inch. SPEC0603 means that the passive device 110 has the size of 0.06 inch*0.03 inch. SPEC0402 means that the passive device 1 has the size of 0.04 inch*0.02 inch. Typically, the external devices 310 and 320 have a length of between 5 mm and 0.2 mm, a width of between 4 mm and 0.1 mm, and a height of between 2 mm and 0.01 mm.

Figure 6J:
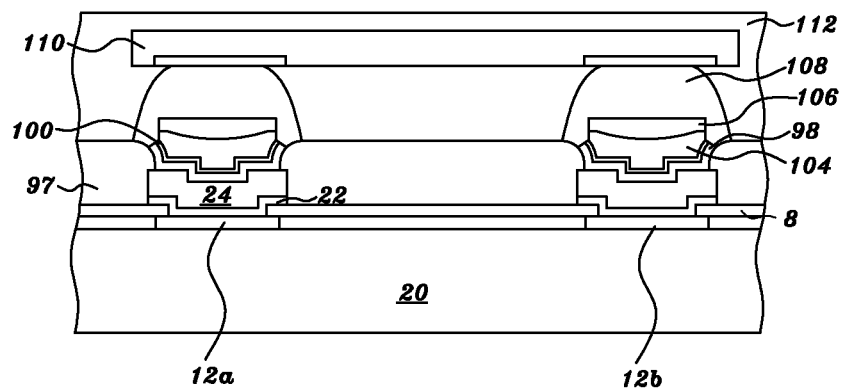

Referring to FIG. 6J, a polymer layer 112 is formed on the polymer layer 97 and the passive device 110 via spin coating process. Next, the polymer layer 112 is patterned with the processes of baking. Then, the developed polymer layer 112 is cured at a peak temperature of between 150 and 300° C., between 290 and 330° C. or between 330 and 400° C. for a time of between 30 minutes and 2 hours in nitrogen ambient or in oxygen-free ambient. The material of the polymer layer 112 may include polyimide (PI), benzocyclobutane (BCB), polyurethane, epoxy resin, a parylene-based polymer, a solder-mask material, an elastomer, or a porous dielectric material. The cured polymer layer 112 has a thickness of between 3 and 25 μm. For example, the polymer layer 112 may be a polyimide layer with a thickness of between 3 and 25 μm.

Figure 6K:
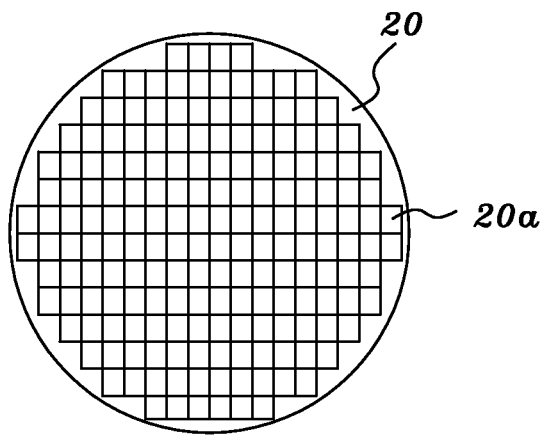
Figure 6L:
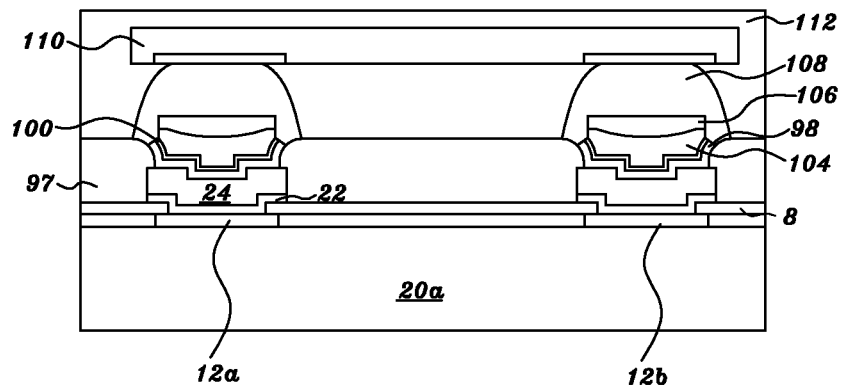

Referring to FIG. 6K-6L, After the above-mentioned processes of forming the polymer layer 112, the semiconductor wafer 20 can be diced into a plurality of individual semiconductor chips 20a.

Aspect 2 of Embodiment 5

Figure 6M:
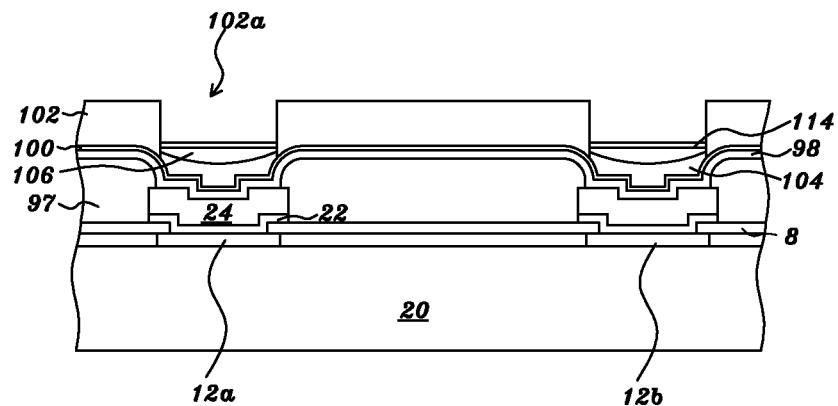
FIGS. 6M through 6P are sectional views showing a structure and process of a aspect of a embodiment of the present invention.

Referring to FIG. 6M, after the step shown in FIG. 6E is completed. A copper layer 104 having a thickness of between 2 μm and 25 μm is electroplated on the seed layer 100 exposed by the opening 102a. A nickel layer 106 having a thickness of between 2 μm and 25 μm is electroplated on the copper layer 104. A nickel layer 106 having a thickness of between 2 μm and 25 μm is electroplated on the copper layer 104. A gold layer 114 having a thickness of between 0.5 μm and 10 μm is electroplated on the gold layer 114.

Figure 6N:
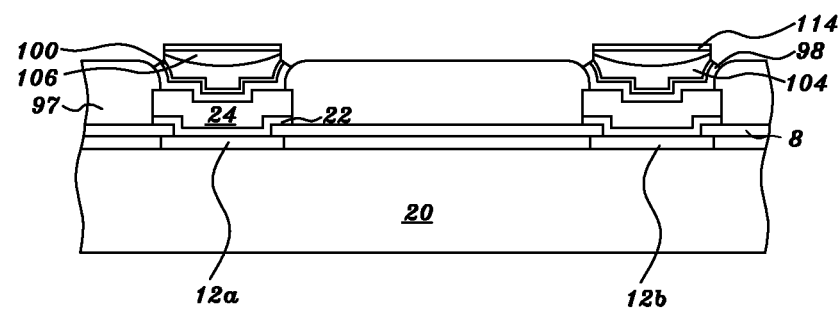

Referring to FIG. 6N, after the gold layer 114 is formed, most of the photoresist layer 102 can be removed using an organic solution with amide. However, some residuals from the photoresist layer 102 could remain on the gold layer 114 and on the seed layer 100. Thereafter, the residuals can be removed from the gold layer 114 and the seed layer 100 with a plasma, such as an $O_2$ plasma or a plasma containing fluorine of below 200 PPM and oxygen. Alternatively, the photoresist layer 102 can be removed using an $O_2$ plasma or using a plasma containing fluorine of below 200 PPM and oxygen, without using an organic solution.

Next, the seed layer 100 and the adhesion/barrier layer 98 not under the gold layer 114 are removed with a wet etching method. As to the wet etching methods, when the adhesion/barrier layer 98 is a titanium-tungsten alloy layer, it can be etched with a solution containing hydrogen peroxide; when the seed layer 100 is a copper layer, it can be etched with a solution containing ammonium hydroxide ($NH_4OH$).

The seed layer 100 and the adhesion/barrier layer 98 not under the gold layer 114 are removed with a dry etching method. Generally, the dry etching method to etch the seed layer 100 and the adhesion/barrier layer 98 not under the gold layer 114 may include a chemical plasma etching process, a sputtering etching process, such as an argon sputter process, $O_2$ plasma, or a chemical vapor etching process.

Figure 6O:
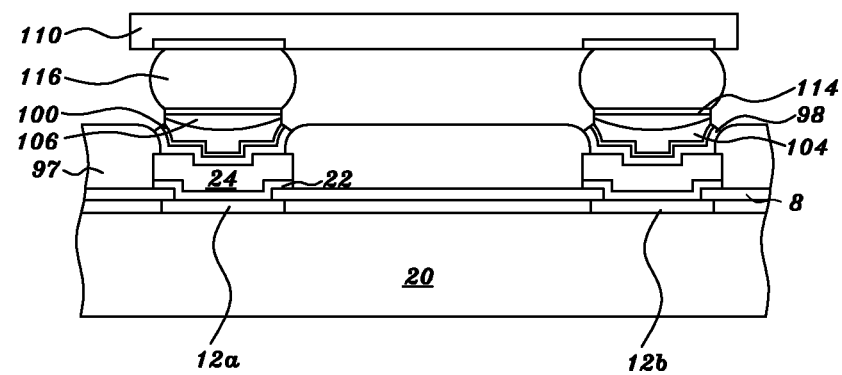

Referring to FIG. 6O, a passive device 110 join to the gold layer 114, the passive device 110 comprises a tin-containing layer 116 of contact point, via gold layer 114 join to tin-containing layer 116 formed the tin-gold alloy. The passive device 110 comprises inductor, capacitor, or integrated passive device.

Figure 6P:
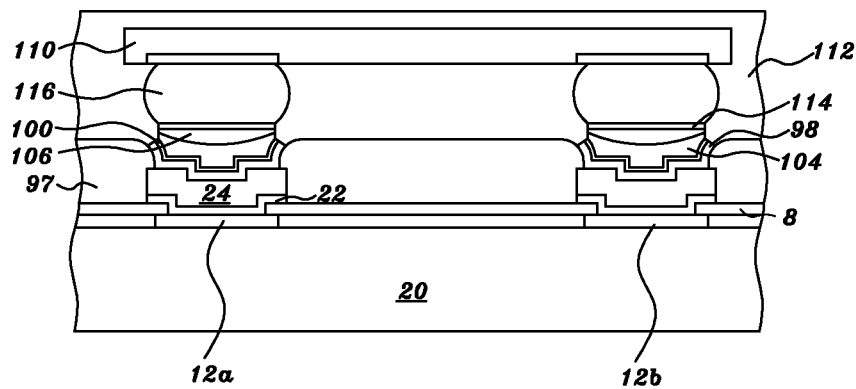

Referring to FIG. 6P, a polymer layer 112 is formed on the polymer layer 97 and the passive device 110 via spin coating process. Next, the polymer layer 112 is patterned with the processes of baking. Then, the developed polymer layer 112 is cured at a peak temperature of between 150 and 300° C., between 290 and 330° C. or between 330 and 400° C. for a time of between 30 minutes and 2 hours in nitrogen ambient or in oxygen-free ambient. The material of the polymer layer 112 may include polyimide (PI), benzocyclobutane (BCB), polyurethane, epoxy resin, a parylene-based polymer, a solder-mask material, an elastomer, or a porous dielectric material. The cured polymer layer 112 has a thickness of between 3 and 25 μm. For example, the polymer layer 112 may be a polyimide layer with a thickness of between 3 and 25 μm.

Figure 6Q:
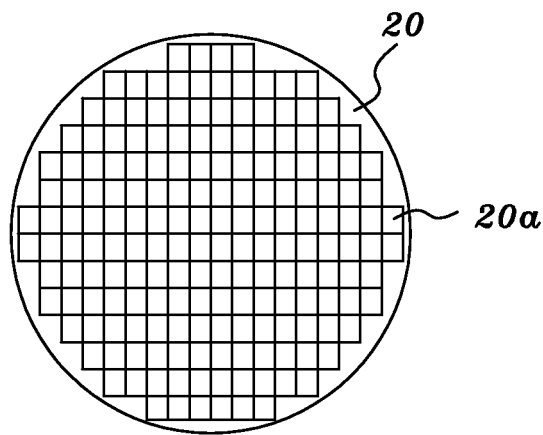
FIG. 6Q is a plan view showing a structure and process of an aspect of an embodiment of the present invention.
Figure 6R:
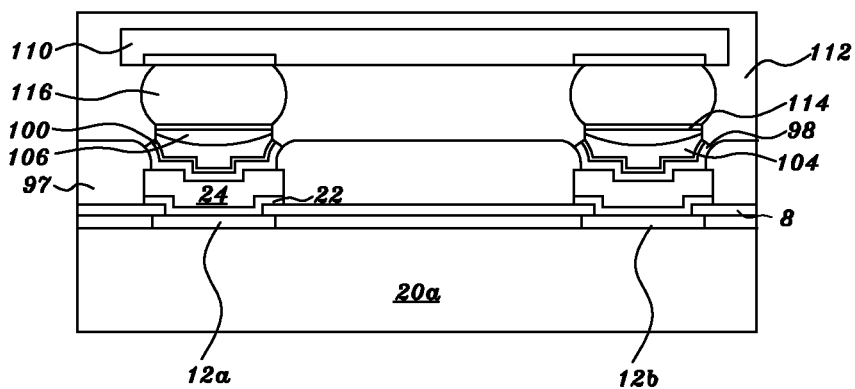
FIG. 6R is a sectional view showing a structure and process of an aspect of an embodiment of the present invention.

Referring to FIG. 6Q-6R, After the above-mentioned processes of forming the polymer layer 112, the semiconductor wafer 20 can be diced into a plurality of individual semiconductor chips 20a.

Embodiment 6

Figure 7A:
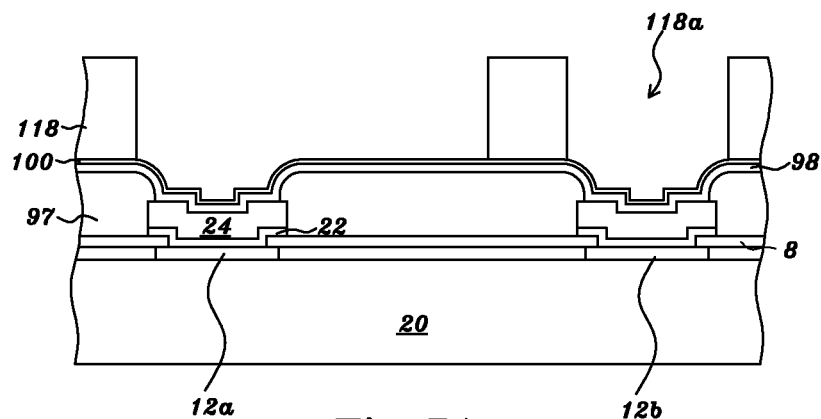
FIGS. 7A through 7N are sectional views showing a structure and process of a aspect of a embodiment of the present invention.

Referring to FIG. 7A, after the step shown in FIG. 6D is completed. The photoresist layer 118 is formed on the seed layer 100. The photoresist layer 118 is patterned with the processes of exposure, development, etc., to form multiple openings 118a in the photoresist layer 118 exposing the seed layer 100.

The photoresist layer 118 can be formed by spin-on coating a positive-type photosensitive polymer layer having a thickness of between 5 and 30 μm, and preferably of between 7 and 15 μm, on the seed layer 70, then exposing the photosensitive polymer layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 100 with an $O_2$ plasma or a plasma containing fluorine of below 200 PPM and oxygen, such that the photoresist layer 118 can be patterned with multiple openings 118a in the photoresist layer 118 exposing the seed layer 100.

Figure 7B:
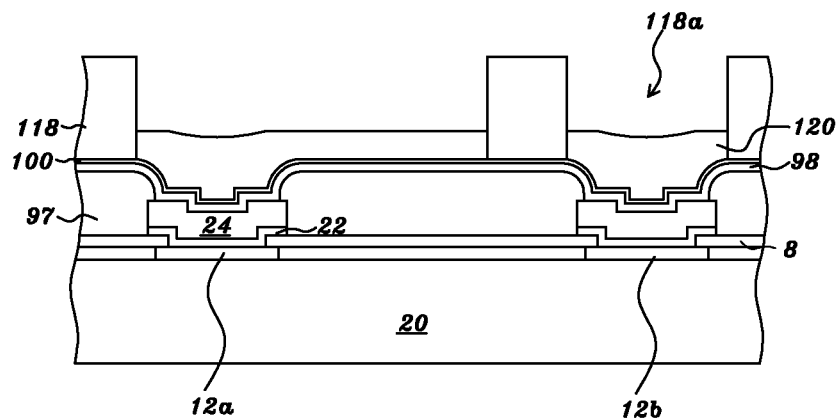

Referring to FIG. 7B, a metal layer 120 having a thickness of between 2 and 25 μm is electroplated on the seed layer 100 exposed by the opening 118a. The metal layer 120 may be a single metal layer, such as a gold layer, a copper layer, a nickel layer, a palladium layer, a platinum layer. The metal layer 120 may be a composite metal layer, such as a copper/nickel/gold layer, a copper/gold layer, a copper/nickel/palladium layer, copper/nickel/platinum layer. The metal layer 120 is a gold layer with a thickness of between 2 μm and 4 μm in this embodiment.

Figure 7C:
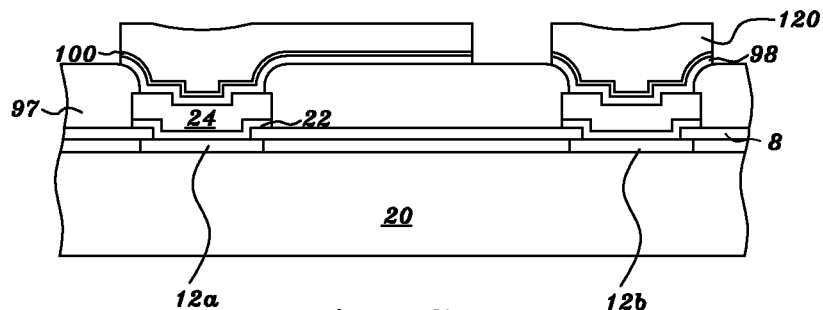

Referring to FIG. 7C, after the metal layer 120 is formed, most of the photoresist layer 118 can be removed using an organic solution with amide. However, some residuals from the photoresist layer 118 could remain on the metal layer 120 and on the seed layer 100. Thereafter, the residuals can be removed from the metal layer 120 and the seed layer 100 with a plasma, such as an $O_2$ plasma or a plasma containing fluorine of below 200 PPM and oxygen. Alternatively, the photoresist layer 118 can be removed using an $O_2$ plasma or using a plasma containing fluorine of below 200 PPM and oxygen, without using an organic solution.

Next, the seed layer 100 and the adhesion/barrier layer 98 not under the metal layer 120 are removed with a wet etching method. As to the wet etching methods, when the adhesion/barrier layer 98 is a titanium-tungsten alloy layer, it can be etched with a solution containing hydrogen peroxide; when the seed layer 100 is a gold layer, it can be etched with an iodine-containing solution. When the seed layer 100 is a gold layer, it can be etched with an iodine-containing solution, such as a solution containing potassium iodide; when the seed layer 100 is a copper layer, it can be etched with a solution containing ammonium hydroxide ($NH_4OH$).

The seed layer 100 and the adhesion/barrier layer 98 not under the metal layer 120 are removed with a dry etching method. Generally, the dry etching method to etch the seed layer 100 and the adhesion/barrier layer 98 not under the metal layer 120 may include a chemical plasma etching process, a sputtering etching process, such as an argon sputter process, $O_2$ plasma, or a chemical vapor etching process.

Figure 7D:
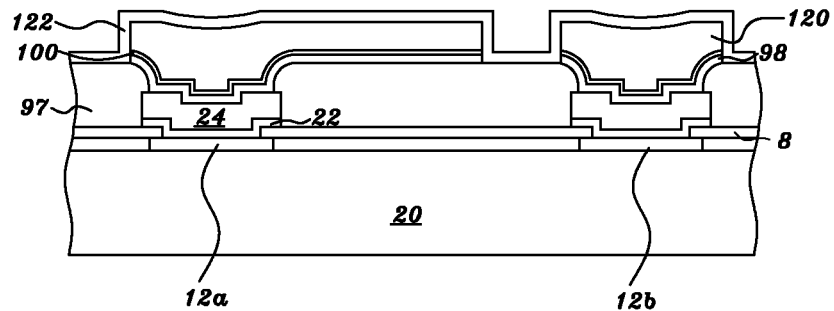

Referring to FIG. 7D, an capacitor dielectric layer 122 having a thickness of between 0.02 μm and 1 μm, is formed on the metal layer 120 and polymer layer 97. The material of the capacitor dielectric layer 122 may include $SiO_2$, $SiO_xN_y$, $Si_xN_y$, $Si_xN_y$, $Ta_2O_5$, $Al_2O_3$ or high-K materials. The material of the capacitor dielectric layer 122 is a silicon oxide ($SiO_2$) in this Embodiment. The capacitor dielectric layer 122 may be formed by a evaporation method or a chemical vapor deposition method.

Figure 7E:
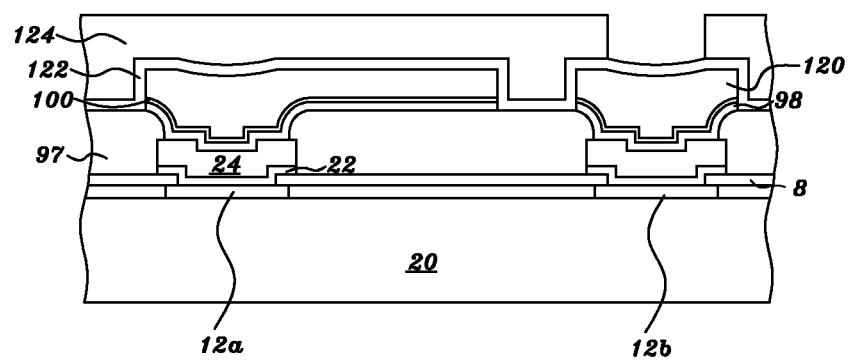

Referring to FIG. 7E, a photoresist layer 124 is formed on the capacitor dielectric layer 122. The photoresist layer 124 is patterned with the processes of exposure, development, etc., to form multiple openings 124a in the photoresist layer 124 exposing the capacitor dielectric layer 122.

Figure 7F:
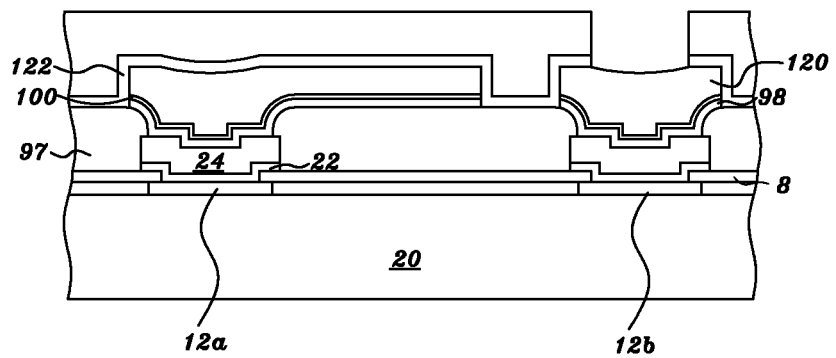

Referring to FIG. 7F, The capacitor dielectric layer 122 exposed by the opening 124a is removed with a dry etching method. Generally, the dry etching method to etch the capacitor dielectric layer 122 may include a chemical plasma etching process, a sputtering etching process, such as an argon sputter process, $O_2$ plasma, or a chemical vapor etching process. After the dry etching step, the capacitor dielectric layer 122 is patterned to form multiple openings in the capacitor dielectric layer 122 exposing the metal layer 120.

Figure 7G:
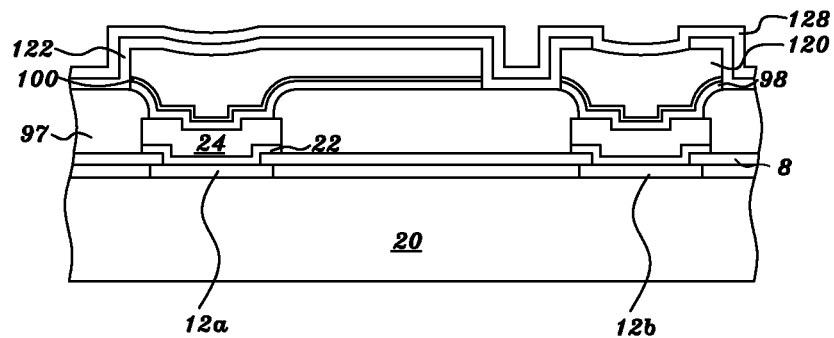

Referring to FIG. 7G, after the dry etching step, most of the photoresist layer 124 can be removed using an organic solution with amide. However, some residuals from the photoresist layer 124 could remain on the capacitor dielectric layer 122. Thereafter, the residuals can be removed from the capacitor dielectric layer 122 with a plasma, such as an $O_2$ plasma or a plasma containing fluorine of below 200 PPM and oxygen. Alternatively, the photoresist layer 124 can be removed using an $O_2$ plasma or using a plasma containing fluorine of below 200 PPM and oxygen, without using an organic solution.

an adhesion/barrier layer 128 having a thickness of between 0.01 μm and 0.7 μm, is formed on the capacitor dielectric layer 122 and on the metal layer 120. The material of the adhesion/barrier layer 128 may include titanium, titanium nitride, a titanium-tungsten alloy, a nickel-vanadium alloy, chromium, tantalum, tantalum nitride, or a composite of the abovementioned materials. The material of the adhesion/barrier layer 128 is a titanium-tungsten alloy in this Embodiment. The adhesion/barrier layer 128 may be formed by a sputtering method or a vapor deposition method.

Figure 7H:
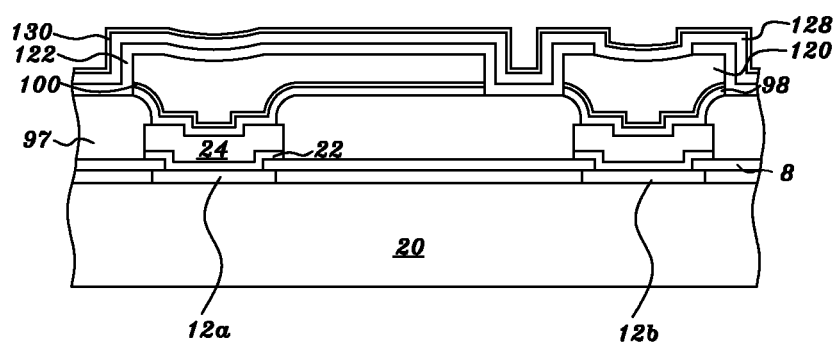

Referring to FIG. 7H, a seed layer 130 having a thickness of 0.005 μm and 2 μm, is formed on the adhesion/barrier layer 128. The seed layer 130 may be formed by a sputtering method, a vapor deposition method, an electroless plating method or a PVD (Physical Vapor Deposition) method. The seed layer 130 is beneficial to electroplating a metal layer thereon. Thus, the material of the seed layer 130 varies with the material of the electroplated metal layer formed on the seed layer 130. When a gold layer is to be electroplated on the seed layer 130, gold is a preferable material to the seed layer 130.

Figure 7I:
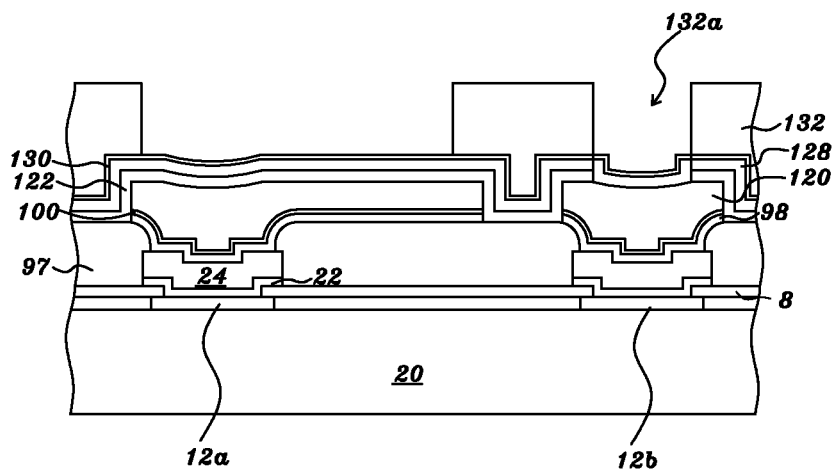

Referring to FIG. 7I, a photoresist layer 132 is formed on the seed layer 130. The photoresist layer 132 is patterned with the processes of exposure, development, etc., to form multiple openings 132a in the photoresist layer 132 exposing the seed layer 130.

The photoresist layer 132 can be formed by spin-on coating a positive-type photosensitive polymer layer having a thickness of between 5 and 30 μm, and preferably of between 7 and 15 μm, on the seed layer 130, then exposing the photosensitive polymer layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 130 with an $O_2$ plasma or a plasma containing fluorine of below 200 PPM and oxygen, such that the photoresist layer 132 can be patterned with multiple openings 132a in the photoresist layer 132 exposing the seed layer 130.

Figure 7J:
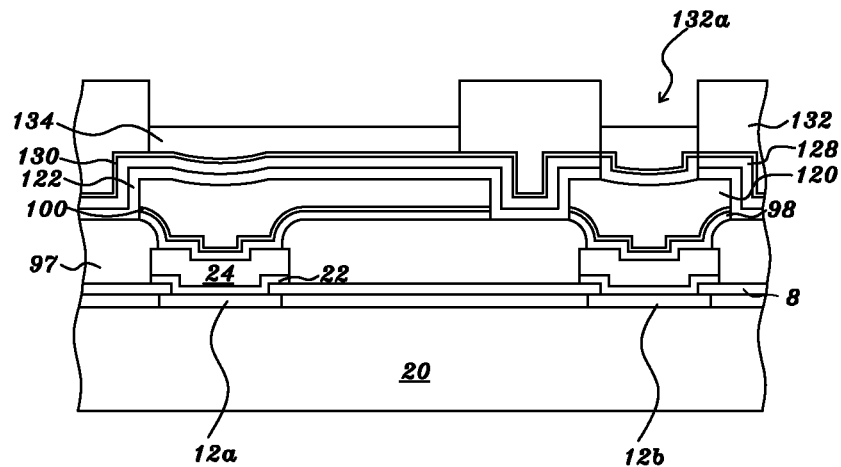

Referring to FIG. 7J, a metal layer 134 having a thickness of between 2 μm and 25 μm is electroplated on the seed layer 130 exposed by the opening 132a. The metal layer 134 may be a single metal layer, such as a gold layer, a copper layer, a nickel layer, a palladium layer, a platinum layer. The metal layer 134 may be a composite metal layer, such as a copper/nickel/gold layer, a copper/gold layer, a copper/nickel/palladium layer, copper/nickel/platinum layer. The metal layer 134 is a gold layer in this embodiment with a thickness of between 2 μm and 4 μm.

Figure 7K:
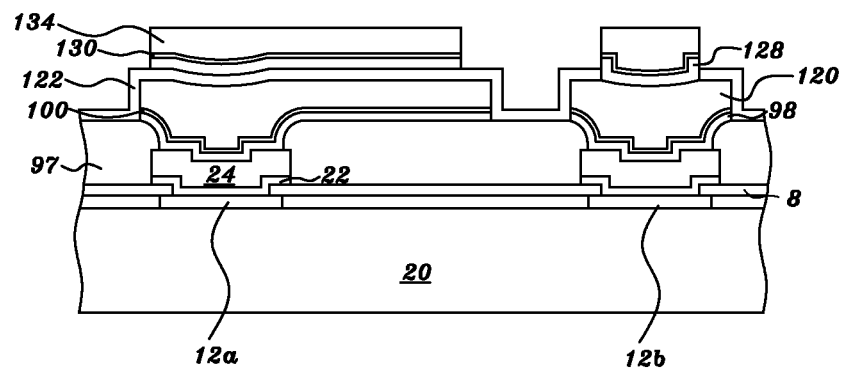

Referring to FIG. 7K, after the metal layer 134 is formed, most of the photoresist layer 132 can be removed using an organic solution with amide. However, some residuals from the photoresist layer 132 could remain on the metal layer 134 and on the seed layer 130. Thereafter, the residuals can be removed from the metal layer 134 and the seed layer 130 with a plasma, such as an $O_2$ plasma or a plasma containing fluorine of below 200 PPM and oxygen. Alternatively, the photoresist layer 132 can be removed using an $O_2$ plasma or using a plasma containing fluorine of below 200 PPM and oxygen, without using an organic solution.

Next, the seed layer 130 and the adhesion/barrier layer 128 not under the metal layer 134 are removed with a wet etching method. As to the wet etching methods, when the adhesion/barrier layer 128 is a titanium-tungsten alloy layer, it can be etched with a solution containing hydrogen peroxide; when the seed layer 130 is a gold layer, it can be etched with an iodine-containing solution. When the seed layer 130 is a gold layer, it can be etched with an iodine-containing solution, such as a solution containing potassium iodide; when the seed layer 130 is a copper layer, it can be etched with a solution containing ammonium hydroxide ($NH_4OH$).

The seed layer 130 and the adhesion/barrier layer 128 not under the metal layer 134 are removed with a dry etching method. Generally, the dry etching method to etch the seed layer 130 and the adhesion/barrier layer 128 not under the metal layer 134 may include a chemical plasma etching process, a sputtering etching process, such as an argon sputter process, $O_2$ plasma, or a chemical vapor etching process.

Figure 7L:
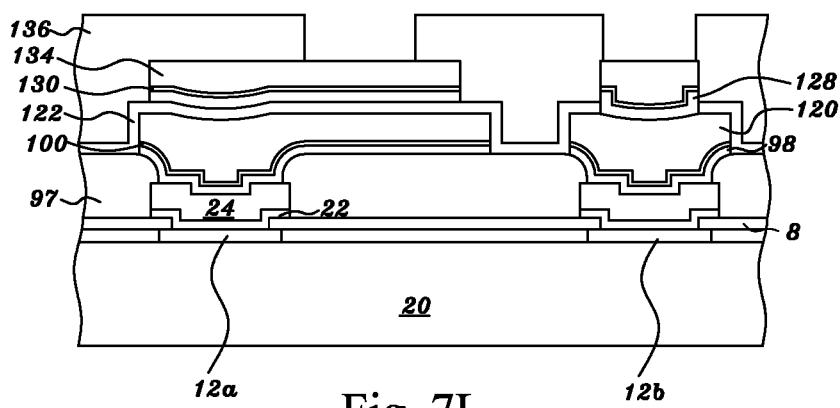
Figure 7M:
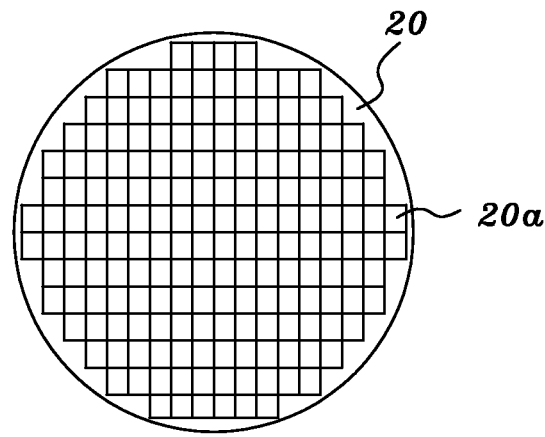
Figure 7N:
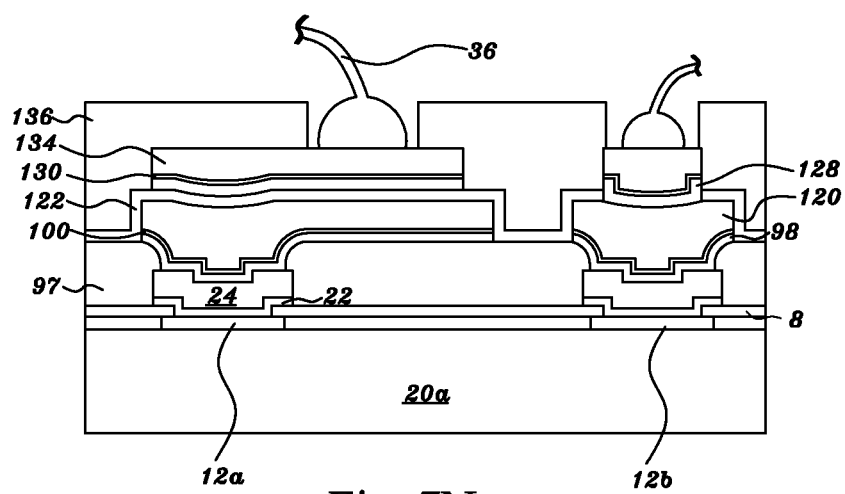

Referring to FIG. 7L, a polymer layer 136 is formed on the metal layer 134 and capacitor dielectric layer 122 via spin coating process. Next, the polymer layer 136 is patterned with the processes of baking. Next, the polymer layer 136 is patterned with the processes of baking, exposure, development, etc., to form multiple openings 136a in the polymer layer 136 exposing metal layer 134. A 1× stepper or a 1× contact aligner can be used to expose the polymer layer 88 during the process of exposure. Then, the developed polymer layer 136 is cured at a peak temperature of between 150 and 300° C., between 290 and 330° C. or between 330 and 400° C. for a time of between 30 minutes and 2 hours in nitrogen ambient or in oxygen-free ambient. The material of the polymer layer 136 may include polyimide (PI), benzocyclobutane (BCB), polyurethane, epoxy resin, a parylene-based polymer, a solder-mask material, an elastomer, or a porous dielectric material.

The cured polymer layer 136 has a thickness of between 3 and 25 μm. For example, the polymer layer 136 may be a polyimide layer with a thickness of between 3 and 25 μm.

Referring to FIG. 4M-4N, After the above-mentioned processes of forming the polymer layer 136, the semiconductor wafer 20 can be diced into a plurality of individual semiconductor chips 20a. Via a wire-bonding process connect to external circuit, one end of a wire 36 (made of gold, copper or aluminum) can be bonded with the metal layer 134 exposed by the opening 136a of the semiconductor chip 20a. The external circuit may be a ball-grid-array (BGA) substrate, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a silicon substrate.

Aspect 1 of Embodiment 7

Figure 8A:
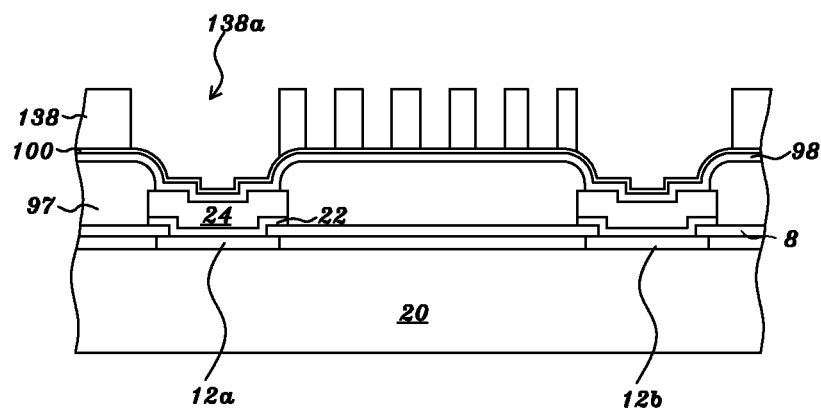
FIGS. 8A through 8G are sectional views showing a structure and process of a aspect of a embodiment of the present invention.

Referring to FIG. 8A, after the step shown in FIG. 6D is completed. A photoresist layer 138 is formed on the seed layer 100. The photoresist layer 138 is patterned with the processes of exposure, development, etc., to form multiple openings 138a in the photoresist layer 138 exposing the seed layer 100. The opening 138a having a coil shape may be formed in the photoresist layer 138 to form a coil in the opening 138a in the following steps.

The photoresist layer 138 can be formed by spin-on coating a positive-type photosensitive polymer layer having a thickness of between 5 and 30 μm, and preferably of between 7 and 15 μm, on the seed layer 100, then exposing the photosensitive polymer layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 100 with an $O_2$ plasma or a plasma containing fluorine of below 200 PPM and oxygen, such that the photoresist layer 138 can be patterned with multiple openings 138a in the photoresist layer 138 exposing the seed layer 100.

Figure 8B:
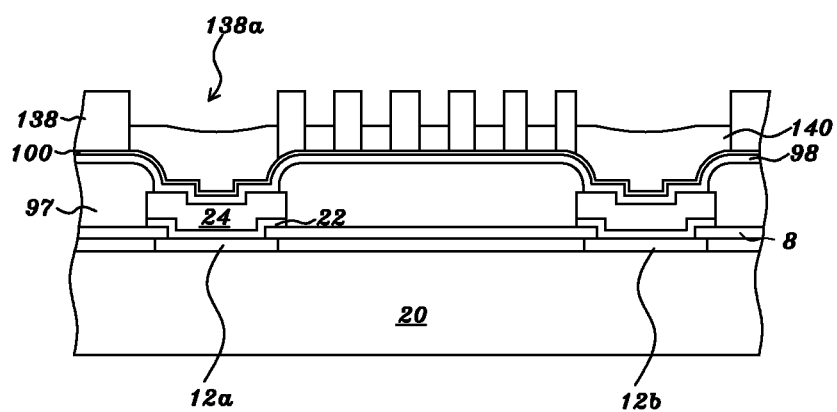

Referring to FIG. 8B, a metal layer 140 having a thickness of between 2 and 25 μm is electroplated on the seed layer 100 exposed by the opening 138a. The metal layer 140 is a coil. The metal layer 140 may be a single metal layer, such as a gold layer, a copper layer, a nickel layer, a palladium layer, a platinum layer. The metal layer 140 may be a composite metal layer, such as a copper/nickel/gold layer, a copper/gold layer, a copper/nickel/palladium layer, copper/nickel/platinum layer. The metal layer 140 is a gold layer in this embodiment.

Figure 8C:
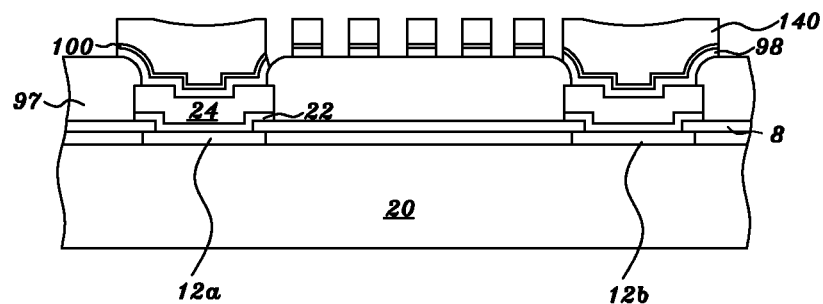
Figure 8D:
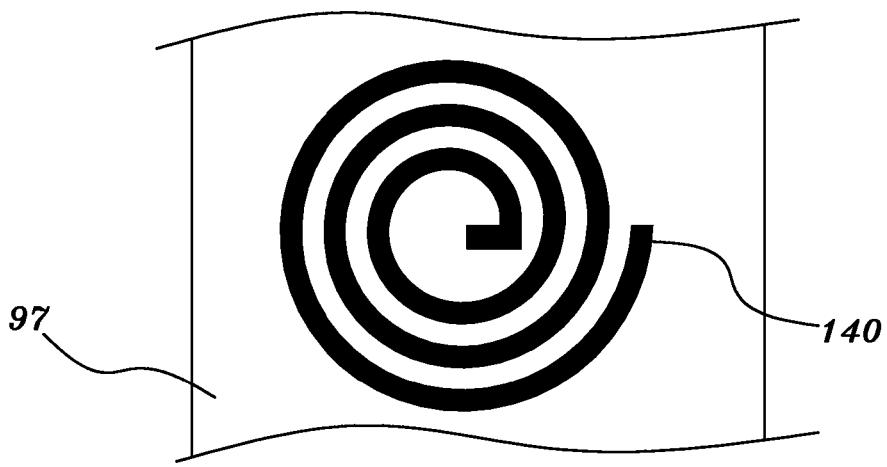

Referring to FIG. 8C-8D, after the metal layer 140 is formed, most of the photoresist layer 138 can be removed using an organic solution with amide. However, some residuals from the photoresist layer 138 could remain on the metal layer 140 and on the seed layer 100. Thereafter, the residuals can be removed from the metal layer 140 and the seed layer 100 with a plasma, such as an $O_2$ plasma or a plasma containing fluorine of below 200 PPM and oxygen. Alternatively, the photoresist layer 138 can be removed using an $O_2$ plasma or using a plasma containing fluorine of below 200 PPM and oxygen, without using an organic solution.

Next, the seed layer 100 and the adhesion/barrier layer 98 not under the metal layer 140 are removed with a wet etching method. As to the wet etching methods, when the adhesion/barrier layer 98 is a titanium-tungsten alloy layer, it can be etched with a solution containing hydrogen peroxide; when the seed layer 100 is a gold layer, it can be etched with an iodine-containing solution. When the seed layer 100 is a gold layer, it can be etched with an iodine-containing solution, such as a solution containing potassium iodide; when the seed layer 100 is a copper layer, it can be etched with a solution containing ammonium hydroxide ($NH_4OH$).

The seed layer 100 and the adhesion/barrier layer 98 not under the metal layer 140 are removed with a dry etching method. Generally, the dry etching method to etch the seed layer 100 and the adhesion/barrier layer 98 not under the metal layer 140 may include a chemical plasma etching process, a sputtering etching process, such as an argon sputter process, $O_2$ plasma, or a chemical vapor etching process.

Figure 8E:
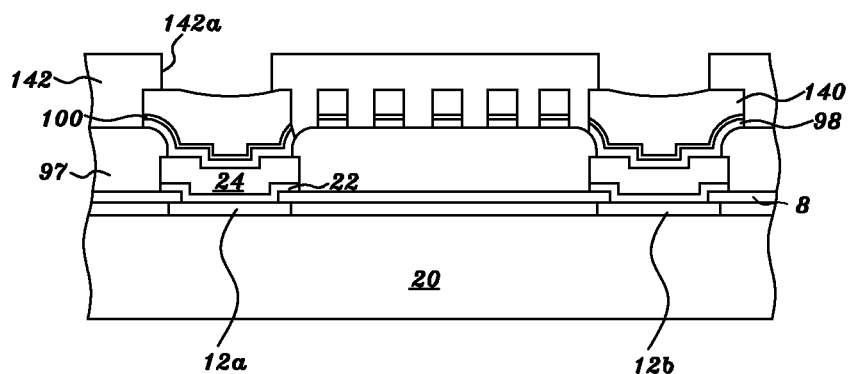

Referring to FIG. 8E, a polymer layer 142 having a thickness of between 3 and 25 μm is formed on the polymer layer 97 and metal layer 140. Next, the polymer layer 142 is patterned with the processes of baking, exposure, development, etc., to form multiple openings 142a in the polymer layer 142 exposing metal layer 140. A 1× stepper or a 1× contact aligner can be used to expose the polymer layer 142 during the process of exposure. Then, the developed polymer layer 142 is cured at a peak temperature of between 150 and 300° C. for a time of between 30 minutes and 2 hours in nitrogen ambient or in oxygen-free ambient. The material of the polymer layer 142 may include polyimide (PI), benzocyclobutane (BCB), polyurethane, epoxy resin, a parylene-based polymer, a solder-mask material, an elastomer, or a porous dielectric material.

Figure 8F:
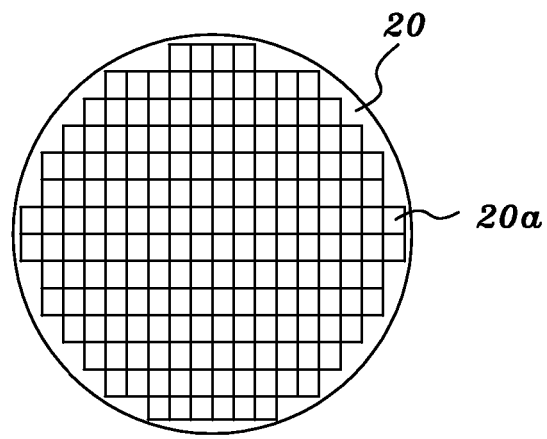
Figure 8G:
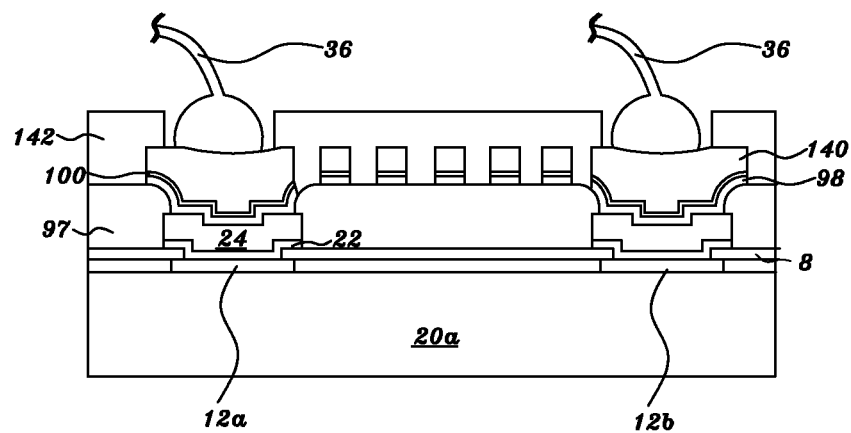

Referring to FIG. 8F-8G, After the above-mentioned processes of forming the polymer layer 142, the semiconductor wafer 20 can be diced into a plurality of individual semiconductor chips 20a. Via a wire-bonding process connect to external circuit, one end of a wire 36 (made of gold, copper or aluminum) can be bonded with the metal layer 140 exposed by the opening 142a of the semiconductor chip 20a. The external circuit may be a ball-grid-array (BGA) substrate, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a silicon substrate.

Aspect 2 of Embodiment 7

Figure 8H:
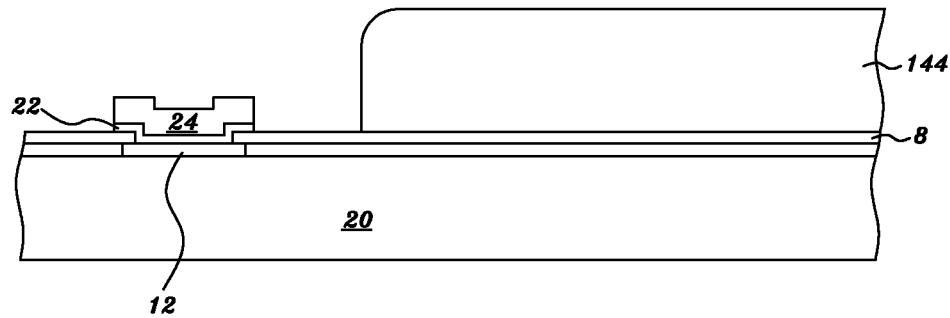
FIGS. 8H through 8Q are sectional views showing a structure and process of a aspect of a embodiment of the present invention.

Referring to FIG. 8H, after the step shown in FIG. 2D is completed. A polymer layer 144 is formed on the passivation layer 8 and metal cap 24 via spin coating process. Next, the polymer layer 144 is patterned with the processes of baking, exposure, development, etc., to form multiple openings 144a in the polymer layer 144 exposing metal cap 24. A 1× stepper or a 1× contact aligner can be used to expose the polymer layer 144 during the process of exposure. Next, the polymer layer 144 is patterned with the processes of baking. Then, the developed polymer layer 144 is cured at a peak temperature of between 150 and 300° C., between 290 and 330° C. or between 330 and 400° C. for a time of between 30 minutes and 2 hours in nitrogen ambient or in oxygen-free ambient. The material of the polymer layer 144 may include polyimide (PI), benzocyclobutane (BCB), polyurethane, epoxy resin, a parylene-based polymer, a solder-mask material, an elastomer, or a porous dielectric material. The cured polymer layer 144 has a thickness of between 3 and 25 μm. For example, the polymer layer 144 may be a polyimide layer with a thickness of between 3 and 25 μm.

Figure 8I:
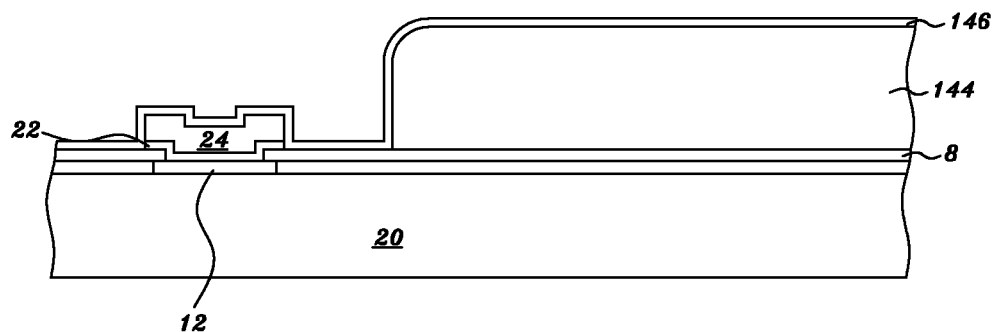

Referring to FIG. 8I, an adhesion/barrier layer 146 having a thickness of between 0.01 μm and 0.7 μm, is formed on the polymer layer 144, on the passivation layer 8 and on the metal caps 24. The material of the adhesion/barrier layer 146 may include titanium, titanium nitride, a titanium-tungsten alloy, a nickel-vanadium alloy, chromium, tantalum, tantalum nitride, or a composite of the abovementioned materials. The material of the adhesion/barrier layer 146 is a titanium-tungsten alloy in this Embodiment. The adhesion/barrier layer 146 may be formed by a sputtering method or a vapor deposition method.

Figure 8J:
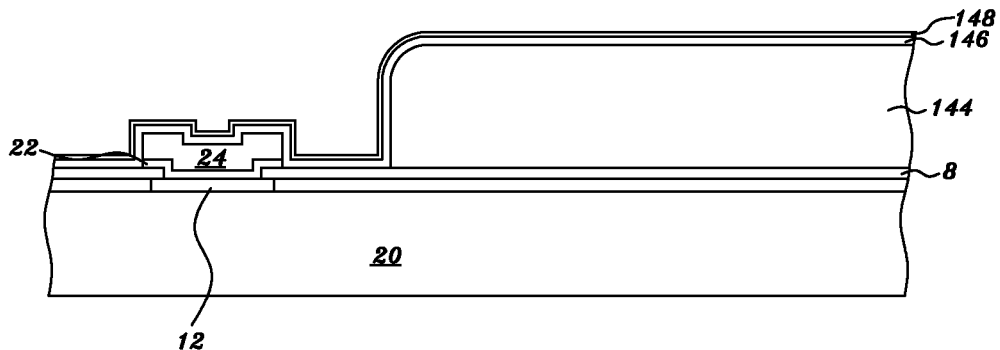

Referring to FIG. 8J, a seed layer 148 having a thickness of 0.005 μm and 2 μm, is formed on the adhesion/barrier layer 146. The seed layer 148 may be formed by a sputtering method, a vapor deposition method, an electroless plating method or a PVD (Physical Vapor Deposition) method. The seed layer 148 is beneficial to electroplating a metal layer thereon. Thus, the material of the seed layer 148 varies with the material of the electroplated metal layer formed on the seed layer 148. When a gold layer is to be electroplated on the seed layer 148, gold is a preferable material to the seed layer 148.

Figure 8K:
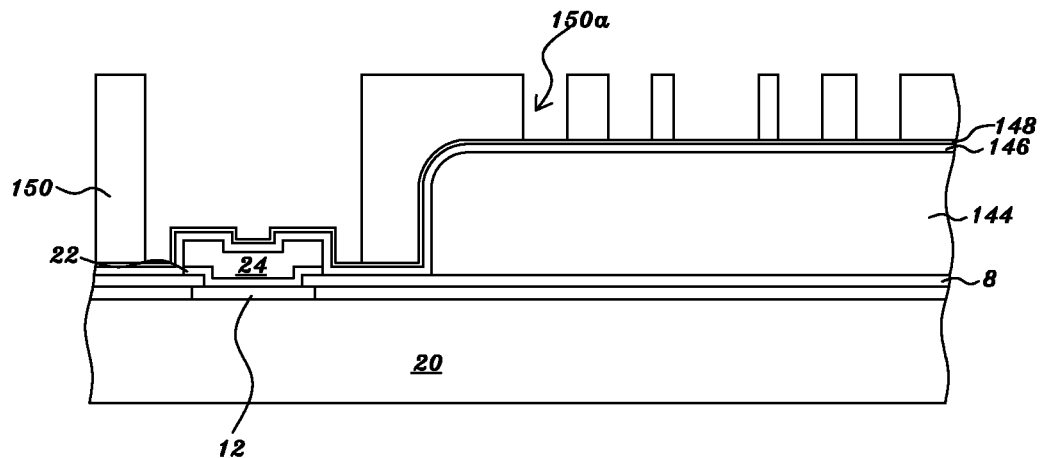

Referring to FIG. 8K, a photoresist layer 150 is formed on the seed layer 148. The photoresist layer 150 is patterned with the processes of exposure, development, etc., to form multiple openings 150a in the photoresist layer 150 exposing the seed layer 148.

The photoresist layer 150 can be formed by spin-on coating a positive-type photosensitive polymer layer having a thickness of between 5 and 30 μm, and preferably of between 7 μm and 5 μm, on the seed layer 148, then exposing the photosensitive polymer layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 148 with an $O_2$ plasma or a plasma containing fluorine of below 200 PPM and oxygen, such that the photoresist layer 150 can be patterned with multiple openings 150a in the photoresist layer 150 exposing the seed layer 148.

Figure 8L:
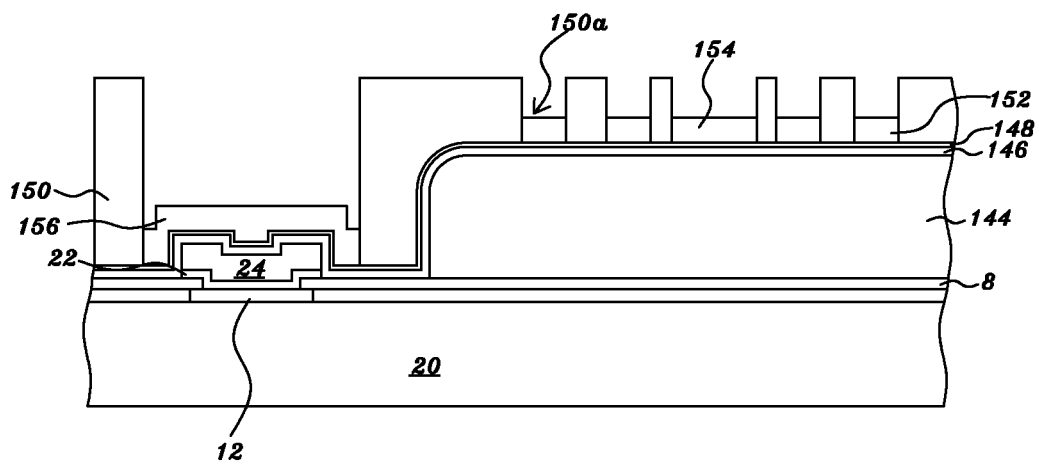

Referring to FIG. 8L, a metal layer 152 having a thickness of between 2 and 25 μm is electroplated on the seed layer 148 exposed by the opening 150a. The metal layer 152 may be a single metal layer, such as a gold layer, a copper layer, a nickel layer, a palladium layer, a platinum layer. The metal layer 152 may be a composite metal layer, such as a copper/nickel/gold layer, a copper/gold layer, a copper/nickel/palladium layer, copper/nickel/platinum layer. The metal layer 152 is a gold layer in this embodiment with a thickness of between 2 μm and 4 μm. The metal layer 152 comprises a pad 156 and a coil 154. The coil is on the polymer layer 144. The pad 156 is on the metal pad 24. The pad 156 is not connect the coil 154 directly.

Figure 8M:
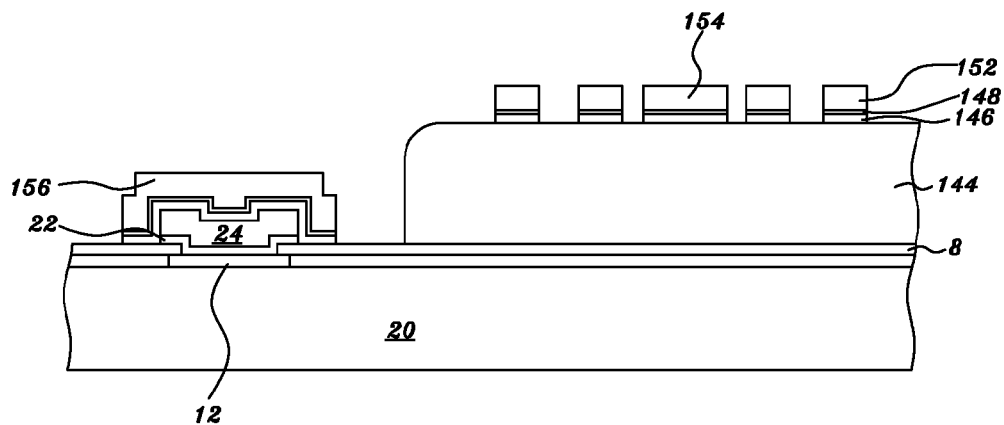
Figure 8N:
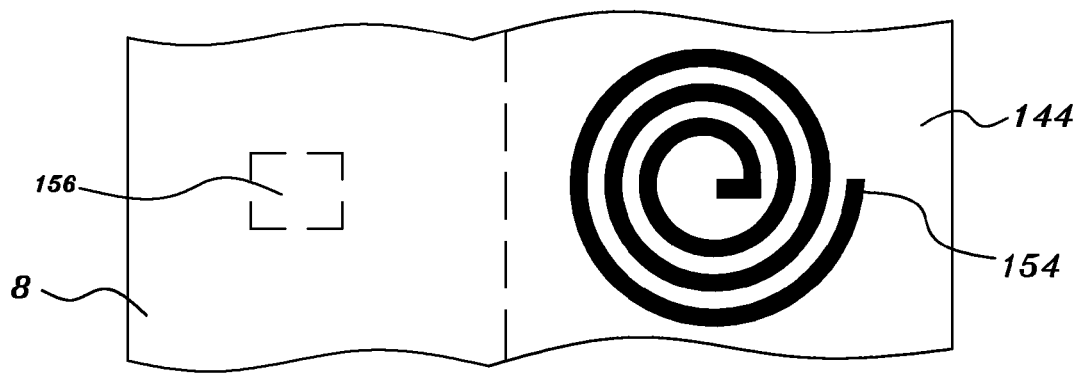

Referring to FIG. 8M-8N, after the metal layer 152 is formed, most of the photoresist layer 150 can be removed using an organic solution with amide. However, some residuals from the photoresist layer 150 could remain on the metal layer 152 and on the seed layer 148. Thereafter, the residuals can be removed from the metal layer 152 and the seed layer 148 with a plasma, such as an $O_2$ plasma or a plasma containing fluorine of below 200 PPM and oxygen. Alternatively, the photoresist layer 150 can be removed using an $O_2$ plasma or using a plasma containing fluorine of below 200 PPM and oxygen, without using an organic solution.

Next, the seed layer 148 and the adhesion/barrier layer 146 not under the metal layer 152 are removed with a wet etching method. As to the wet etching methods, when the adhesion/barrier layer 146 is a titanium-tungsten alloy layer, it can be etched with a solution containing hydrogen peroxide; when the seed layer 148 is a gold layer, it can be etched with an iodine-containing solution. When the seed layer 148 is a gold layer, it can be etched with an iodine-containing solution, such as a solution containing potassium iodide; when the seed layer 148 is a copper layer, it can be etched with a solution containing ammonium hydroxide ($NH_4OH$).

The seed layer 148 and the adhesion/barrier layer 146 not under the metal layer 152 are removed with a dry etching method. Generally, the dry etching method to etch the seed layer 148 and the adhesion/barrier layer 146 not under the metal layer 152 may include a chemical plasma etching process, a sputtering etching process, such as an argon sputter process, $O_2$ plasma, or a chemical vapor etching process.

Figure 8O:
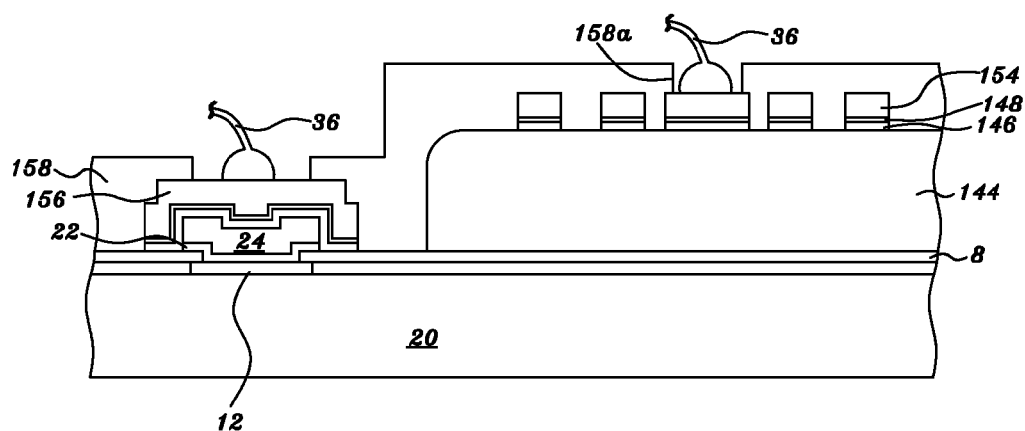

Referring to FIG. 8O, a polymer layer 158 is formed on the polymer layer 144, on the passivation layer 8 and on the metal layer 152 via spin coating process. Next, the polymer layer 158 is patterned with the processes of baking, exposure, development, etc., to form multiple openings 158a in the polymer layer 158 exposing the pad 156 and a part of the coil 154. A 1× stepper or a 1× contact aligner can be used to expose the polymer layer 158 during the process of exposure. Then, the developed polymer layer 158 is cured at a peak temperature of between 150 and 300° C., between 290 and 330° C. or between 330 and 400° C. for a time of between 30 minutes and 2 hours in nitrogen ambient or in oxygen-free ambient. The material of the polymer layer 158 may include polyimide (PI), benzocyclobutane (BCB), polyurethane, epoxy resin, a parylene-based polymer, a solder-mask material, an elastomer, or a porous dielectric material. The cured polymer layer 158 has a thickness of between 3 and 25 µm. For example, the polymer layer 158 may be a polyimide layer with a thickness of between 3 and 25 µm.

Figure 8P:
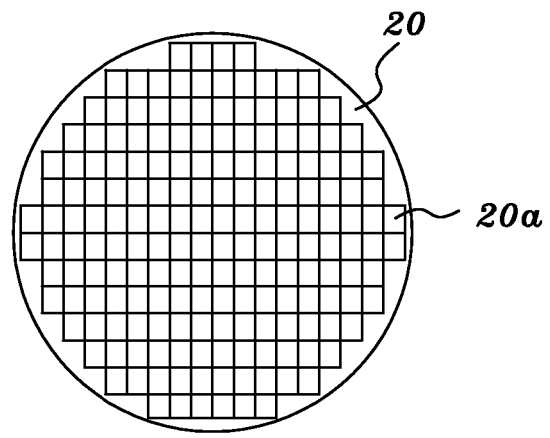
Figure 8Q:
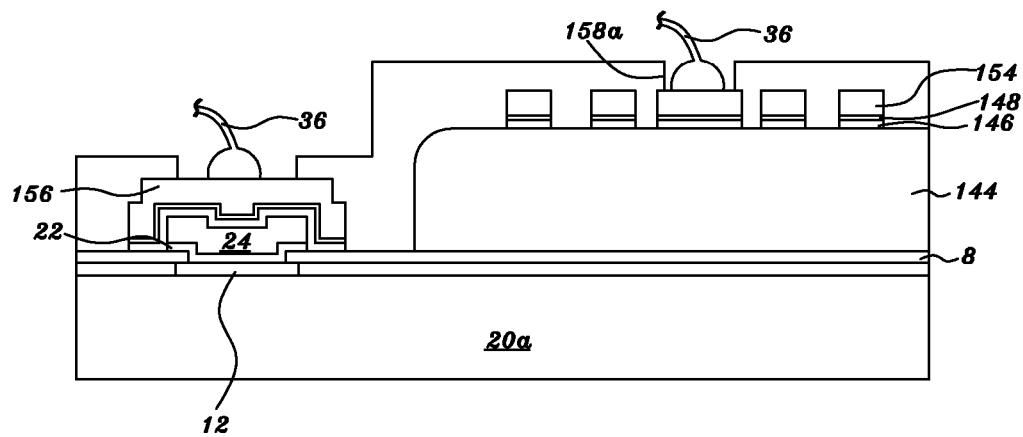

Referring to FIG. 8P-8Q, After the above-mentioned processes of forming the polymer layer 158, the semiconductor wafer 20 can be diced into a plurality of individual semiconductor chips 20a. Via a wire-bonding process connect to external circuit, one end of a wire 36 (made of gold, copper or aluminum) can be bonded with the coil 154 and the pad 156 exposed by the opening 158a of the semiconductor chip 20a. The external circuit may be a ball-grid-array (BGA) substrate, a printed circuit board (PCB) comprising a glass fiber as a core, a flexible tape comprising a polymer layer (such as polyimide) having a thickness of between 30 and 200 µm and not comprising any polymer layer with glass fiber, a ceramic substrate comprising a ceramic material as insulating layers between circuit layers, a glass substrate having circuit layers made of Indium Tin Oxide (ITO), or a silicon substrate.

Aspect 1 of Embodiment 8

Figure 9A:
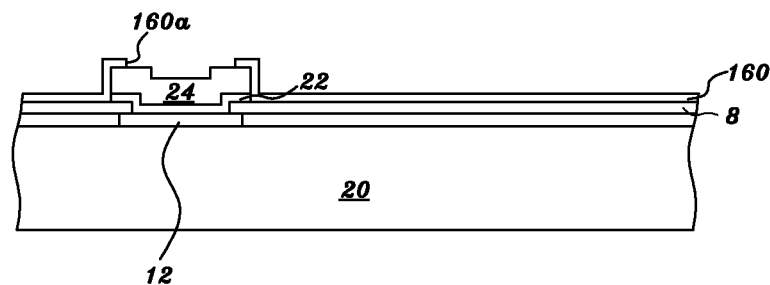
FIGS. 9A through 9H are sectional views showing a structure and process of a aspect of a embodiment of the present invention.

Referring to FIG. 9A, after the step shown in FIG. 2D is completed. A passivation layer 160 is formed over the passivation layer 8 and the metal cap 24. The passivation layer 160 can protect the metal cap 24 from being damaged by moisture and foreign ion contamination. In other words, Mobile ions (such as sodium ion), transition metals (such as gold, silver and copper) and impurities can be prevented from penetrating through the passivation layer 160 to the semiconductor devices 4, such as transistors, polysilicon resistor elements and polysilicon-polysilicon capacitor elements, and to the circuit structure 6.

The passivation layer 160 is commonly made of silicon oxide (such as $SiO_2$), PSG (phosphosilicate glass), silicon nitride (such as $Si_3N_4$), or silicon oxynitride. The passivation layer 160 commonly has a thickness of more than 0.35 µm. In a preferred case, the silicon nitride layer in the passivation layer 160 has a thickness of more than 0.3 µm. Ten methods for depositing the passivation layer 160 are described as passivation layer 8 process. A opening 160a in the passivation layer 160 exposes the metal cap 24 with a dry etching process.

The opening 160a have a maximum transverse dimension of between 2 and 30 µm or between 30 and 300 µm. The shape of the opening 160a may be a circle, and the diameter of the circle-shaped opening 160a may be between 2 and 30 µm or between 30 and 300 µm. Alternatively, the shape of the opening 160a may be a square, and the greatest diagonal length of the square-shaped opening 160a may be between 2 and 30 µm or between 30 and 300 µm. Alternatively, the shape of the opening 160a may be a polygon, and the polygon-shaped opening 160a may have a greatest diagonal length of between 3 and 30 µm or between 30 and 300 µm. Alternatively, the shape of the opening 160a may also be a rectangle, and the rectangle-shaped opening 160a may have a width of between 2 and 40 µm. Further, there may be the semiconductor device 4 under the pad 12 exposed by the opening 160a.

Figure 9B:
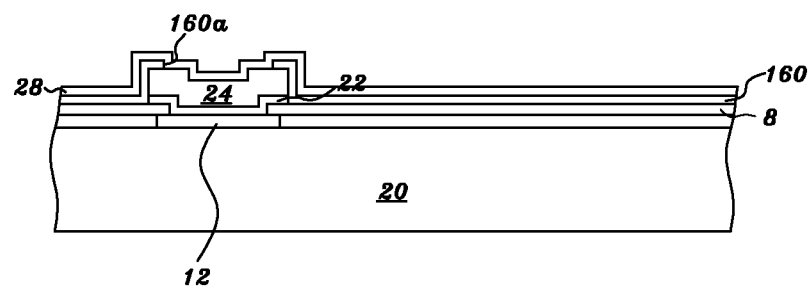

Referring to FIG. 9B, an adhesion/barrier layer 28 having a thickness of between 0.01 µm and 0.7 µm, is formed on the passivation layer 160 and on the metal cap 24. The material of the adhesion/barrier layer 28 may include titanium, titanium nitride, a titanium-tungsten alloy, a nickel-vanadium alloy, chromium, tantalum, tantalum nitride, or a composite of the abovementioned materials. The material of the adhesion/barrier layer 28 is a titanium-tungsten alloy in this Embodiment. The adhesion/barrier layer 28 may be formed by a sputtering method or a vapor deposition method.

Figure 9C:
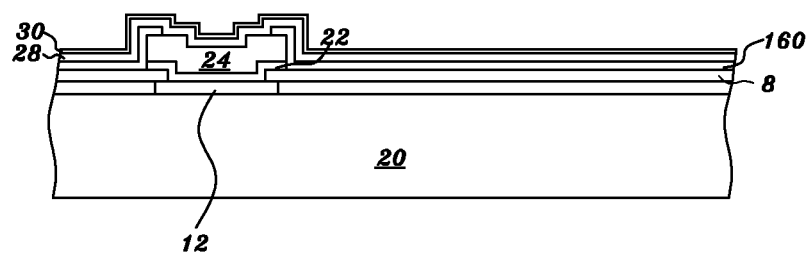

Referring to FIG. 9C, a seed layer 30 having a thickness of 0.005 µm and 2 µm, is formed on the adhesion/barrier layer 28. The seed layer 30 may be formed by a sputtering method, a vapor deposition method, an electroless plating method or a PVD (Physical Vapor Deposition) method. The seed layer 30 is beneficial to electroplating a metal layer thereon. Thus, the material of the seed layer 30 varies with the material of the electroplated metal layer formed on the seed layer 30. When a gold layer is to be electroplated on the seed layer 30, gold is a preferable material to the seed layer 30.

Figure 9D:
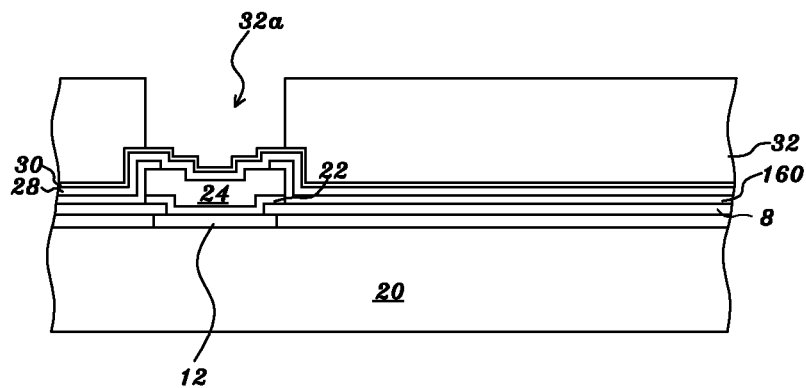

Referring to FIG. 9D, a photoresist layer 32 is formed on the seed layer 30. The photoresist layer 32 is patterned with the processes of exposure, development, etc., to form multiple openings 32a in the photoresist layer 32 exposing the seed layer 30.

The photoresist layer 32 can be formed by spin-on coating a positive-type photosensitive polymer layer having a thickness of between 5 and 30 µm, and preferably of between 7 and 15 µm, on the seed layer 30, then exposing the photosensitive polymer layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 30 with an $O_2$ plasma or a plasma containing fluorine of below 200 PPM and oxygen, such that the photoresist layer 32 can be patterned with multiple openings 32a in the photoresist layer 32 exposing the seed layer 30.

Figure 9E:
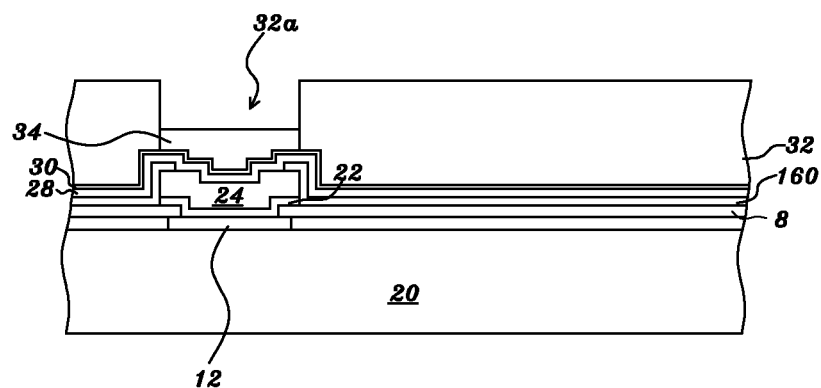

Referring to FIG. 9E, a metal layer 34 having a thickness of between 2 and 25 μm is electroplated on the seed layer 30 exposed by the opening 32a. The metal layer 34 may be a single metal layer, such as a gold layer, a copper layer, a nickel layer, a palladium layer, a platinum layer. The metal layer 34 may be a composite metal layer, such as a copper/nickel/gold layer, a copper/gold layer, a copper/nickel/palladium layer, copper/nickel/platinum layer. The metal layer 34 is a gold layer in this embodiment with a thickness of between 2 μm and 4 μm.

Figure 9F:
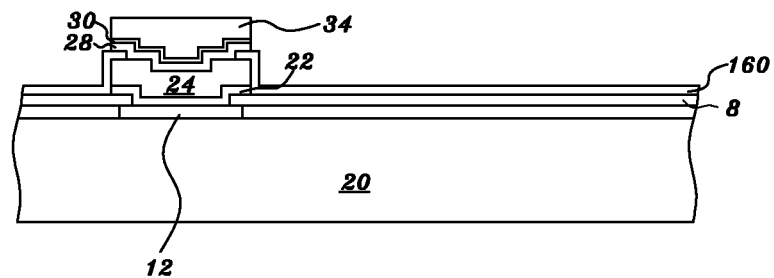

Referring to FIG. 9F, after the metal layer 34 is formed, most of the photoresist layer 32 can be removed using an organic solution with amide. However, some residuals from the photoresist layer 32 could remain on the metal layer 34 and on the seed layer 30. Thereafter, the residuals can be removed from the metal layer 34 and the seed layer 30 with a plasma, such as an $O_2$ plasma or a plasma containing fluorine of below 200 PPM and oxygen. Alternatively, the photoresist layer 32 can be removed using an $O_2$ plasma or using a plasma containing fluorine of below 200 PPM and oxygen, without using an organic solution.

Next, the seed layer 30 and the adhesion/barrier layer 28 not under the metal layer 34 are removed with a wet etching method. As to the wet etching methods, when the adhesion/barrier layer 28 is a titanium-tungsten alloy layer, it can be etched with a solution containing hydrogen peroxide; when the seed layer 30 is a gold layer, it can be etched with an iodine-containing solution. When the seed layer 30 is a gold layer, it can be etched with an iodine-containing solution, such as a solution containing potassium iodide; when the seed layer 30 is a copper layer, it can be etched with a solution containing ammonium hydroxide ($NH_4OH$).

The seed layer 30 and the adhesion/barrier layer 28 not under the metal layer 34 are removed with a dry etching method. Generally, the dry etching method to etch the seed layer 30 and the adhesion/barrier layer 28 not under the metal layer 34 may include a chemical plasma etching process, a sputtering etching process, such as an argon sputter process, $O_2$ plasma, or a chemical vapor etching process.

Figure 9G:
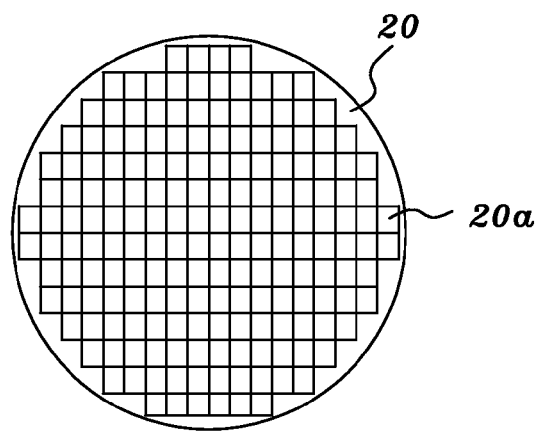
Figure 9H:
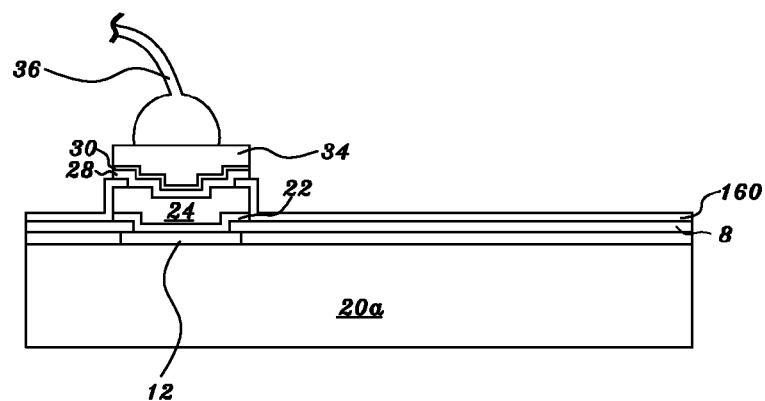

Referring to FIG. 9G-9H, After the above-mentioned processes of the seed layer 30 and the adhesion/barrier layer 28 not under the metal layer 34 are removed, the semiconductor wafer 20 can be diced into a plurality of individual semiconductor chips 20a. Via a wire-bonding process connect to external circuit, one end of a wire 36 (made of gold, copper or aluminum) can be bonded with the metal layer 34 of the semiconductor chip 20a. The external circuit may be a ball-grid-array (BGA) substrate, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a silicon substrate.

Aspect 2 of Embodiment 8

Figure 9I:
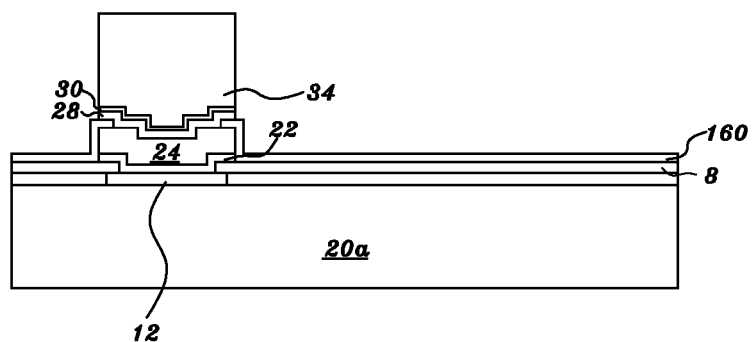
FIG. 9I is sectional views showing a structure and process of a aspect of a embodiment of the present invention.
Figure 9J:
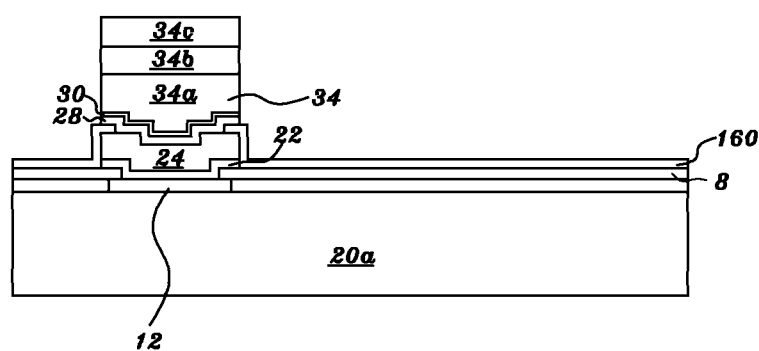
FIG. 9J is sectional views showing a structure and process of a aspect of a embodiment of the present invention.

Referring to FIG. 9I, the structure and process of the aspect 2 and aspect 1 likeness. The difference is the metal layer 34 having a thickness of between 5 and 25 μm. The metal layer 34 use to be a metal bump.

When one of the semiconductor chips is being packaged, the metal layer 34 can be connected to an external circuit via a TAB (Tape Automated Bonding) technology, a COG (chip on glass) technology, a TCP (Tape Carrier Package) method or a COF (chip on film) method. Such as Fig. The external circuit may be a ball-grid-array (BGA) substrate, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a silicon substrate.

Aspect 3 of Embodiment 8

Referring to FIG. 9I, the structure and process of the aspect 2 and aspect 1 likeness. The difference is the metal layer 34 having multiple metal layer.

The metal layer 34 comprise a copper layer 34a, a nickel layer 34b, a gold layer 34c. The metal layer 34 can be formed by electroplating the copper layer 34a having a thickness of between 2 and 15 μm on the seed layer 30, next electroplating a nickel layer 34b having a thickness of between 0.1 and 5 μm on the copper layer 34a, and then electroplating a gold layer 34c having a thickness of between 0.01 and 5 μm on the nickel layer 34b. The metal layer 34 use to be a metal bump.

When one of the semiconductor chips is being packaged, the metal layer 34 can be connected to an external circuit via a TAB (Tape Automated Bonding) technology, a COG (chip on glass) technology, a TCP (Tape Carrier Package) method or a COF (chip on film) method. Such as Fig. The external circuit may be a ball-grid-array (BGA) substrate, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a silicon substrate.

Aspect 1 of Embodiment 9

Figure 10A:
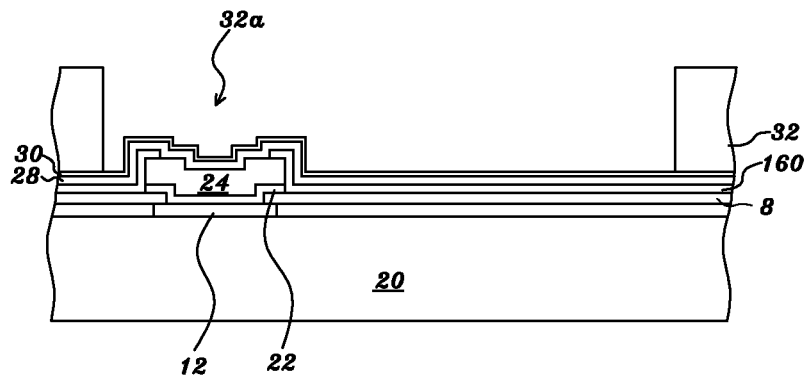
FIGS. 10A through 10G are sectional views showing a structure and process of a aspect of a embodiment of the present invention.

Referring to FIG. 10A, the structure and process of the aspect 1 of embodiment 9 and aspect 1 of embodiment 7 likeness. After the step shown in FIG. 2B is completed, a photoresist layer 32 is formed on the seed layer 30. Next, the photoresist layer 32 is patterned with the processes of exposure, development, etc., to form an opening 32a in the photoresist layer 32 exposing the seed layer 30 over the patterned metal cap 24. For example, the photoresist layer 32 can be formed by spin-on coating a positive-type photosensitive polymer layer having a thickness of between 5 and 30 μm, and preferably of between 7 and 15 μm, on the seed layer 30, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer to form an opening in the polymer layer exposing the seed layer 30, and then removing the residual polymeric material or other contaminants on the seed layer 30 with an $O_2$ plasma or a plasma containing fluorine of below 200 PPM and oxygen, such that the photoresist layer 32 can be patterned with an opening 32a in the photoresist layer 32 exposing the seed layer 30.

Figure 10B:
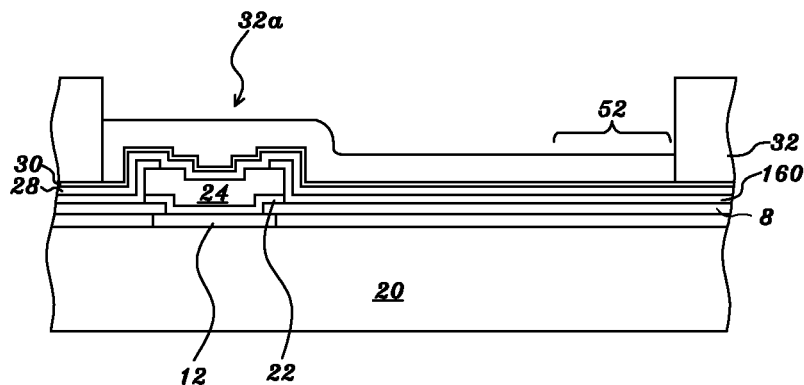
Figure 10C:
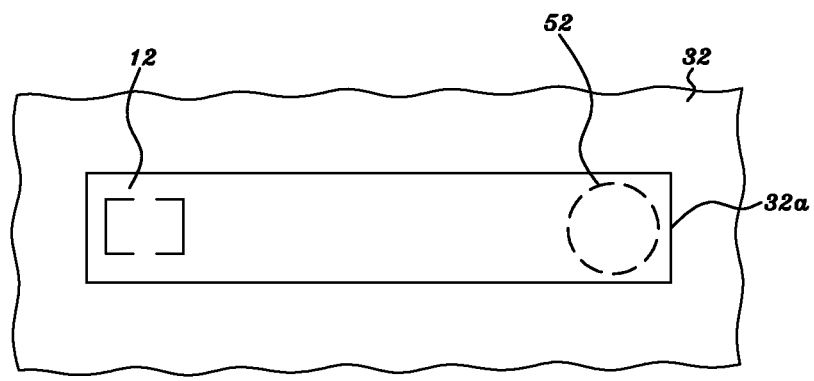

Referring to FIG. 10B-10C, a metal layer 50 having a thickness of between 2 and 25 µm is electroplated on the seed layer 30 exposed by the opening 32a. The metal layer 50 may be a single layer made of gold, copper, palladium, platinum, or nickel. The metal layer 50 may also be a composite layer made of the abovementioned metals. The metal layer 50 comprise a pad 52.

For example, the metal layer 50 may be formed by electroplating a gold layer with a thickness of between 1 and 10 µm on the seed layer 30, made of gold, exposed by the opening 32a. Alternatively, the metal layer 50 may be formed by electroplating a copper layer with a thickness of between 2 and 25 µm on the seed layer 30, made of copper, exposed by the opening 32a. Alternatively, the metal layer 50 may be formed by electroplating a copper layer with a thickness of between 1 and 15 µm on the seed layer 30, made of copper, exposed by the opening 32a, next electroplating a nickel layer with a thickness of between 0.1 and 5 µm on the copper layer in the opening 32a, and then electroplating a gold layer with a thickness of between 0.01 and 2 µm on the nickel layer in the opening 32a. Alternatively, the metal layer 50 may be formed by electroplating a copper layer with a thickness of between 1 and 15 µm on the seed layer 30, made of copper, exposed by the opening 32a, and then electroplating a gold layer with a thickness of between 0.01 and 2 µm on the copper layer in the opening 32a. Alternatively, the metal layer 50 may be formed by electroplating a copper layer with a thickness of between 1 and 15 µm on the seed layer 30, made of copper, exposed by the opening 32a, next electroplating a nickel layer with a thickness of between 0.1 and 5 µm on the copper layer in the opening 32a, and then electroplating a palladium layer with a thickness of between 0.01 and 2 µm on the nickel layer in the opening 32a. Alternatively, the metal layer 50 may be formed by electroplating a copper layer with a thickness of between 1 and 15 µm on the seed layer 30, made of copper, exposed by the opening 32a, next electroplating a nickel layer with a thickness of between 0.1 and 5 µm on the copper layer in the opening 32a, and then electroplating a platinum layer with a thickness of between 0.01 and 2 µm on the nickel layer in the opening 32a.

The metal layer 50 may be a RDL (Re-Distribution Layer), and the pad 52 exposed by the opening 32a is different from that of the pad 12 exposed by the opening 8a from a top perspective view (shown in FIG. 10C).

Figure 10D:
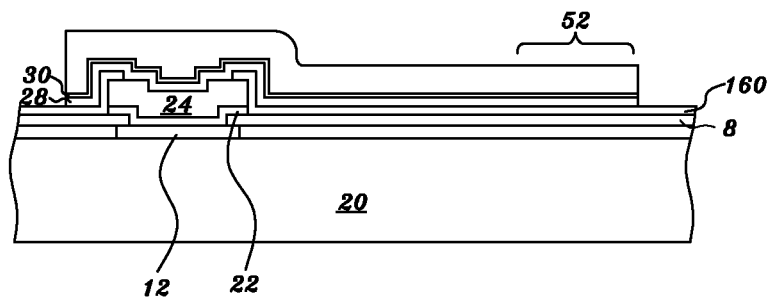

Referring to FIG. 10D, after the metal layer 50 is formed, the photoresist layer 32 can be removed using an organic solution with amide. Alternatively, the photoresist layer 32 can be removed using an inorganic solution, such as sulfuric acid ($H_2SO_4$) or hydrogen peroxide ($H_2O_2$). Alternatively, the photoresist layer 32 can be removed using an plasma or a plasma containing fluorine of below 200 PPM and oxygen.

Next, the seed layer 30 and the adhesion/barrier layer 28 not under the metal layer 50 are sequentially removed with a dry etching method or a wet etching method. As to the wet etching method, when the adhesion/barrier layer 28 is a titanium-tungsten alloy layer, it can be etched with a solution containing hydrogen peroxide at the temperature of between 40 and 50 degree centigrade for a time of between 3 and 20 minutes; when the seed layer 30 is a gold layer, it can be etched with an iodine-containing solution, such as a solution containing potassium iodide; when the seed layer 30 is a copper layer, it can be etched with a solution containing ammonium hydroxide ($NH_4OH$). As to the dry etching method, when the adhesion/barrier layer 28 is a titanium-tungsten alloy layer, it can be etched with an argon sputter process; when the seed layer 30 is a gold layer, it can be removed with an argon sputter process. Generally, the dry etching method to etch the seed layer 30 and the adhesion/barrier layer 28 not under the metal layer 50 may include a chemical plasma etching process, a sputtering etching process, such as an argon sputter process, or a chemical vapor etching process. So far, a semiconductor wafer 20 is formed by the above-mentioned steps.

Figure 10E:
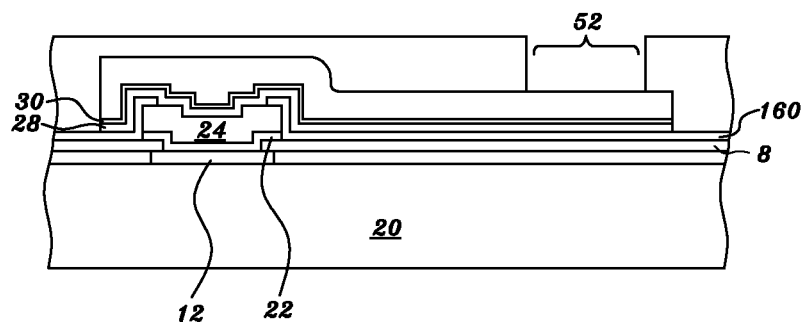

Referring to FIG. 10E, a polymer layer 54 can be formed on the passivation layer 160 and on the metal layer 50. Next, the polymer layer 54 is patterned with the processes of baking, exposure, development, etc., to form at least one opening 54a in the polymer layer 54 exposing the pad 52. For example, the polymer layer 54 can be formed by spin-on coating a positive-type photosensitive polyimide layer having a thickness of between 10 and 50 µm on the metal layer 50 and on the passivation layer 8, then exposing the photosensitive polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polyimide layer, that is, G-line and H-line, G-line and I-line, H-line and I-line, or G-line, H-line and I-line illuminate the photosensitive polyimide layer, then developing the exposed polyimide layer to form an opening in the polyimide layer exposing the pad 52, and then removing the polyimide residuals or other contaminants from the pad 52 with an $O_2$ plasma or a plasma containing fluorine of below 200 PPM and oxygen, and then curing the developed polyimide layer at a peak temperature of between 250 and 400° C. for a time of between 30 minutes and 4 hours in nitrogen ambient or in oxygen-free ambient, wherein the cured polyimide layer may have a thickness of between 3 and 25 µm, such that the polymer layer 54 can be patterned with an opening 54a in the polymer layer 54 exposing the pad 52. Alternatively, the material of the polymer layer 54 may include polyimide (PI), benzocyclobutane (BCB), parylene, epoxy-based material, elastomer, photoepoxy SU-8, silicone, or a porous dielectric material. The polymer layer 54 may be a benzocyclobutane layer with a thickness of between 3 and 25 µm.

Figure 10F:
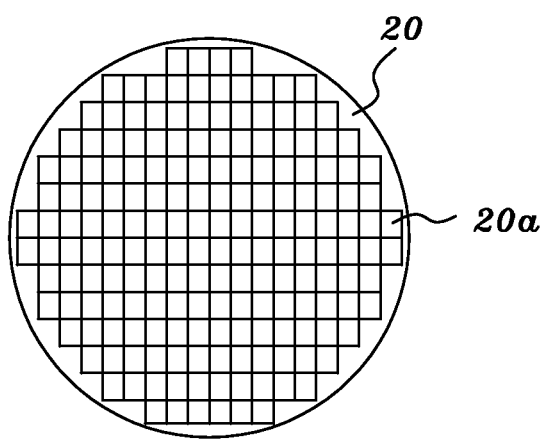
Figure 10G:
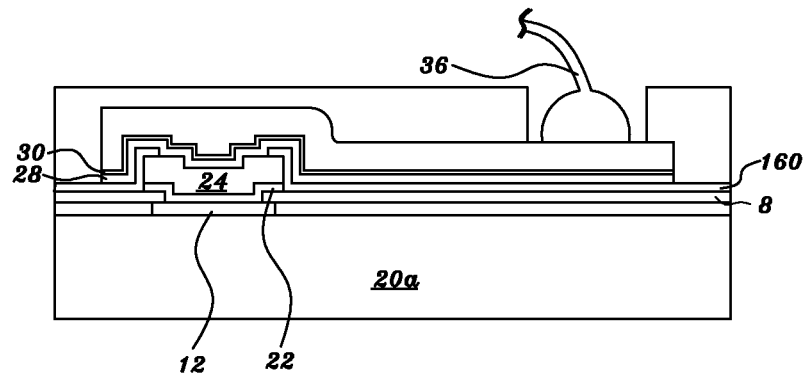

Next, referring to FIG. 10F and FIG. 10G, the semiconductor wafer can be diced into a plurality of individual semiconductor chips 20a. When one of the semiconductor chips 20a is being packaged, one end of a wire 36 made of gold can be ball bonded on the metal layer 34 of the semiconductor chip 20a by a wire-bonding process. The other end of the wire 36 can be wedge bonded on a pad of an external circuit. Therefore, the metal layer 34 of the semiconductor chip 20a may be used to be connected with an external circuit. The external circuit may be a ball-grid-array (BGA) substrate, a printed circuit board (PCB) comprising a glass fiber as a core, a flexible tape comprising a polymer layer (such as polyimide) having a thickness of between 30 and 200 µm and not comprising any polymer layer with glass fiber, a ceramic substrate comprising a ceramic material as insulating layers between circuit layers, a glass substrate having circuit layers made of Indium Tin Oxide (ITO), or a silicon substrate.

Aspect 2 of Embodiment 9

Figure 10H:
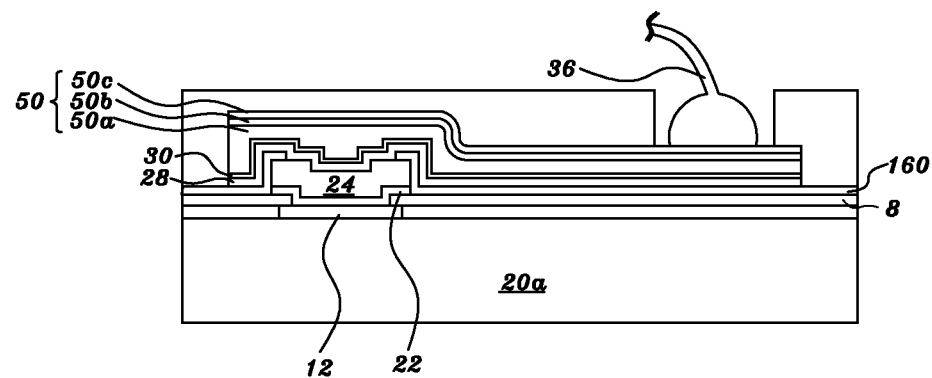
FIGS. 10H through 10R are sectional views showing a structure and process of a aspect of a embodiment of the present invention.

Referring to FIG. 10H, the structure and process of the aspect 2 and aspect 1 likeness. The difference is the metal layer 50 having multiple metal layer.

The metal layer 50 comprise a copper layer 50a, a nickel layer 50b, a gold layer 50c. The metal layer 50 can be formed by electroplating the copper layer 50a having a thickness of between 2 and 15 µm on the seed layer 30, next electroplating a nickel layer 50b having a thickness of between 2 and 5 µm on the copper layer 34a, and then electroplating a gold layer 50c having a thickness of between 0.5 and 5 µm on the nickel layer 50b.

Figure 10I:
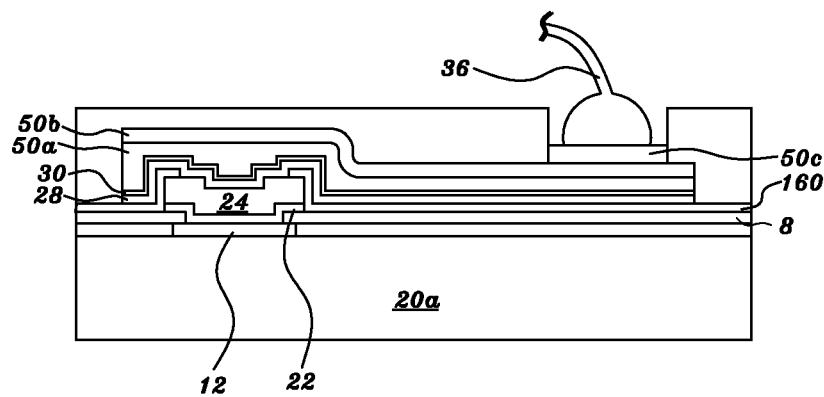

Referring to FIG. 10I, the metal layer 50 comprise a copper layer 50a, a nickel layer 50b. The metal layer 50 can be formed by electroplating the copper layer 50a having a thickness of between 2 and 15 µm on the seed layer 30, next electroplating a nickel layer 50b having a thickness of between 2 and 5 µm on the copper layer 34a.

The polymer layer 54 can be formed on the passivation layer 160 and on the metal layer 50. Next, the polymer layer 54 is patterned with the processes of baking, exposure, development, etc., to form at least one opening 54a in the polymer layer 54 exposing the nickel layer 50b. For example, the polymer layer 54 can be formed by spin-on coating a positive-type photosensitive polyimide layer having a thickness of between 10 and 50 µm on the metal layer 50 and on the passivation layer 8, then exposing the photosensitive polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polyimide layer, that is, G-line and H-line, G-line and I-line, H-line and I-line, or G-line, H-line and I-line illuminate the photosensitive polyimide layer, then developing the exposed polyimide layer to form an opening in the polyimide layer exposing the nickel layer 50b, and then removing the polyimide residuals or other contaminants from the nickel layer 50b with an $O_2$ plasma or a plasma containing fluorine of below 200 PPM and oxygen, and then curing the developed polyimide layer at a peak temperature of between 250 and 400° C. for a time of between 30 minutes and 4 hours in nitrogen ambient or in oxygen-free ambient, wherein the cured polyimide layer may have a thickness of between 3 and 25 µm, such that the polymer layer 54 can be patterned with an opening 54a in the polymer layer 54 exposing the nickel layer 50b. Alternatively, the material of the polymer layer 54 may include polyimide (PI), benzocyclobutane (BCB), parylene, epoxy-based material, elastomer, photoepoxy SU-8, silicone, or a porous dielectric material. The polymer layer 54 may be a benzocyclobutane layer with a thickness of between 3 and 25 µm.

Next, via an electroless plating method, a gold layer 50c having a thickness of between 0.5 and 5 µm is formed on the nickel layer 50b exposed by the opening 54a in the polymer layer 54.

Aspect 3 of Embodiment 9

Figure 10J:
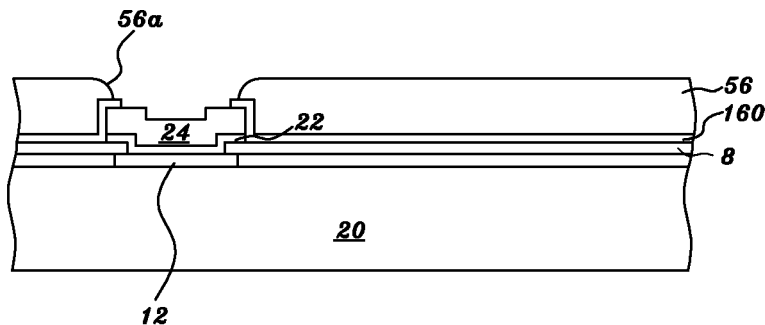

Referring to FIG. 10J, after the step shown in FIG. 9A, a polymer layer 56 can be formed on the passivation layer 160 and on the patterned metal cap 24. Next, the polymer layer 56 is patterned with the processes of baking, exposure, development, etc., to form an opening 56a in the polymer layer 56 exposing the patterned metal cap 24 over the pad 12. For example, the polymer layer 56 can be formed by spin-on coating a positive-type photosensitive polyimide layer having a thickness of between 10 and 50 µm on the patterned metal cap 24 and on the passivation layer 160, then exposing the photosensitive polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polyimide layer, that is, G-line and H-line, G-line and I-line, H-line and I-line, or G-line, H-line and I-line illuminate the photosensitive polyimide layer, then developing the exposed polyimide layer to form an opening in the polyimide layer exposing the patterned metal cap 24, and then removing the polyimide residuals or other contaminants from the patterned metal cap 24 with an $O_2$ plasma or a plasma containing fluorine of below 200 PPM and oxygen, and then curing the developed polyimide layer at a peak temperature of between 250 and 400° C. for a time of between 30 minutes and 4 hours in nitrogen ambient or in oxygen-free ambient, wherein the cured polyimide layer may have a thickness of between 3 and 25 µm, such that the polymer layer 56 can be patterned with an opening 56a in the polymer layer 56 exposing the patterned metal cap 56. Alternatively, the material of the polymer layer 56 may include polyimide (PI), benzocyclobutane (BCB), parylene, epoxy-based material, elastomer, photoepoxy SU-8, silicone, or a porous dielectric material. The polymer layer 56 may be a benzocyclobutane layer with a thickness of between 3 and 25 µm.

Alternatively, the polymer layer 56 may be formed by a laminating process or a screen-printing process.

Figure 10K:
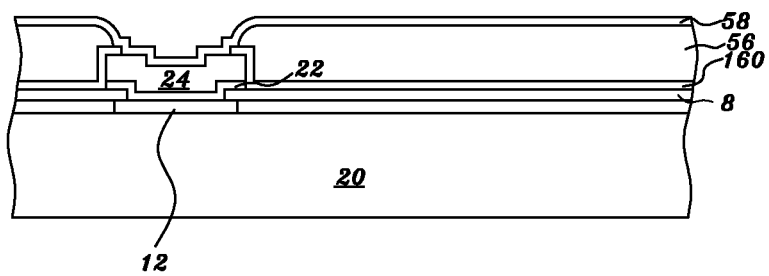

Referring to FIG. 10K, an adhesion/barrier 58 having a thickness of between 0.01 and 0.7 µm is sputtered on the patterned metal cap 24 and on the polymer layer 56. The material of the adhesion/barrier layer 58 may include titanium, titanium nitride, a titanium-tungsten alloy, chromium, tantalum, tantalum nitride, or a composite of the abovementioned materials.

For example, the adhesion/barrier 58 is formed by sputtering a titanium-tungsten-alloy layer with a thickness of between 0.01 and 0.7 µm on the polymer layer 56 made of polyimide and on the patterned metal cap 24 including aluminum. Alternatively, the adhesion/barrier 58 is formed by sputtering a titanium layer with a thickness of between 0.01 and 0.7 µm on the polymer layer 56 made of polyimide and on the patterned metal cap 24 including aluminum.

Figure 10L:
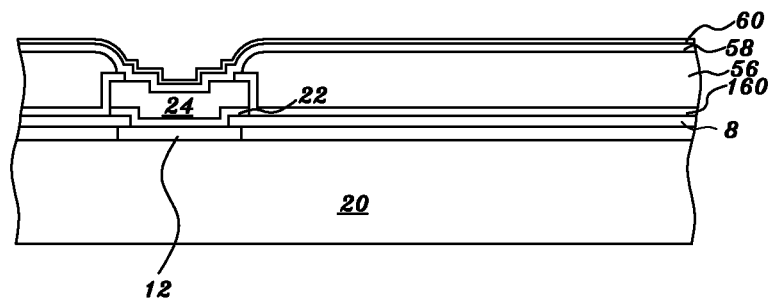

Referring to FIG. 10L, a seed layer 60 having a thickness of between 0.005 and 2 µm is sputtered on the adhesion/barrier layer 58. The seed layer 60 is beneficial to electroplating a metal layer thereon. Thus, the material of the seed layer 60 varies with the material of the electroplated metal layer formed on the seed layer 60. When a gold layer is to be electroplated on the seed layer 60, gold (Au) is a preferable material to the seed layer 60. When a copper layer is to be electroplated on the seed layer 60, copper (Cu) is a preferable material to the seed layer 60. When a silver layer is to be electroplated on the seed layer 60, silver (Ag) is a preferable material to the seed layer 60. When a palladium layer is to be electroplated on the seed layer 60, palladium (Pd) is a preferable material to the seed layer 60. When a platinum layer is to be electroplated on the seed layer 60, platinum (Pt) is a preferable material to the seed layer 60. When a rhodium layer is to be electroplated on the seed layer 60, rhodium (Rh) is a preferable material to the seed layer 60. When a ruthenium layer is to be electroplated on the seed layer 60, ruthenium (Ru) is a preferable material to the seed layer 60. When a rhenium layer is to be electroplated on the seed layer 60, rhenium (Re) is a preferable material to the seed layer 60. When a nickel layer is to be electroplated on the seed layer 60, nickel (Ni) is a preferable material to the seed layer 60.

For example, when the adhesion/barrier layer 58 is formed by sputtering a titanium-tungsten-alloy layer with a thickness of between 0.01 and 0.7 µm, the seed layer 60 can be formed by sputtering a gold layer with a thickness of between 0.005 and 2 µm on the titanium-tungsten-alloy layer. When the adhesion/barrier layer 58 is formed by sputtering a titanium-tungsten alloy layer with a thickness of between 0.01 and 0.7 µm, the seed layer 60 can be formed by sputtering a copper layer with a thickness of between 0.005 and 2 µm on the titanium-tungsten-alloy layer. When the adhesion/barrier layer 58 is formed by sputtering a titanium layer with a thickness of between 0.01 and 0.7 μm, the seed layer 60 can be formed by sputtering a gold layer with a thickness of between 0.005 and 2 μm on the titanium layer. When the adhesion/barrier layer 58 is formed by sputtering a titanium layer with a thickness of between 0.01 and 0.7 μm, the seed layer 60 can be formed by sputtering a copper layer with a thickness of between 0.005 and 2 μm on the titanium layer.

Figure 10M:
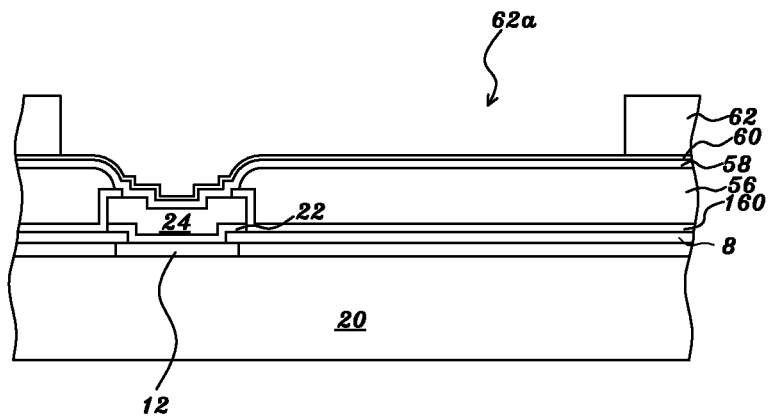

Referring to FIG. 10M, a photoresist layer 62 is formed on the seed layer 60. Next, the photoresist layer 62 is patterned with the processes of exposure, development, etc., to form an opening 62a in the photoresist layer 62 exposing the seed layer 60. For example, the photoresist layer 62 can be formed by spin-on coating a positive-type photosensitive polymer layer having a thickness of between 5 and 30 μm, and preferably of between 7 and 15 μm, on the seed layer 60, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer to form an opening in the polymer layer exposing the seed layer 60, and then removing the residual polymeric material or other contaminants on the seed layer 60 with an $O_2$ plasma or a plasma containing fluorine of below 200 PPM and oxygen, such that the photoresist layer 62 can be patterned with an opening 62a in the photoresist layer 62 exposing the seed layer 60.

Figure 10N:
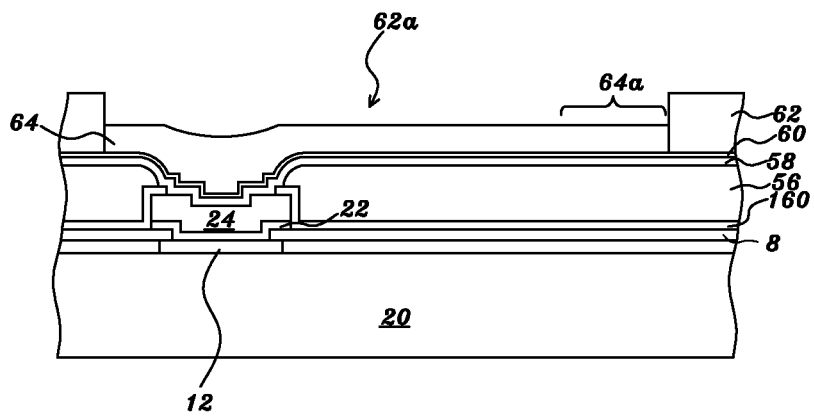

Referring to FIG. 10N, a metal layer 64 having a thickness of between 1 and 25 μm is electroplated on the seed layer 60 exposed by the opening 62a. The metal layer 64 may be a single layer made of gold, copper, palladium, platinum, or nickel. The metal layer 64 may also be a composite layer made of the abovementioned metals.

For example, the metal layer 64 may be formed by electroplating a gold layer with a thickness of between 1 and 10 μm on the seed layer 60, made of gold, exposed by the opening 62a. Alternatively, the metal layer 64 may be formed by electroplating a copper layer with a thickness of between 1 and 15 μm on the seed layer 60, made of copper, exposed by the opening 62a. Alternatively, the metal layer 64 may be formed by electroplating a copper layer with a thickness of between 1 and 15 μm on the seed layer 60, made of copper, exposed by the opening 62a, next electroplating a nickel layer with a thickness of between 0.1 and 5 m on the copper layer in the opening 62a, and then electroplating a gold layer with a thickness of between 0.01 and 2 μm on the nickel layer in the opening 62a. Alternatively, the metal layer 64 may be formed by electroplating a copper layer with a thickness of between 1 and 15 μm on the seed layer 60, made of copper, exposed by the opening 62a, and then electroplating a gold layer with a thickness of between 0.01 and 2 μm on the copper layer in the opening 62a. Alternatively, the metal layer 64 may be formed by electroplating a copper layer with a thickness of between 1 and 15 μm on the seed layer 60, made of copper, exposed by the opening 62a, next electroplating a nickel layer with a thickness of between 0.1 and 5 μm on the copper layer in the opening 62a, and then electroplating a palladium layer with a thickness of between 0.01 and 2 μm on the nickel layer in the opening 62a. Alternatively, the metal layer 64 may be formed by electroplating a copper layer with a thickness of between 1 and 15 μm on the seed layer 60, made of copper, exposed by the opening 62a, next electroplating a nickel layer with a thickness of between 0.1 and 5 μm on the copper layer in the opening 62a, and then electroplating a platinum layer with a thickness of between 0.01 and 2 μm on the nickel layer in the opening 62a.

A top surface area of the metal layer 64 is defined as a pad 64a. From a top perspective view, the position of the pad 64a is different from that of the pad 12.

Figure 10O:
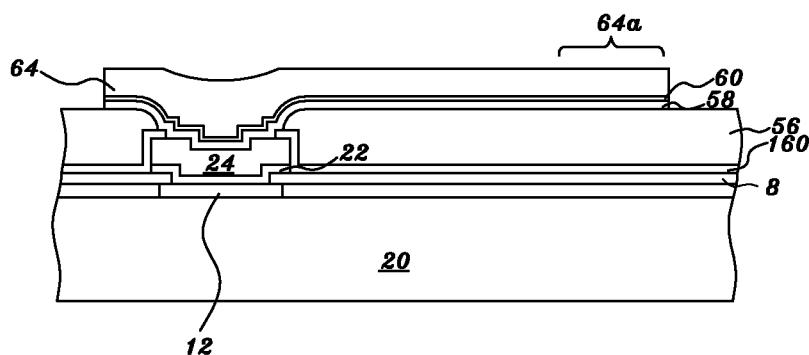

Referring to FIG. 10O, the photoresist layer 62 can be removed using an organic solution with amide. Alternatively, the photoresist layer 62 can be removed using an inorganic solution, such as sulfuric acid ($H_2SO_4$) or hydrogen peroxide ($H_2O_2$). Alternatively, the photoresist layer 62 can be removed using an $O_2$ plasma or a plasma containing fluorine of below 200 PPM and oxygen.

Next, the seed layer 60 and the adhesion/barrier layer 58 not under the metal layer 64 are removed with a dry etching method or a wet etching method. As to the wet etching methods, when the adhesion/barrier layer 58 is a titanium-tungsten alloy layer, it can be etched with a solution containing hydrogen peroxide at the temperature of between 40 and 50 degree centigrade for a time of between 3 and 20 minutes; when the seed layer 60 is a gold layer, it can be etched with an iodine-containing solution, such as a solution containing potassium iodide; when the seed layer 60 is a copper layer, it can be etched with a solution containing ammonium hydroxide ($NH_4OH$). As to the dry etching methods, when the adhesion/barrier layer 58 is a titanium-tungsten alloy layer, it can be etched with an argon sputter process; when the seed layer 60 is a gold layer, it can be removed with an argon sputter process. Generally, the dry etching method to etch the seed layer 60 and the adhesion/barrier layer 58 not under the metal layer 64 may include a chemical plasma etching process, a sputtering etching process, such as an argon sputter process, or a chemical vapor etching process.

Figure 10P:
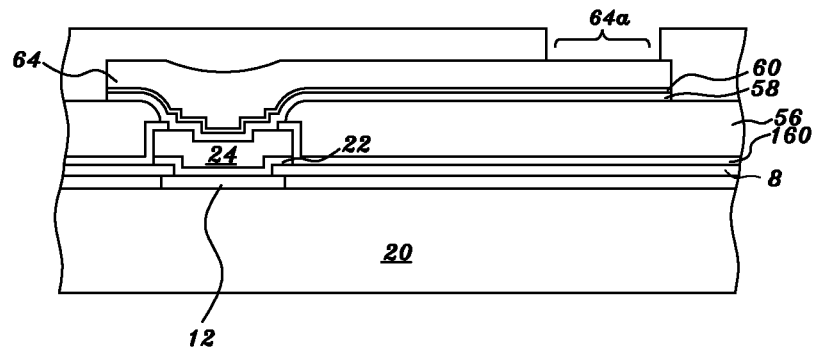

Referring to FIG. 10P, a polymer layer 66 can be formed on the polymer layer 56 and on the metal layer 64. Next, the polymer layer 66 is patterned with the processes of baking, exposure, development, etc., to form an opening 66a in the polymer layer 66 exposing the pad 64a. For example, the polymer layer 66 can be formed by spin-on coating a positive-type photosensitive polyimide layer having a thickness of between 10 and 50 μm on the metal layer 64 and on the polymer layer 56, then exposing the photosensitive polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polyimide layer, that is, G-line and H-line, G-line and I-line, H-line and I-line, or G-line, H-line and I-line illuminate the photosensitive polyimide layer, then developing the exposed polyimide layer to form an opening in the polyimide layer exposing the pad 64a, and then removing the polyimide residuals or other contaminants from the pad 64a with an $O_2$ plasma or a plasma containing fluorine of below 200 PPM and oxygen, and then curing the developed polyimide layer at a peak temperature of between 250 and 400° C. for a time of between 30 minutes and 4 hours in nitrogen ambient or in oxygen-free ambient, wherein the cured polyimide layer may have a thickness of between 3 and 25 μm, such that the polymer layer 66 can be patterned with an opening 66a in the polymer layer 66 exposing the patterned metal cap 56. Alternatively, the material of the polymer layer 66 may include polyimide (PI), benzocyclobutane (BCB), parylene, epoxy-based material, elastomer, photoepoxy SU-8, silicone, or a porous dielectric material. The polymer layer 66 may be a benzocyclobutane layer with a thickness of between 3 and 25 μm.

Alternatively, the polymer layer 66 may be formed by a laminating process or a screen-printing process. So far, a semiconductor wafer 20 is formed by the above-mentioned steps.

Figure 10Q:
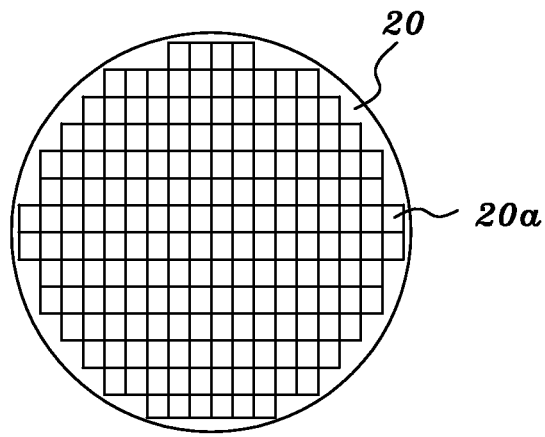
Figure 10R:
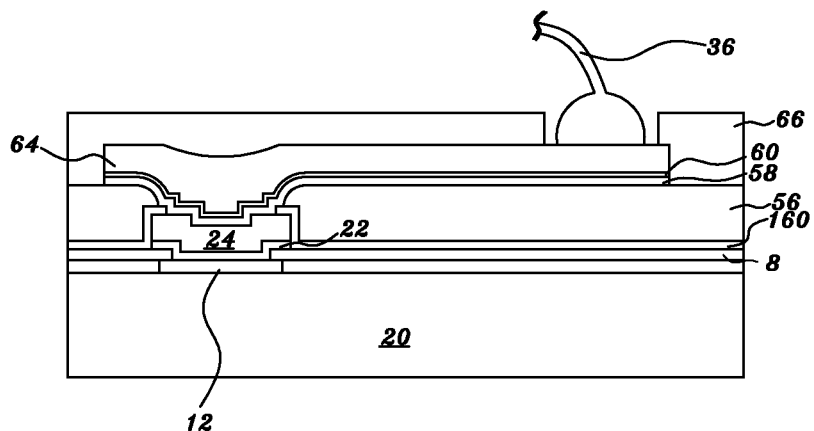

Next, referring to FIG. 10Q and FIG. 10R, the semiconductor wafer 20 can be diced into a plurality of individual semiconductor chips 20a. When one of the semiconductor chips 20a is being packaged, one end of a wire 36 made of gold can be ball bonded on the pad 64a of the semiconductor chip 20a by a wire-bonding process. The other end of the wire 36 can be wedge bonded on a pad of an external circuit. Therefore, the metal layer 64 of the semiconductor chip 20a may be used to be connected with an external circuit. The external circuit may be a ball-grid-array (BGA) substrate, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a silicon substrate.

Alternatively, a metal bump having a titanium-containing layer with a thickness of between 0.1 and 0.7 μm on the pad 52 exposed by the opening 66a, a copper layer with a thickness of between 1 and 10 μm on the titanium-containing layer, a nickel layer with a thickness of between 0.5 and 5 μm on the copper layer, and a tin-containing layer with a thickness of between 10 and 300 μm on the nickel layer may be formed on the pad 64a exposed by the opening 66a, followed by dicing the semiconductor wafer 20 into multiple semiconductor chips 20a. The semiconductor chip 20a may be bonded to a BGA substrate through the metal bump.

Alternatively, a metal bump having a titanium-containing layer with a thickness of between 0.1 and 0.7 μm on the pad 52 exposed by the opening 66a, and a gold layer with a thickness of between 5 and 25 μm on the titanium-containing layer may be formed on the pad 52 exposed by the opening 66a, followed by dicing the semiconductor wafer 20 into multiple semiconductor chips 20a. The metal bump may connect the semiconductor chip to a glass substrate via ACF or ACP. Besides, the metal bump may connect the semiconductor chip to a printed circuit board via tape automated bonding (TAB). Besides, the metal bump may connect the semiconductor chip to a flexible substrate without glass fiber.

Aspect 1 of Embodiment 10

Figure 11A:
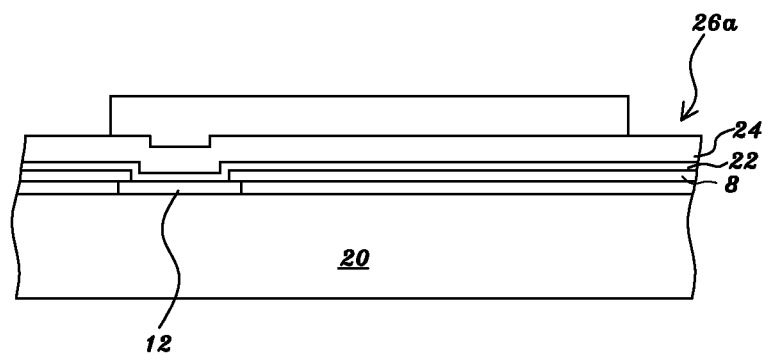
FIGS. 11A through 11K are sectional views showing a structure and process of a aspect of a embodiment of the present invention.

Referring to FIG. 11A, after the step shown in FIG. 2B is completed. A photoresist layer 26 is formed on the metal cap 24. The photoresist layer 26 is patterned with the processes of exposure, development, etc., to form multiple openings 26a in the photoresist layer 26 exposing the metal cap 24.

The photoresist layer 26 can be formed by spin-on coating a positive-type photosensitive polymer layer having a thickness of between 5 and 30 μm, and preferably of between 7 and 15 μm, on the metal cap 24, then exposing the photosensitive polymer layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the metal cap 24 with an $O_2$ plasma or a plasma containing fluorine of below 200 PPM and oxygen, such that the photoresist layer 26 can be patterned with multiple openings 26a in the photoresist layer 26 exposing the metal cap 24.

Figure 11B:
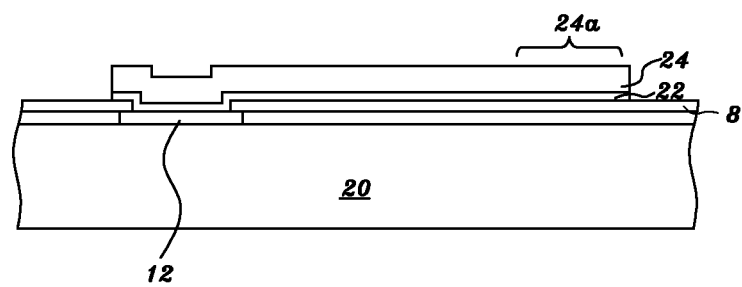
Figure 11C:
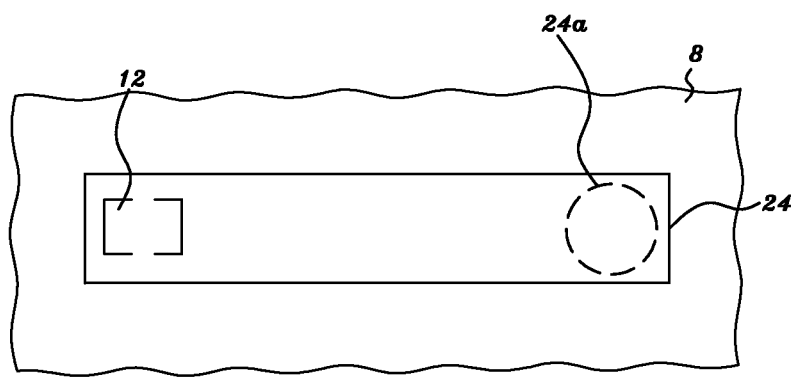

Referring to FIG. 11B-11C, The metal cap 24 and the adhesion/barrier layer 22 not under the photoresist layer 26 are removed with a dry etching method. Generally, the dry etching method to etch the metal cap 24 and the adhesion/barrier layer 22 not under the photoresist layer 26 may include a chemical plasma etching process, a sputtering etching process, such as an argon sputter process, $O_2$ plasma, or a chemical vapor etching process. After the etching process is completed, the metal cap 24 comprise a pad 24a. The pad 24a is different from that of the pad 12 exposed by the opening 8a from a top perspective view (shown in FIG. 11C).

Figure 11D:
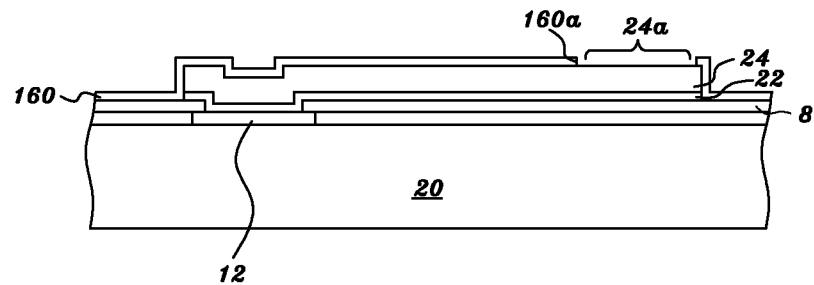

Referring to FIG. 11D, A passivation layer 160 is formed over the passivation layer 8 and the metal cap 24. The passivation layer 160 can protect the metal cap 24 from being damaged by moisture and foreign ion contamination. In other words, Mobile ions (such as sodium ion), transition metals (such as gold, silver and copper) and impurities can be prevented from penetrating through the passivation layer 160 to the semiconductor devices 4, such as transistors, polysilicon resistor elements and polysilicon-polysilicon capacitor elements, and to the circuit structure 6.

The passivation layer 160 is commonly made of silicon oxide (such as $SiO_2$), PSG (phosphosilicate glass), silicon nitride (such as $Si_3N_4$), or silicon oxynitride. The passivation layer 160 commonly has a thickness of more than 0.35 m. In a preferred case, the silicon nitride layer in the passivation layer 160 has a thickness of more than 0.3 μm. Ten methods for depositing the passivation layer 160 are described as passivation layer 8 process. A opening 160a in the passivation layer 160 exposes the pad 24a with a dry etching process.

The metal cap 24 may be a RDL (Re-Distribution Layer), and the pad 24a exposed by the opening 160a is different from that of the pad 12 exposed by the opening 8a from a top perspective view (shown in FIG. 11C).

The opening 160a have a maximum transverse dimension of between 2 and 30 μm or between 30 and 300 μm. The shape of the opening 160a may be a circle, and the diameter of the circle-shaped opening 160a may be between 2 and 30 μm or between 30 and 300 μm. Alternatively, the shape of the opening 160a may be a square, and the greatest diagonal length of the square-shaped opening 160a may be between 2 and 30 μm or between 30 and 300 μm. Alternatively, the shape of the opening 160a may be a polygon, and the polygon-shaped opening 160a may have a greatest diagonal length of between 3 and 30 μm or between 30 and 300 μm. Alternatively, the shape of the opening 160a may also be a rectangle, and the rectangle-shaped opening 160a may have a width of between 2 and 40 μm. Further, there may be the semiconductor device 4 under the pad 12 exposed by the opening 160a.

Figure 11E:
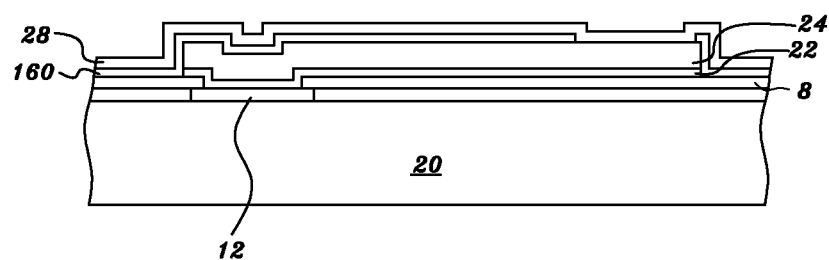

Referring to FIG. 11E, an adhesion/barrier layer 28 having a thickness of between 0.01 μm and 0.7 μm, is formed on the passivation layer 160 and on the pad 24a. The material of the adhesion/barrier layer 28 may include titanium, titanium nitride, a titanium-tungsten alloy, a nickel-vanadium alloy, chromium, tantalum, tantalum nitride, or a composite of the abovementioned materials. The material of the adhesion/barrier layer 28 is a titanium-tungsten alloy in this Embodiment. The adhesion/barrier layer 28 may be formed by a sputtering method or a vapor deposition method.

Figure 11F:
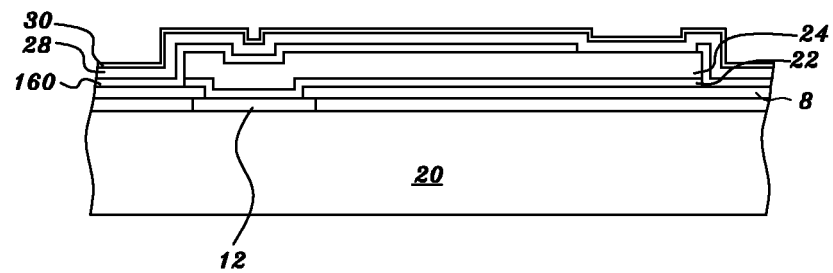

Referring to FIG. 11F, a seed layer 30 having a thickness of 0.005 μm and 2 μm, is formed on the adhesion/barrier layer 28. The seed layer 30 may be formed by a sputtering method, a vapor deposition method, an electroless plating method or a PVD (Physical Vapor Deposition) method. The seed layer 30 is beneficial to electroplating a metal layer thereon. Thus, the material of the seed layer 30 varies with the material of the electroplated metal layer formed on the seed layer 30. When a gold layer is to be electroplated on the seed layer 30, gold is a preferable material to the seed layer 30.

Figure 11G:
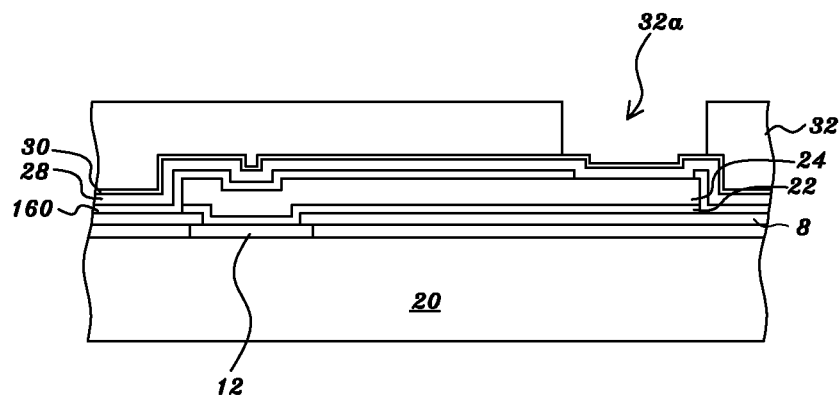

Referring to FIG. 11G, a photoresist layer 32 is formed on the seed layer 30. The photoresist layer 32 is patterned with the processes of exposure, development, etc., to form multiple openings 32a in the photoresist layer 32 exposing the seed layer 30.

The photoresist layer 32 can be formed by spin-on coating a positive-type photosensitive polymer layer having a thickness of between 5 and 30 µm, and preferably of between 7 and 15 µm, on the seed layer 30, then exposing the photosensitive polymer layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 30 with an $O_2$ plasma or a plasma containing fluorine of below 200 PPM and oxygen, such that the photoresist layer 32 can be patterned with multiple openings 32a in the photoresist layer 32 exposing the seed layer 30.

Figure 11H:
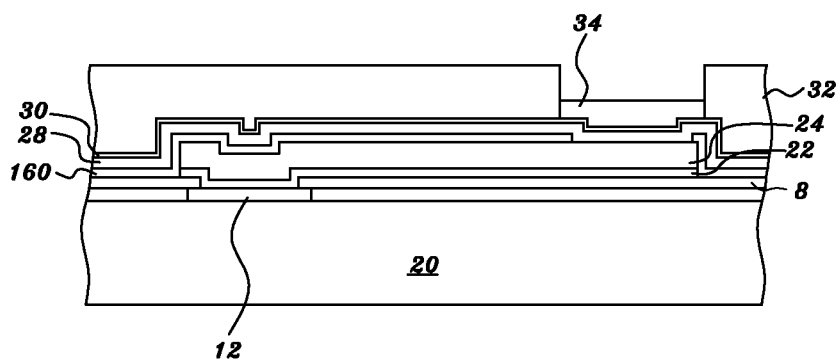

Referring to FIG. 11H, a metal layer 34 having a thickness of between 2 and 25 µm is electroplated on the seed layer 30 exposed by the opening 32a. The metal layer 34 may be a single metal layer, such as a gold layer, a copper layer, a nickel layer, a palladium layer, a platinum layer. The metal layer 34 may be a composite metal layer, such as a copper/nickel/gold layer, a copper/gold layer, a copper/nickel/palladium layer, copper/nickel/platinum layer. The metal layer 34 is a gold layer in this embodiment with a thickness of between 2 µm and 4 µm.

Figure 11I:
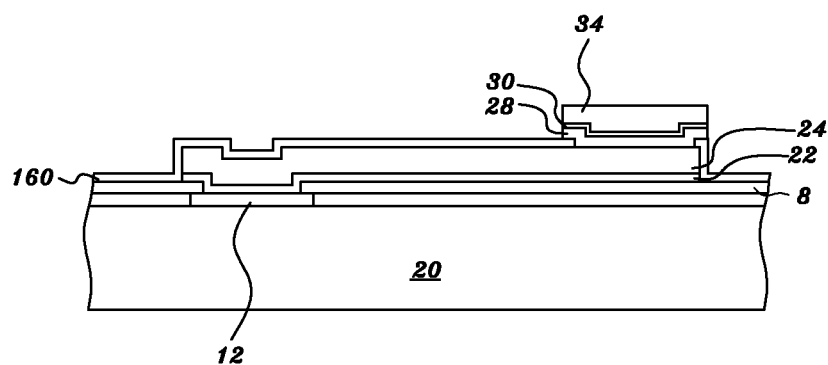

Referring to FIG. 11I, after the metal layer 34 is formed, most of the photoresist layer 32 can be removed using an organic solution with amide. However, some residuals from the photoresist layer 32 could remain on the metal layer 34 and on the seed layer 30. Thereafter, the residuals can be removed from the metal layer 34 and the seed layer 30 with a plasma, such as an $O_2$ plasma or a plasma containing fluorine of below 200 PPM and oxygen. Alternatively, the photoresist layer 32 can be removed using an $O_2$ plasma or using a plasma containing fluorine of below 200 PPM and oxygen, without using an organic solution.

Next, the seed layer 30 and the adhesion/barrier layer 28 not under the metal layer 34 are removed with a wet etching method. As to the wet etching methods, when the adhesion/barrier layer 28 is a titanium-tungsten alloy layer, it can be etched with a solution containing hydrogen peroxide; when the seed layer 30 is a gold layer, it can be etched with an iodine-containing solution. When the seed layer 30 is a gold layer, it can be etched with an iodine-containing solution, such as a solution containing potassium iodide; when the seed layer 30 is a copper layer, it can be etched with a solution containing ammonium hydroxide ($NH_4OH$).

The seed layer 30 and the adhesion/barrier layer 28 not under the metal layer 34 are removed with a dry etching method. Generally, the dry etching method to etch the seed layer 30 and the adhesion/barrier layer 28 not under the metal layer 34 may include a chemical plasma etching process, a sputtering etching process, such as an argon sputter process, $O_2$ plasma, or a chemical vapor etching process.

Figure 11J:
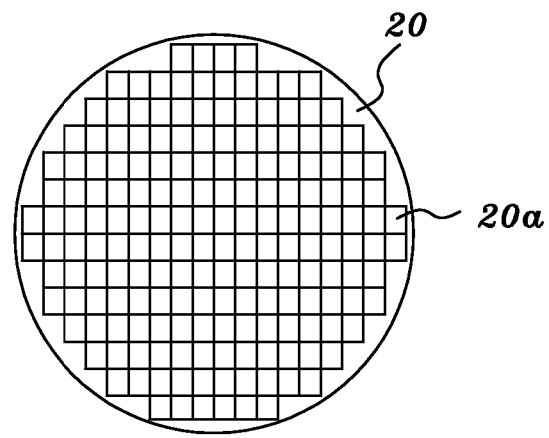
Figure 11K:
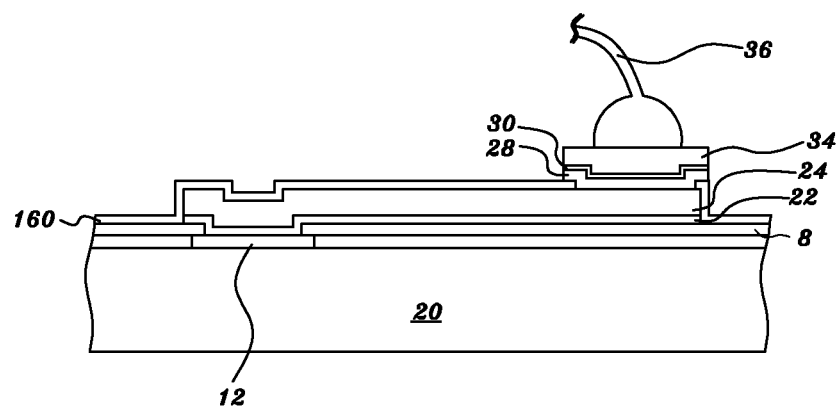

Referring to FIG. 11J-11K, After the above-mentioned processes of the seed layer 30 and the adhesion/barrier layer 28 not under the metal layer 34 are removed, the semiconductor wafer 20 can be diced into a plurality of individual semiconductor chips 20a. Via a wire-bonding process connect to external circuit, one end of a wire 36 (made of gold, copper or aluminum) can be bonded with the metal layer 34 of the semiconductor chip 20a. The external circuit may be a ball-grid-array (BGA) substrate, a printed circuit board (PCB) comprising a glass fiber as a core, a flexible tape comprising a polymer layer (such as polyimide) having a thickness of between 30 and 200 µm and not comprising any polymer layer with glass fiber, a ceramic substrate comprising a ceramic material as insulating layers between circuit layers, a glass substrate having circuit layers made of Indium Tin Oxide (ITO), or a silicon substrate.

Aspect 2 of Embodiment 10

Figure 11L:
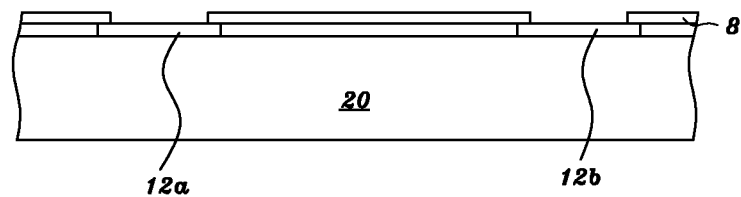
FIGS. 11L through 11S are sectional views showing a structure and process of a aspect of a embodiment of the present invention.

Referring to FIG. 11L, semiconductor wafer 20 comprise a pad 12a and a pad 12b by exposed by two openings 8a in a passivation layer 8.

Figure 11M:
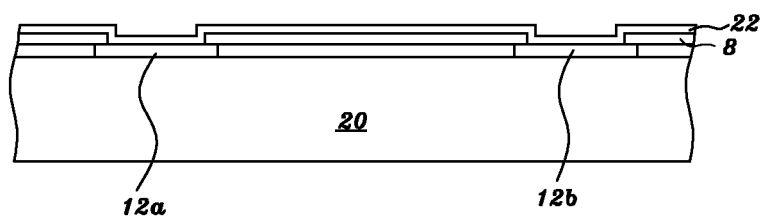
Figure 11N:
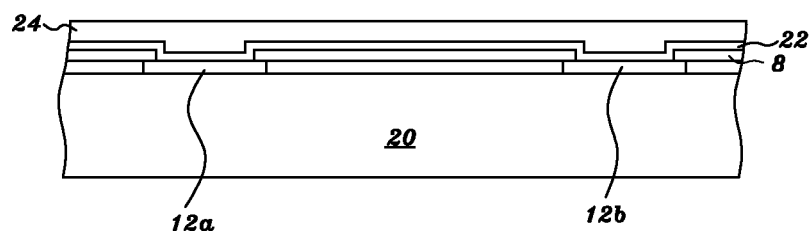

Referring to FIG. 11M, an adhesion/barrier layer 22 having a thickness of between 0.01 µm and 0.7 µm, is formed on the passivation layer 8, on the 12a and on the pad 12b. The material of the adhesion/barrier layer 22 may include titanium, titanium nitride, a titanium-tungsten alloy, a nickel-vanadium alloy, chromium, tantalum, tantalum nitride, or a composite of the abovementioned materials. The material of the adhesion/barrier layer 22 is a titanium-tungsten alloy in this Embodiment. The adhesion/barrier layer 22 may be formed by a sputtering method or a vapor deposition method.

Referring to FIG. 11M, a metal cap 24 having a thickness of between 0.5 and 2 µm is Evaporated on the adhesion/barrier layer 22. The metal cap 24 may be a aluminum metal layer.

Figure 11O:
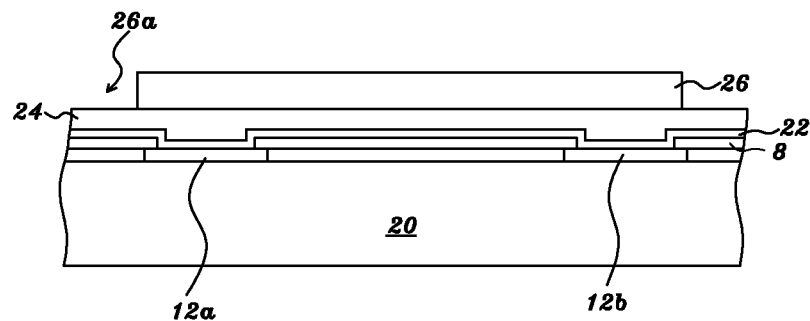

Referring to FIG. 11O, a photoresist layer 26 is formed on the metal cap 24. The photoresist layer 26 is patterned with the processes of exposure, development, etc., to form multiple openings 26a in the photoresist layer 26 exposing the metal cap 24.

The photoresist layer 26 can be formed by spin-on coating a positive-type photosensitive polymer layer having a thickness of between 5 and 30 µm, and preferably of between 7 and 15 µm, on the metal cap 24, then exposing the photosensitive polymer layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the metal cap 24 with an $O_2$ plasma or a plasma containing fluorine of below 200 PPM and oxygen, such that the photoresist layer 26 can be patterned with multiple openings 26a in the photoresist layer 26 exposing the metal cap 24.

Figure 11P:
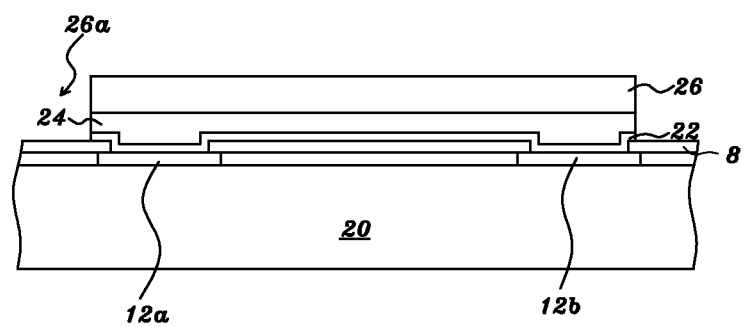

Referring to FIG. 11P, the metal cap 24 not under the photoresist layer 26 are removed with a dry etching method. Generally, the dry etching method to etch the metal cap 24 not under the photoresist layer 26 may include a chemical plasma etching process, a sputtering etching process, such as an argon sputter process, $O_2$ plasma, or a chemical vapor etching process. After the dry etching step is completed, the metal cap 24 is formed on the passivation layer 8 and on the pad 12a and pad 12b. The metal cap 24 is an interconnecting metal trace, which connect with the pad 12a and pad 12b.

Figure 11Q:
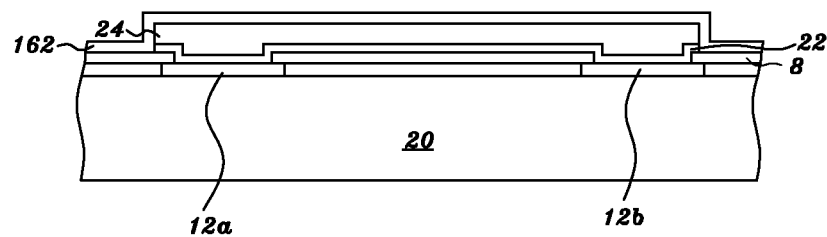

Referring to FIG. 11Q, after the metal cap 24 is formed, most of the photoresist layer 26 can be removed using an organic solution with amide. However, some residuals from the photoresist layer 26 could remain on the metal cap 24. Thereafter, the residuals can be removed from the metal cap 24 with a plasma, such as an $O_2$ plasma or a plasma containing fluorine of below 200 PPM and oxygen. Alternatively, the photoresist layer 26 can be removed using an $O_2$ plasma or using a plasma containing fluorine of below 200 PPM and oxygen, without using an organic solution.

After the photoresist layer 26 is removed. A passivation layer 162 is formed over the passivation layer 8 and the metal cap 24. The passivation layer 162 can protect the metal cap 24 from being damaged by moisture and foreign ion contamination. In other words, Mobile ions (such as sodium ion), transition metals (such as gold, silver and copper) and impurities can be prevented from penetrating through the passivation layer 162 to the semiconductor devices 4, such as transistors, polysilicon resistor elements and polysilicon-polysilicon capacitor elements, and to the circuit structure 6.

The passivation layer 162 is commonly made of silicon oxide (such as $SiO_2$), PSG (phosphosilicate glass), silicon nitride (such as $Si_3N_4$), silicon oxynitride polyimide (PI), benzocyclobutane (BCB), polyurethane, epoxy resin, a parylene-based polymer, a solder-mask material, an elastomer, or a porous dielectric material. Methods for depositing the passivation layer 162 are described as passivation layer 8 process and polymer layer 76 process.

Figure 11R:
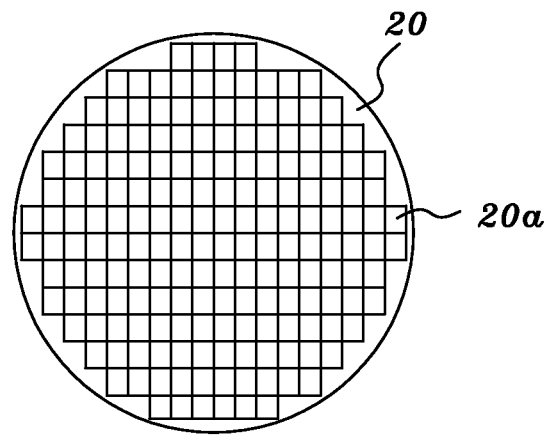
Figure 11S:
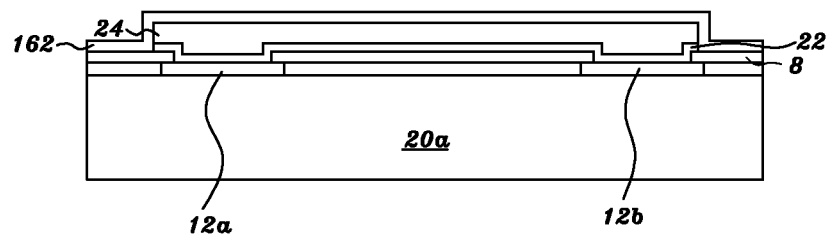

Referring to FIG. 11R-11S, After the above-mentioned processes of forming the passivation layer 162, the semiconductor wafer 20 can be diced into a plurality of individual semiconductor chips 20a.

Aspect 3 of Embodiment 10

Figure 11T:
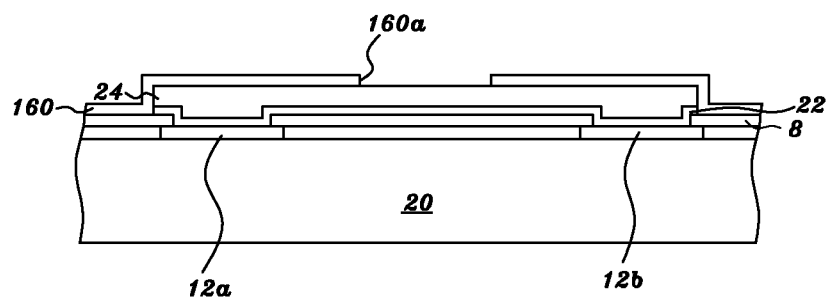
FIG. 11T through FIG. 12C are sectional views showing a structure and process of a aspect of a embodiment of the present invention.

Referring to FIG. 11T, after the step shown in FIG. 11Q is completed. A opening 160a in the passivation layer 160 exposes the metal cap 24 with a dry etching process. with a dry etching method.

Figure 11U:
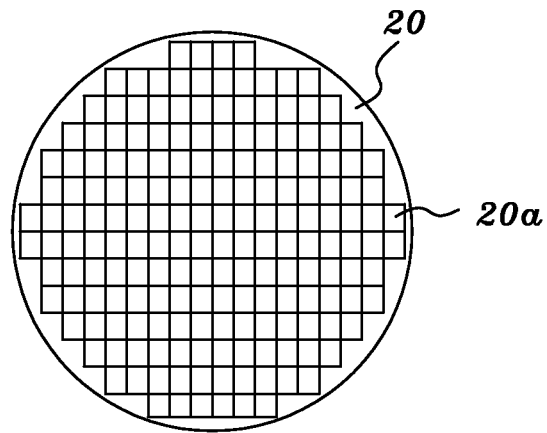
Figure 11V:
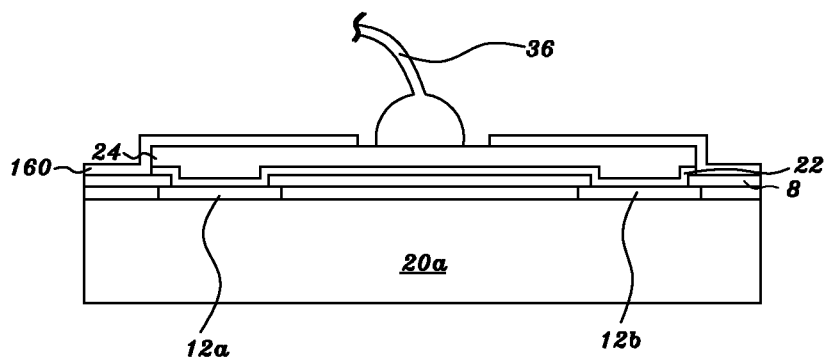

Referring to FIG. 11U-11V, After the above-mentioned processes of forming the opening 160a, the semiconductor wafer 20 can be diced into a plurality of individual semiconductor chips 20a. Via a wire-bonding process connect to external circuit, one end of a wire 36 (made of gold, copper or aluminum) can be bonded with the metal cap 24 exposed by the opening 160a of the semiconductor chip 20a. The external circuit may be a ball-grid-array (BGA) substrate, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a silicon substrate.

Aspect 4 of Embodiment 10

Figure 11W:
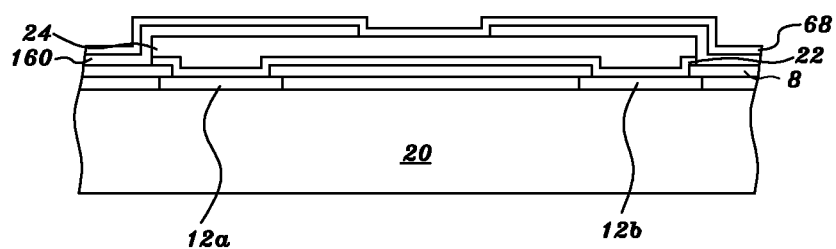

Referring to FIG. 11W, after the step shown in FIG. 11T is completed an adhesion/barrier layer 68 having a thickness of between 0.01 μm and 0.7 μm, is formed on the passivation layer 160 and on the metal cap 24. The material of the adhesion/barrier layer 68 may include titanium, titanium nitride, a titanium-tungsten alloy, a nickel-vanadium alloy, chromium, tantalum, tantalum nitride, or a composite of the abovementioned materials. The material of the adhesion/barrier layer 68 is a titanium-tungsten alloy in this Embodiment. The adhesion/barrier layer 68 may be formed by a sputtering method or a vapor deposition method.

Figure 11X:
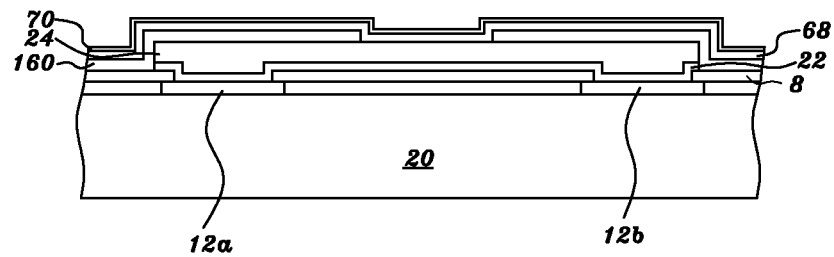

Referring to FIG. 11X, a seed layer 70 having a thickness of 0.005 μm and 2 μm, is formed on the adhesion/barrier layer 68. The seed layer 70 may be formed by a sputtering method, a vapor deposition method, an electroless plating method or a PVD (Physical Vapor Deposition) method. The seed layer 70 is beneficial to electroplating a metal layer thereon. Thus, the material of the seed layer 70 varies with the material of the electroplated metal layer formed on the seed layer 70. When a gold layer is to be electroplated on the seed layer 70, gold is a preferable material to the seed layer 70.

Figure 11Y:
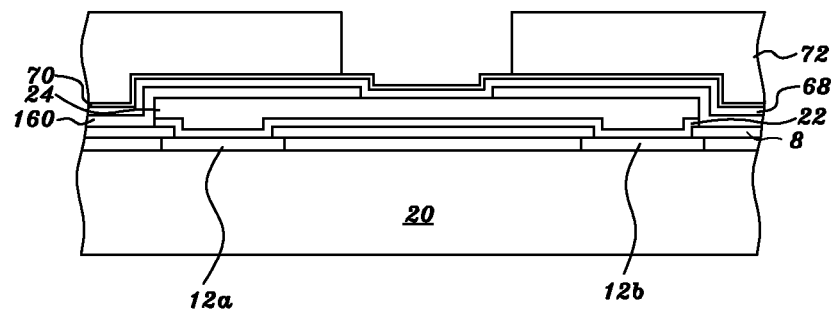

Referring to FIG. 11Y, a photoresist layer 72 is formed on the seed layer 70. The photoresist layer 72 is patterned with the processes of exposure, development, etc., to form multiple openings 72a in the photoresist layer 72 exposing the seed layer 70.

The photoresist layer 72 can be formed by spin-on coating a positive-type photosensitive polymer layer having a thickness of between 5 and 30 μm, and preferably of between 7 and 15 μm, on the seed layer 70, then exposing the photosensitive polymer layer using a 1× stepper with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 70 with an $O_2$ plasma or a plasma containing fluorine of below 200 PPM and oxygen, such that the photoresist layer 72 can be patterned with multiple openings 72a in the photoresist layer 72 exposing the seed layer 70.

Figure 11Z:
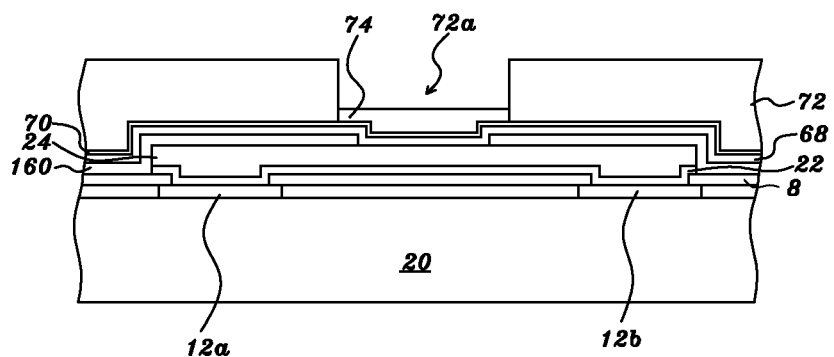

Referring to FIG. 11Z, a metal layer 74 having a thickness of between 2 and 25 μm is electroplated on the seed layer 70 exposed by the opening 72a. The metal layer 74 may be a single metal layer, such as a gold layer, a copper layer, a nickel layer, a palladium layer, a platinum layer. The metal layer 74 may be a composite metal layer, such as a copper/nickel/gold layer, a copper/gold layer, a copper/nickel/palladium layer, copper/nickel/platinum layer. The metal layer 74 is a gold layer in this embodiment.

Figure 12A:
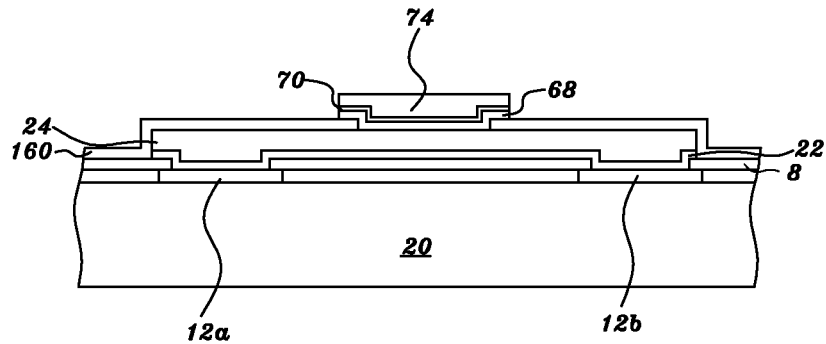

Referring to FIG. 12A, after the metal layer 74 is formed, most of the photoresist layer 72 can be removed using an organic solution with amide. However, some residuals from the photoresist layer 72 could remain on the metal layer 74 and on the seed layer 70. Thereafter, the residuals can be removed from the metal layer 74 and the seed layer 70 with a plasma, such as an $O_2$ plasma or a plasma containing fluorine of below 200 PPM and oxygen. Alternatively, the photoresist layer 72 can be removed using an $O_2$ plasma or using a plasma containing fluorine of below 200 PPM and oxygen, without using an organic solution.

Next, the seed layer 70 and the adhesion/barrier layer 68 not under the metal layer 74 are removed with a wet etching method. As to the wet etching methods, when the adhesion/barrier layer 68 is a titanium-tungsten alloy layer, it can be etched with a solution containing hydrogen peroxide; when the seed layer 70 is a gold layer, it can be etched with an iodine-containing solution. When the seed layer 70 is a gold layer, it can be etched with an iodine-containing solution, such as a solution containing potassium iodide; when the seed layer 70 is a copper layer, it can be etched with a solution containing ammonium hydroxide ($NH_4OH$).

The seed layer 70 and the adhesion/barrier layer 68 not under the metal layer 74 are removed with a dry etching method. Generally, the dry etching method to etch the seed layer 70 and the adhesion/barrier layer 68 not under the metal layer 74 may include a chemical plasma etching process, a sputtering etching process, such as an argon sputter process, $O_2$ plasma, or a chemical vapor etching process.

Figure 12B:
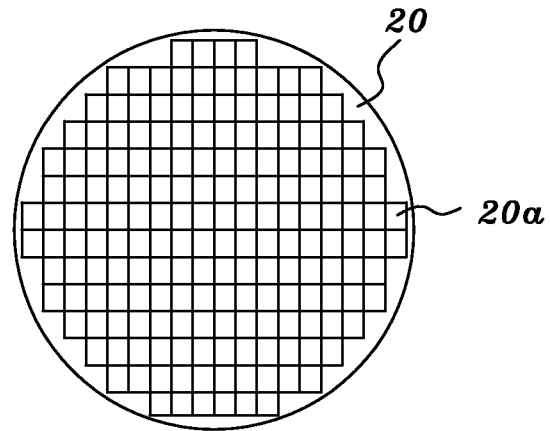
Figure 12C:
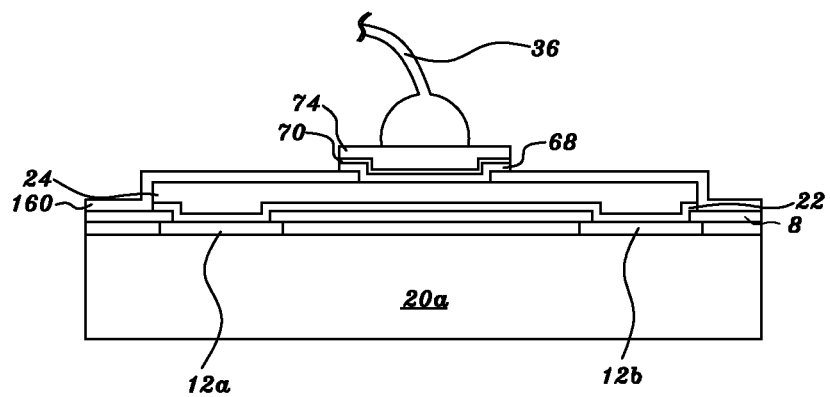

Referring to FIG. 12B-12C, After the above-mentioned processes of removed the seed layer 70, the semiconductor wafer 20 can be diced into a plurality of individual semiconductor chips 20a. Via a wire-bonding process connect to external circuit, one end of a wire 36 (made of gold, copper or aluminum) can be bonded with the metal layer 74 exposed by the opening 160a of the semiconductor chip 20a. The external circuit may be a ball-grid-array (BGA) substrate, a printed circuit board (PCB) comprising a glass fiber as a core, a flexible tape comprising a polymer layer (such as polyimide) having a thickness of between 30 and 200 μm and not comprising any polymer layer with glass fiber, a ceramic substrate comprising a ceramic material as insulating layers between circuit layers, a glass substrate having circuit layers made of Indium Tin Oxide (ITO), or a silicon substrate.

What is claimed is:

1. A semiconductor chip comprising:
a semiconductor substrate;
a copper interconnect over said semiconductor substrate;
a first metal layer at a bottom of said copper interconnect and at a sidewall of said copper interconnect;
an insulating layer over said semiconductor substrate and on a top surface of said copper interconnect, wherein a first opening in said insulating layer is over a first contact point of said copper interconnect, wherein said insulating layer comprises a nitride;
a second metal layer on said first contact point and on a top surface of said insulating layer;
a third metal layer on said second metal layer, wherein said third metal layer is connected to said first contact point through said first opening;
a passivation layer on a top surface of said third metal layer and on said insulating layer, wherein a second opening in said passivation layer is over a second contact point of an aluminum-containing layer of said third metal layer, wherein said passivation layer comprises a nitride;
a fourth metal layer on said second contact point and on a top surface of said passivation layer;
a gold seed layer on said fourth metal layer; and
an electroplated gold layer on said gold seed layer, wherein said electroplated gold layer is configured for connecting with an external circuit in a chip-on-film (COF) package, wherein said electroplated gold layer has a thickness between 5 and 25 micrometers.

2. The semiconductor chip of claim 1, wherein said first metal layer comprises a tantalum-containing layer.

3. The semiconductor chip of claim 1, wherein said second metal layer comprises tantalum.

4. The semiconductor chip of claim 1, wherein said second metal layer comprises titanium.

5. The semiconductor chip of claim 1, wherein said fourth metal layer comprises titanium.

6. The semiconductor chip of claim 1, wherein said aluminum-containing layer has a thickness between 0.5 and 5 micrometers.

7. The semiconductor chip of claim 1, wherein said semiconductor substrate comprises a silicon substrate.

8. The semiconductor chip of claim 1, wherein said nitride of said passivation layer has a thickness greater than 0.3 micrometers.

9. The semiconductor chip of claim 1, wherein said nitride of said insulating has a thickness greater than 0.3 micrometers.

10. The semiconductor chip of claim 1, wherein said second opening has a width between 2 and 40 micrometers.

11. A semiconductor chip comprising:
a semiconductor substrate;
a first dielectric layer over said semiconductor substrate;
a metallization structure over said first dielectric layer, wherein said metallization structure comprises a first metal interconnect and a second metal interconnect over said first metal interconnect, wherein said second metal interconnect comprises electroplated copper and a first metal layer at a bottom and sidewall of said electroplated copper of said second metal interconnect;
a second dielectric layer between said first and second metal interconnects;
a third dielectric layer over said metallization structure and said first and second dielectric layers, wherein a first opening in said third dielectric layer is over a first contact point of said second metal interconnect, and said first contact point is at a bottom of said first opening;
a third metal interconnect on said third dielectric layer and said first contact point, wherein said third metal interconnect comprises a second metal layer and an aluminum-containing layer on said second metal layer;
a passivation layer on said third metal interconnect and said third dielectric layer, wherein a second opening in said passivation layer is over a second contact point of said third metal interconnect, and said second contact point is at a bottom of said second opening;
a first polymer layer on said passivation layer, wherein a third opening in said first polymer layer is over said second contact point;
a fourth metal interconnect on said first polymer layer and said second contact point, wherein said fourth metal interconnect comprises an adhesion metal layer, a copper-containing seed layer on said adhesion metal layer, an electroplated copper layer on said copper-containing seed layer and a nickel-containing layer on said electroplated copper layer of said fourth metal interconnect; and
a second polymer layer on said fourth metal interconnect and said first polymer layer, wherein a fourth opening in said second polymer layer is over a third contact point of said fourth metal interconnect, and said third contact point is at a bottom of said fourth opening, wherein said third contact point is not vertically over said second contact point.

12. The semiconductor chip of claim 11, wherein said first metal layer comprises tantalum.

13. The semiconductor chip of claim 11, wherein said second metal layer comprises titanium.

14. The semiconductor chip of claim 11, wherein said second metal layer comprises tantalum.

15. The semiconductor chip of claim 11, wherein said adhesion metal layer comprises titanium.

* * * * *